US011037643B2

(12) United States Patent
Takada et al.

(10) Patent No.: US 11,037,643 B2
(45) Date of Patent: Jun. 15, 2021

(54) MEMORY SYSTEM FOR CONTROLLING MAGNETIC MEMORY

(71) Applicant: TOSHIBA MEMORY CORPORATION, Minato-ku (JP)

(72) Inventors: Marie Takada, Yokohama (JP); Masanobu Shirakawa, Chigasaki (JP); Yoshihiro Ueda, Yokohama (JP); Naomi Takeda, Yokohama (JP); Hideki Yamada, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 3 days.

(21) Appl. No.: 16/562,482

(22) Filed: Sep. 6, 2019

(65) Prior Publication Data

US 2020/0294610 A1    Sep. 17, 2020

(30) Foreign Application Priority Data

Mar. 12, 2019   (JP) .............................. JP2019-045131

(51) Int. Cl.
*G11C 19/08*   (2006.01)
*G11C 11/16*   (2006.01)
*G06F 3/06*    (2006.01)

(52) U.S. Cl.
CPC ........ *G11C 19/0808* (2013.01); *G06F 3/0604* (2013.01); *G06F 3/0659* (2013.01);
(Continued)

(58) Field of Classification Search
CPC ............ G11C 11/16; G11C 19/08; G06F 3/06
(Continued)

(56) References Cited

U.S. PATENT DOCUMENTS 10,460,783 B2 * 10/2019 Ueda .................. G11C 11/1675
2016/0224242 A1    8/2016 Kondo et al.
(Continued)

FOREIGN PATENT DOCUMENTS

JP    2016-143432 A    8/2016
JP    2019-164848 A    9/2019
(Continued)

OTHER PUBLICATIONS

U.S. Appl. No. 16/352,882, filed Mar. 14, 2019, Takeda, N. et al.

*Primary Examiner* — Huan Hoang
*Assistant Examiner* — Minh Dinh
(74) *Attorney, Agent, or Firm* — Oblon, McClelland, Maier & Neustadt, L.L.P.

(57) ABSTRACT

According to one embodiment, a magnetic memory puts a first magnetic domain having a magnetization direction which is the same as or opposite to a magnetic domain of a first layer of a magnetic memory line, into the first layer, based on a value of data and the magnetization direction of the first layer. When receiving a first command, the magnetic memory puts a first additional magnetic domain and a second additional magnetic domain having a magnetization direction opposite to the first additional magnetic domain into the magnetic memory line. When receiving a second command, the magnetic memory read the first and second additional magnetic domains to determine the magnetization direction of the first magnetic domain.

16 Claims, 45 Drawing Sheets

(52) U.S. Cl.
CPC ........ *G06F 3/0679* (2013.01); *G11C 11/1659* (2013.01); *G11C 11/1673* (2013.01); *G11C 11/1675* (2013.01); *G11C 19/085* (2013.01)

(58) Field of Classification Search
USPC ........................................................ 365/158
See application file for complete search history.

(56) References Cited

U.S. PATENT DOCUMENTS

| | | |
|---|---|---|
| 2019/0287593 A1 | 9/2019 | Ueda |
| 2020/0082863 A1 | 3/2020 | Ueda et al. |
| 2020/0082864 A1 | 3/2020 | Ueda |
| 2020/0089567 A1 | 3/2020 | Takeda et al. |

FOREIGN PATENT DOCUMENTS

| | | |
|---|---|---|
| JP | 2020-42879 A | 3/2020 |
| JP | 2020-42882 A | 3/2020 |
| JP | 2020-46916 A | 3/2020 |

\* cited by examiner

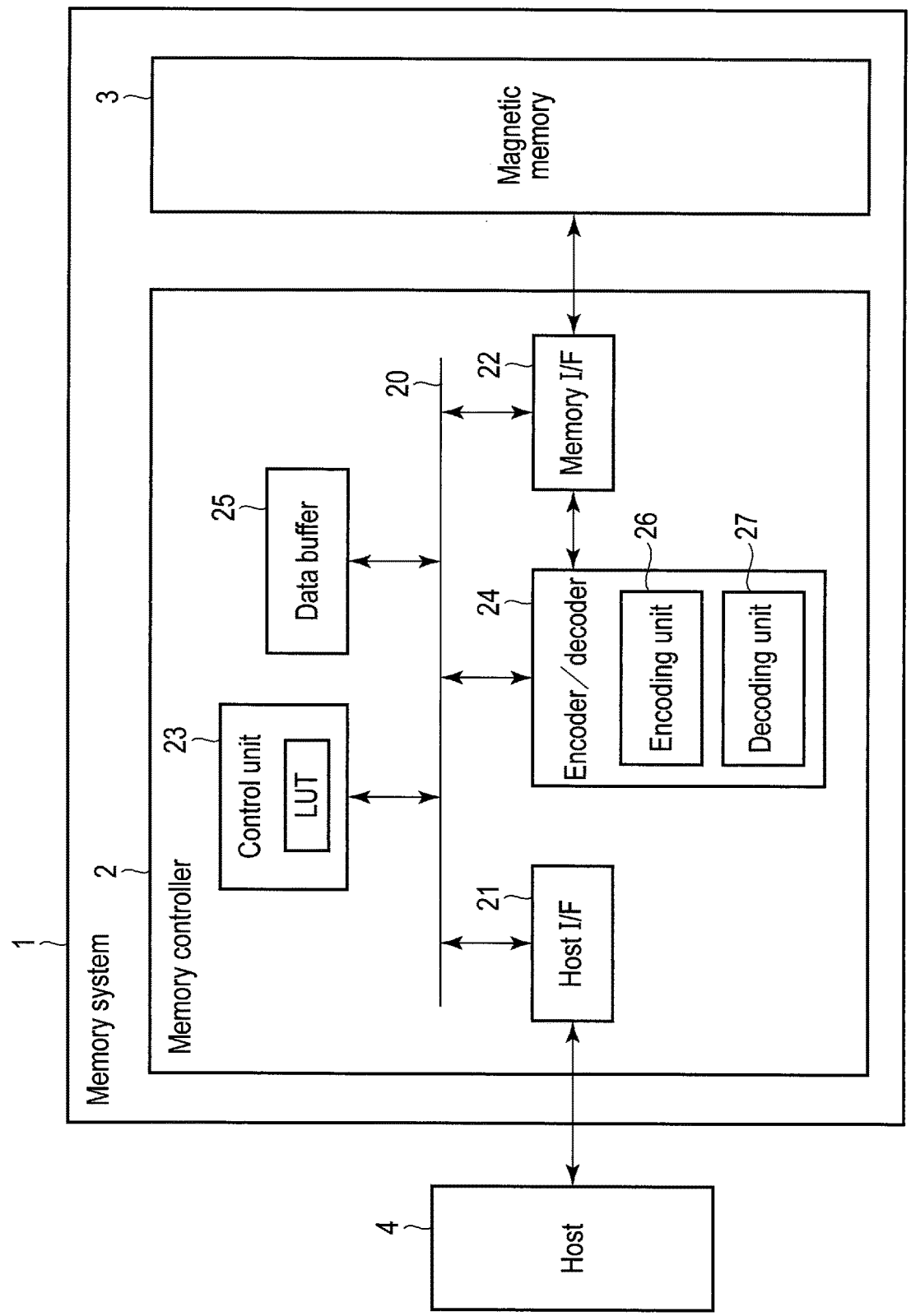
F I G. 1

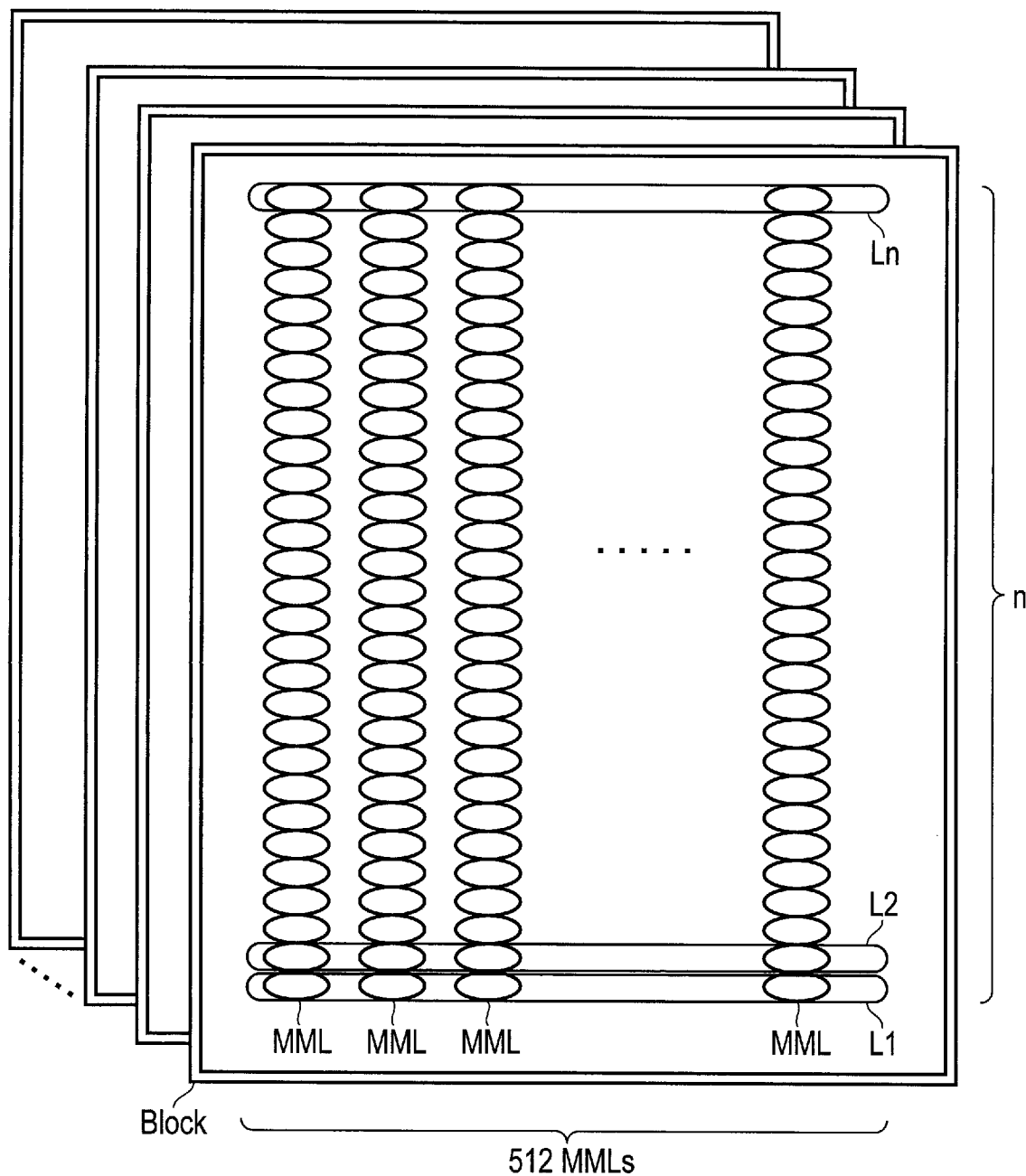
F I G. 2

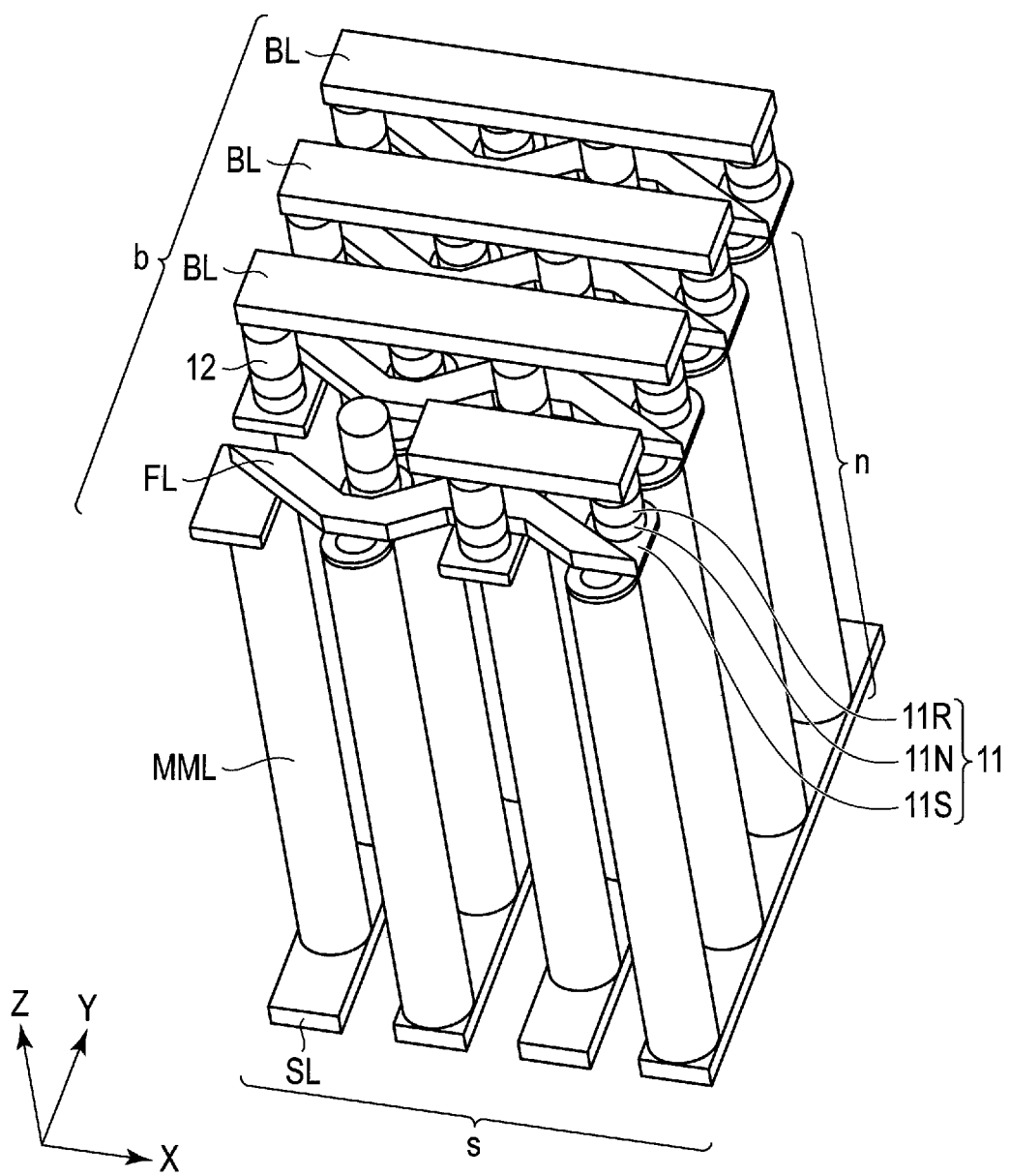
F I G. 4

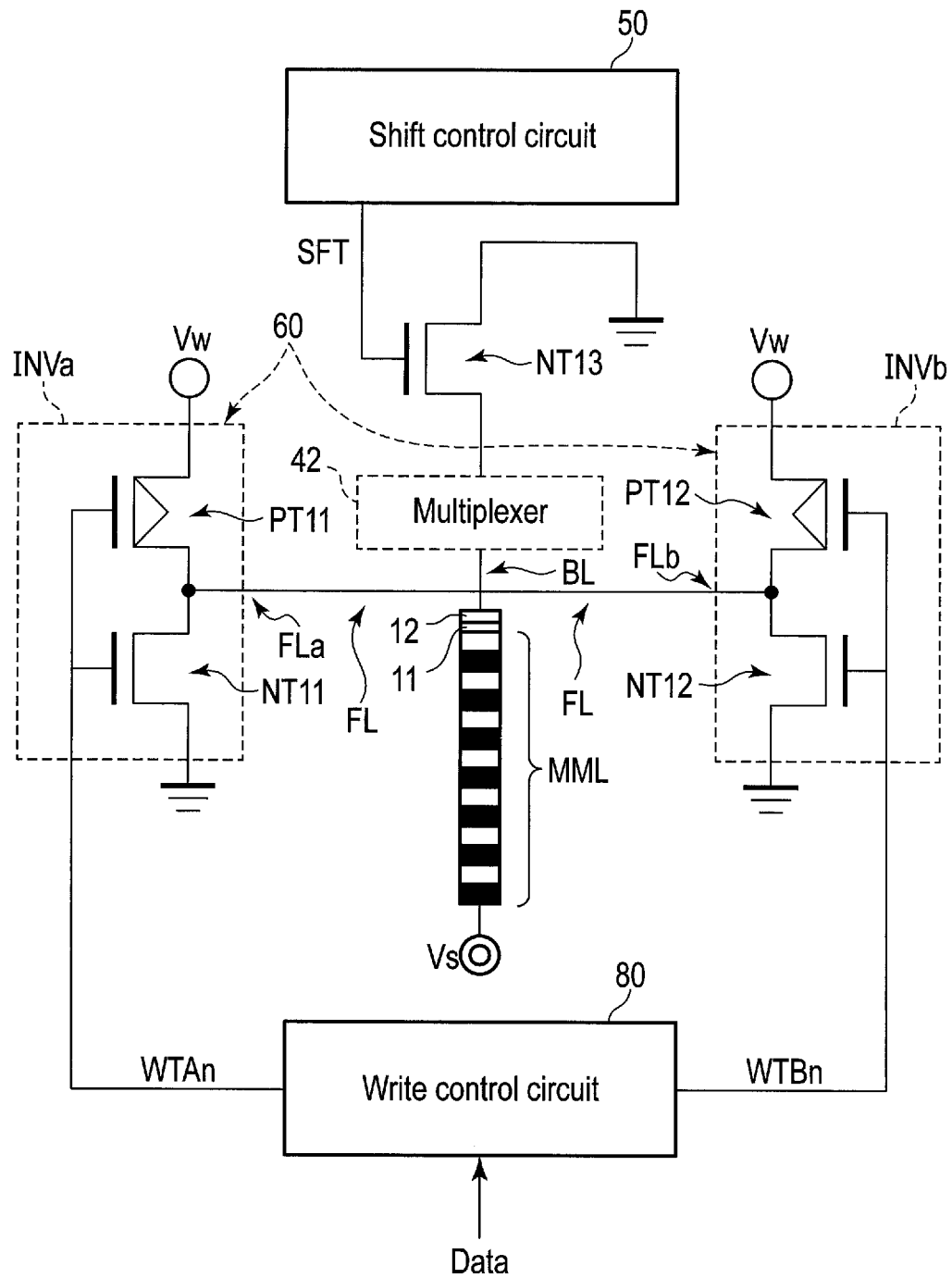
F I G. 9

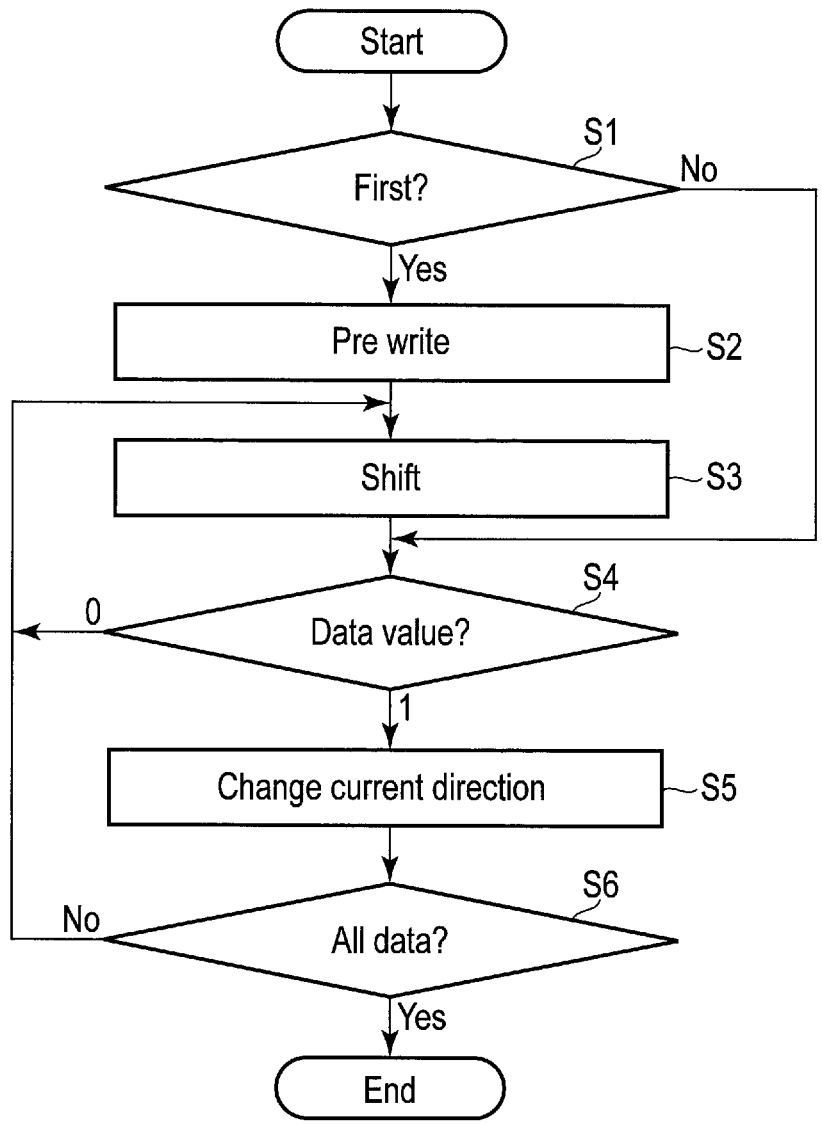
F I G. 10

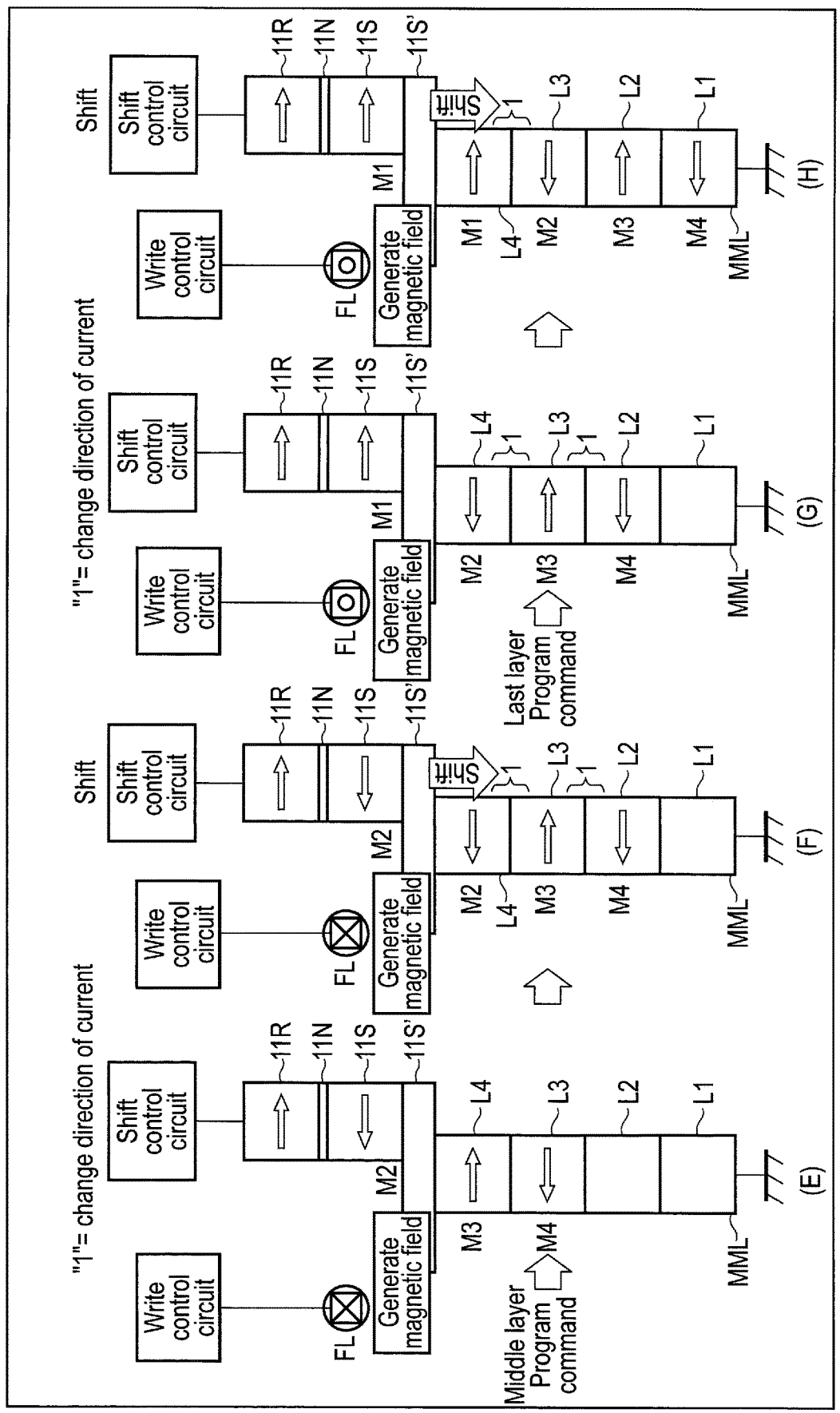
F I G. 15

| Write types | Commands |
|---|---|
| Initial layer Program | 80h-Adr2(Row,Column)-DATA(64B)-01h |
| Middle layer Program | 81h-Adr1(Column)-DATA(64B)-01h |
| Last layer Program | 81h-Adr1(Column)-DATA(64B)-00h |
F I G. 16
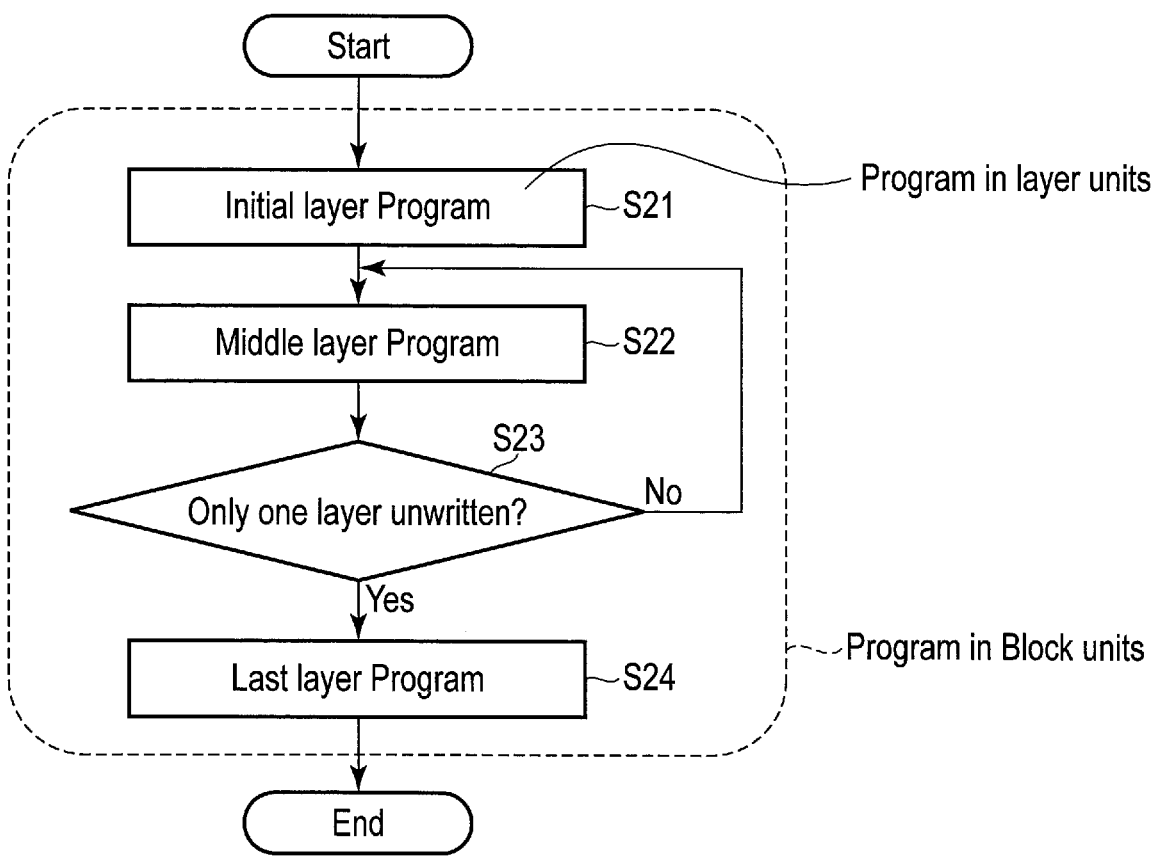
F I G. 17

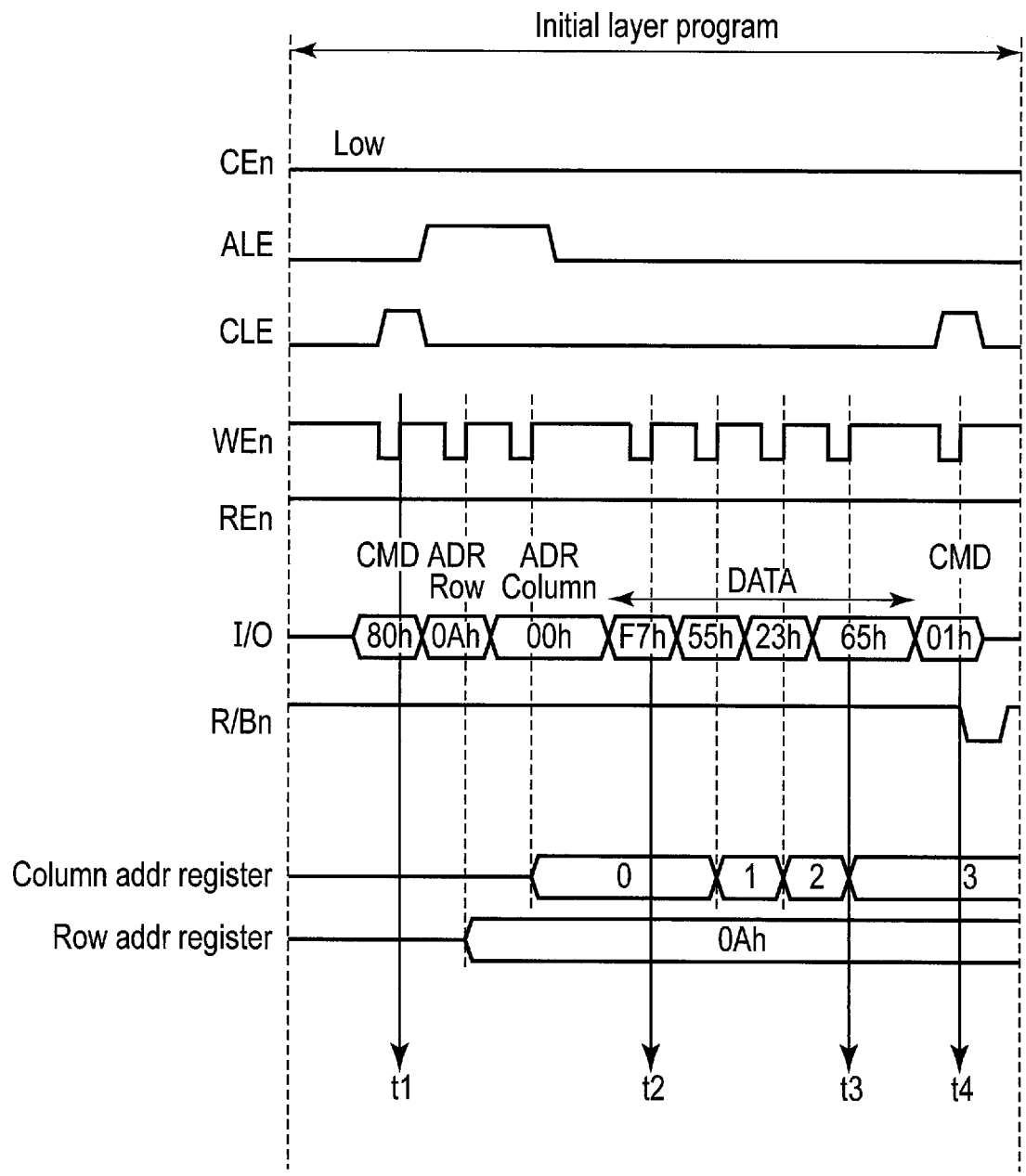
F I G. 18

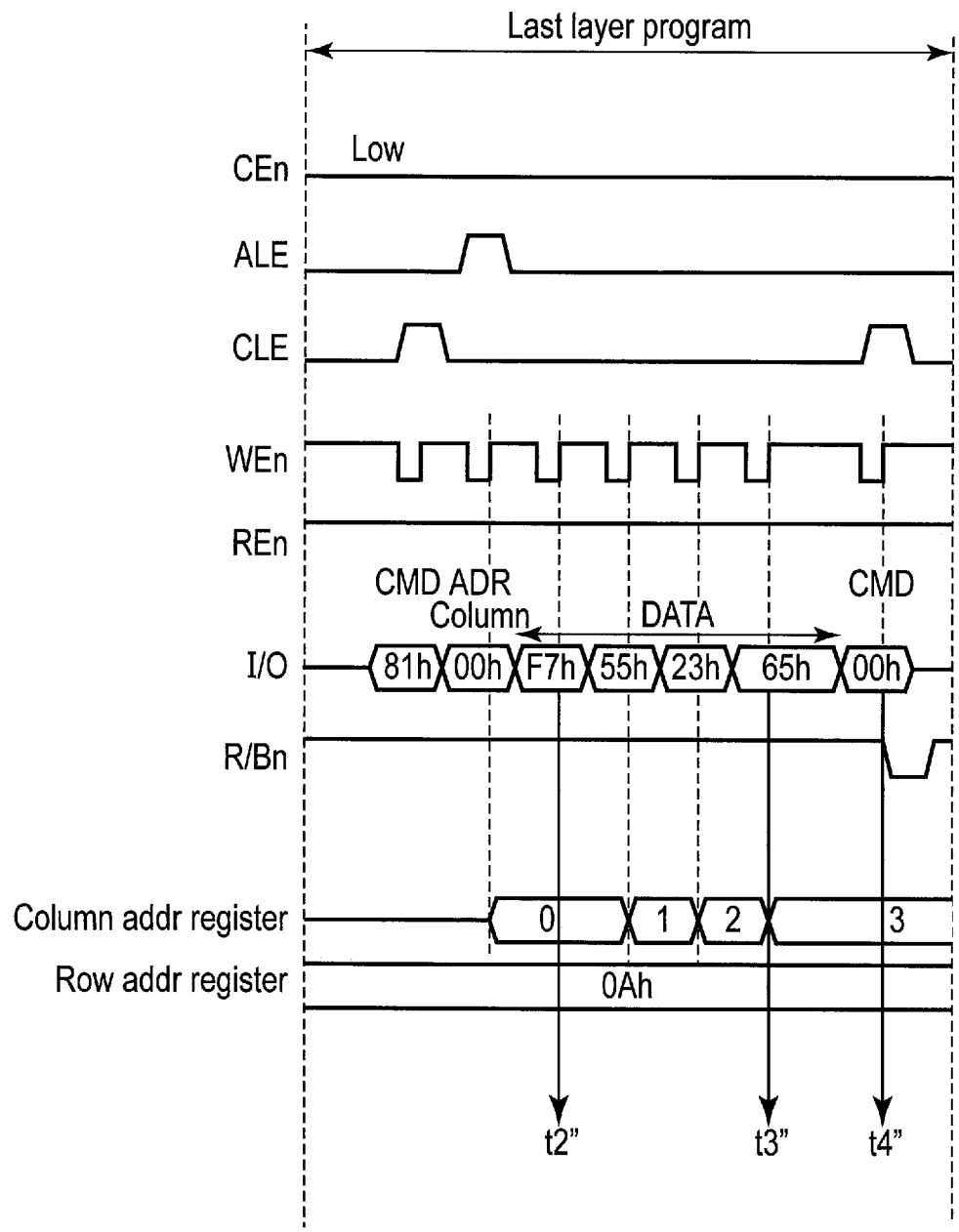
F I G. 20

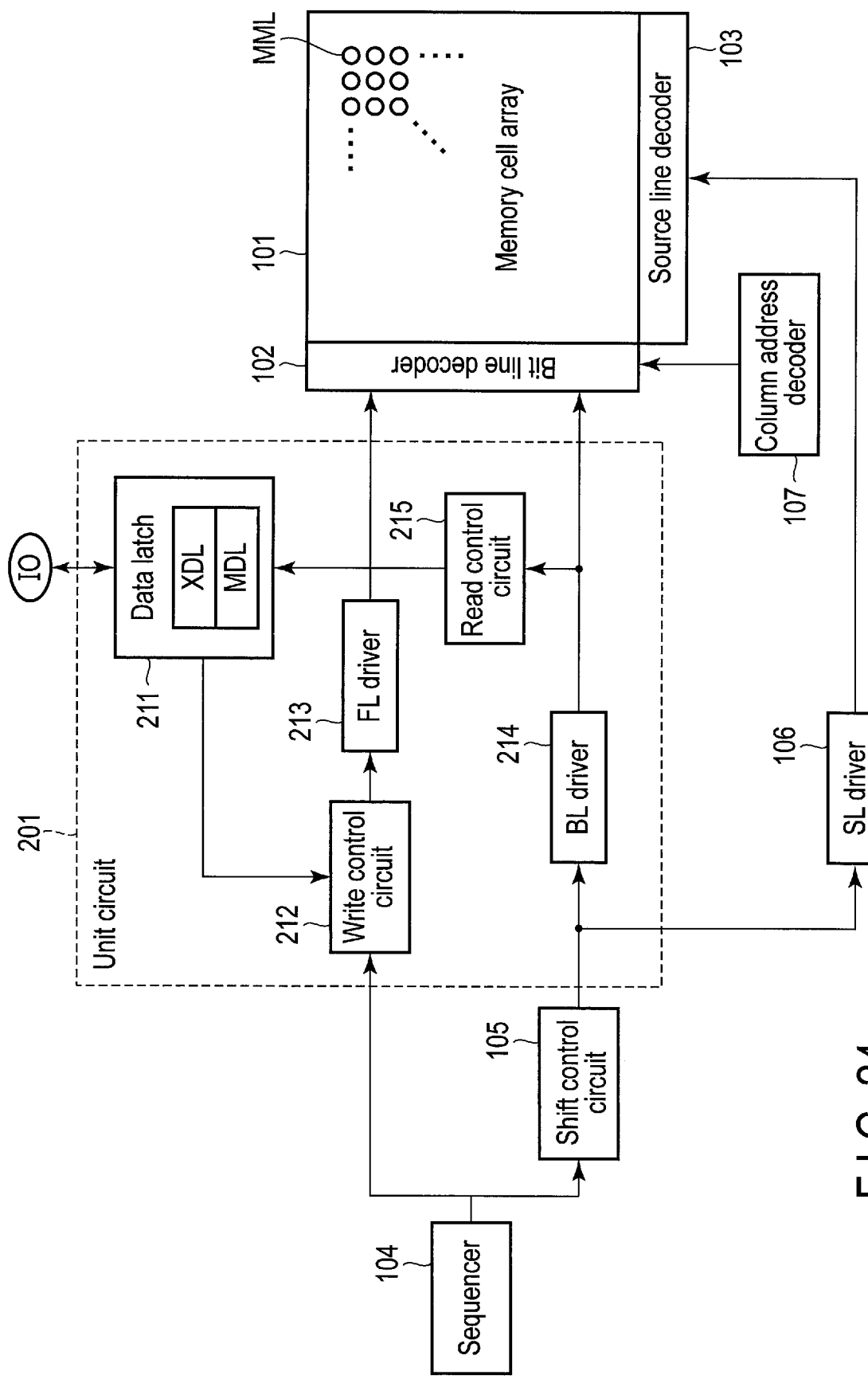
F I G. 24

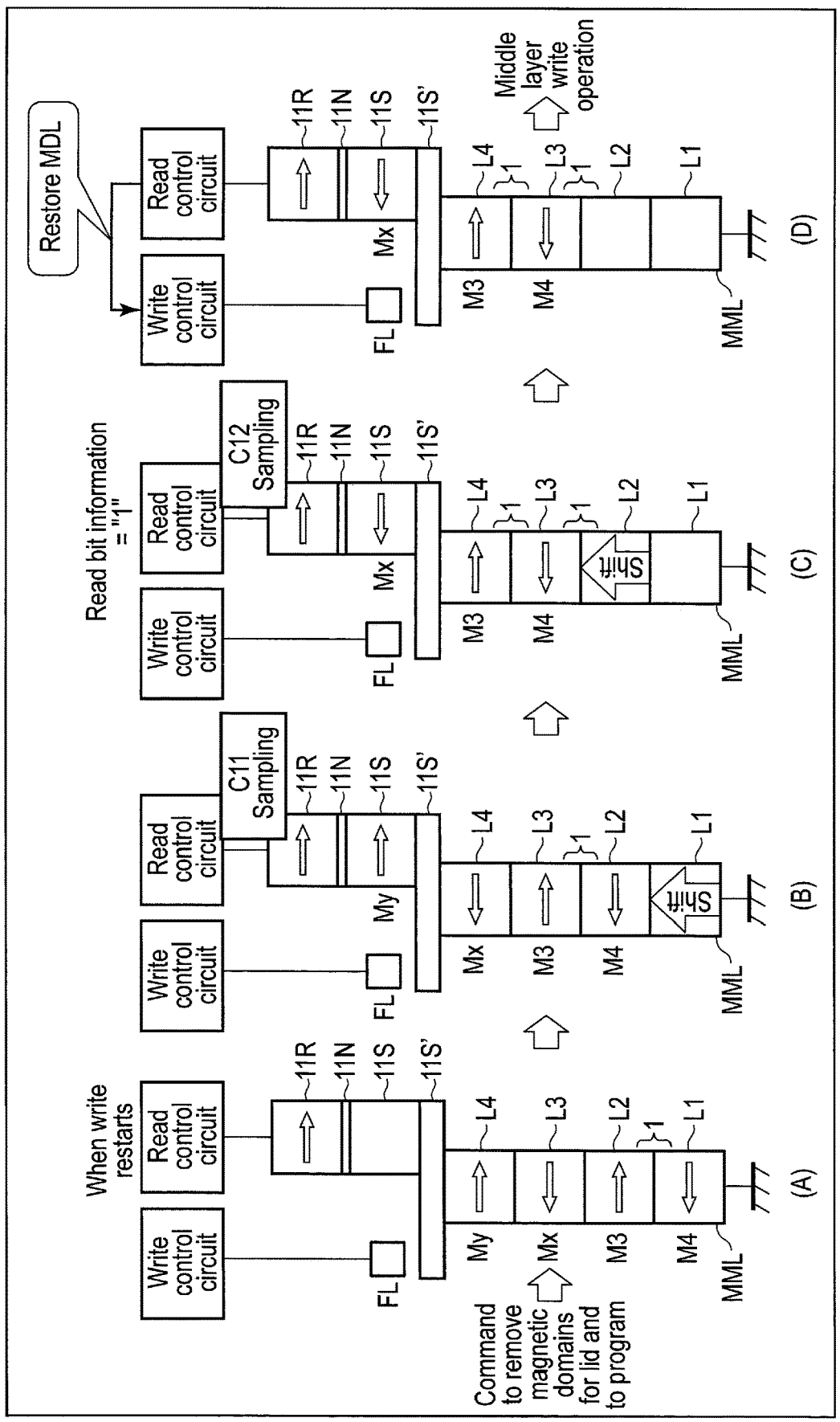
F I G. 26

Command to add magnetic domains for lid

| Write type | Command |
|---|---|
| Middle layer | 81h-Adr1(Column)-21h |

F I G. 27

Commands to remove magnetic domains for lid and to program

| Write type | Commands |
|---|---|
| Initial layer Program | 80h-Adr2(Row,Column)-DATA(64B)-1 1h |
| Middle layer Program | 81h-Adr1(Column)      -DATA(64B)-1 1h |
| Last layer Program | 81h-Adr1(Column)      -DATA(64B)-1 0h |

| Command [7:4] | Operations |
|---|---|
| 0 | Program |
| 1 | Remove magnetic domains for lid and Program |

F I G. 28

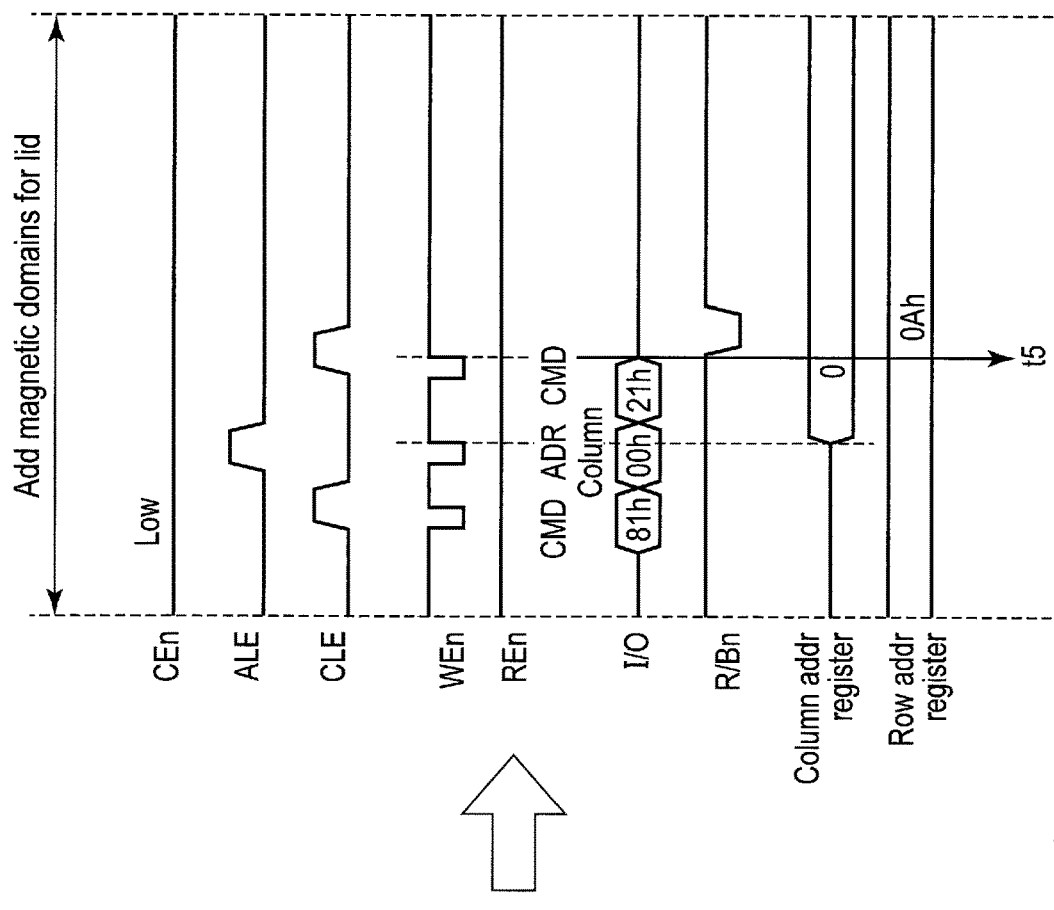
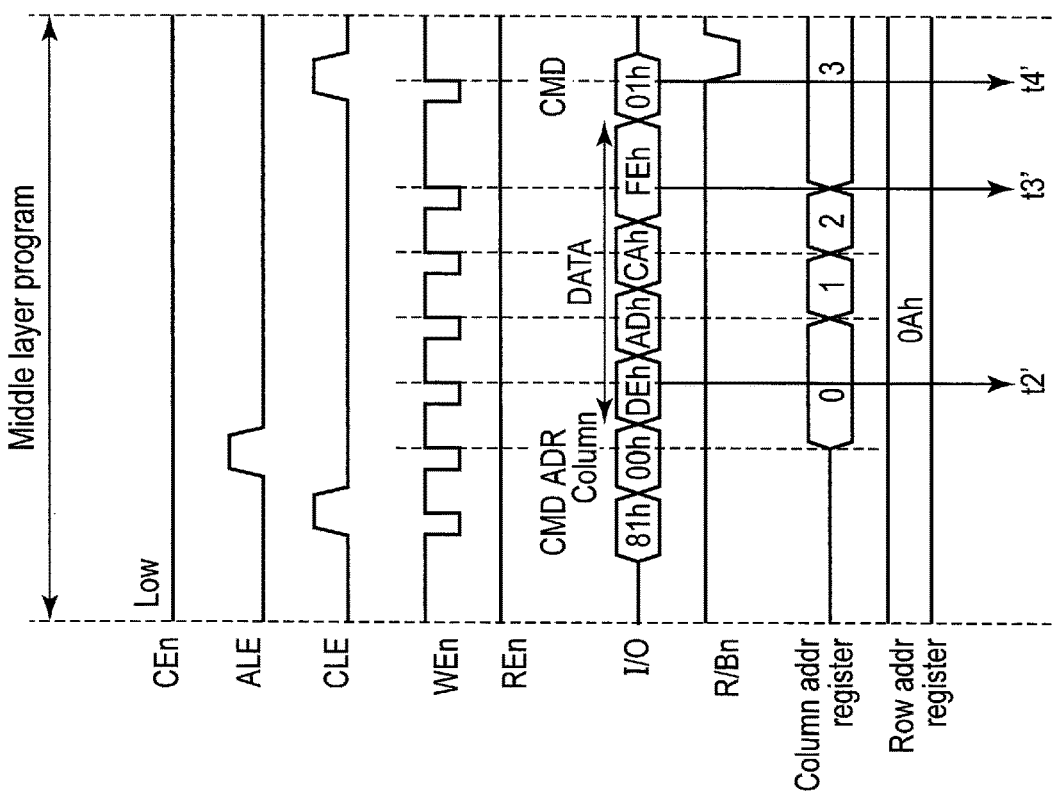
FIG. 30

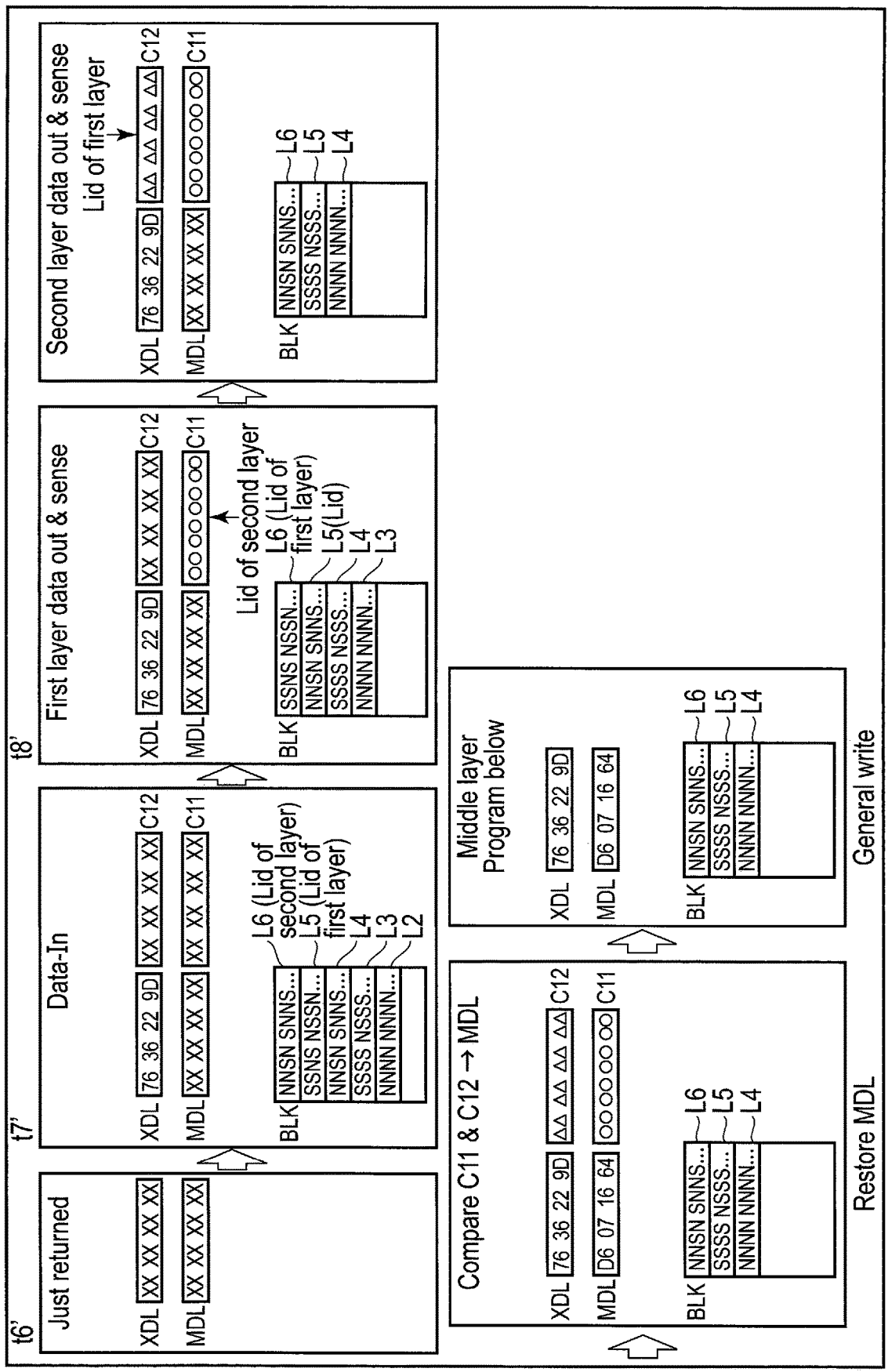
F I G. 35

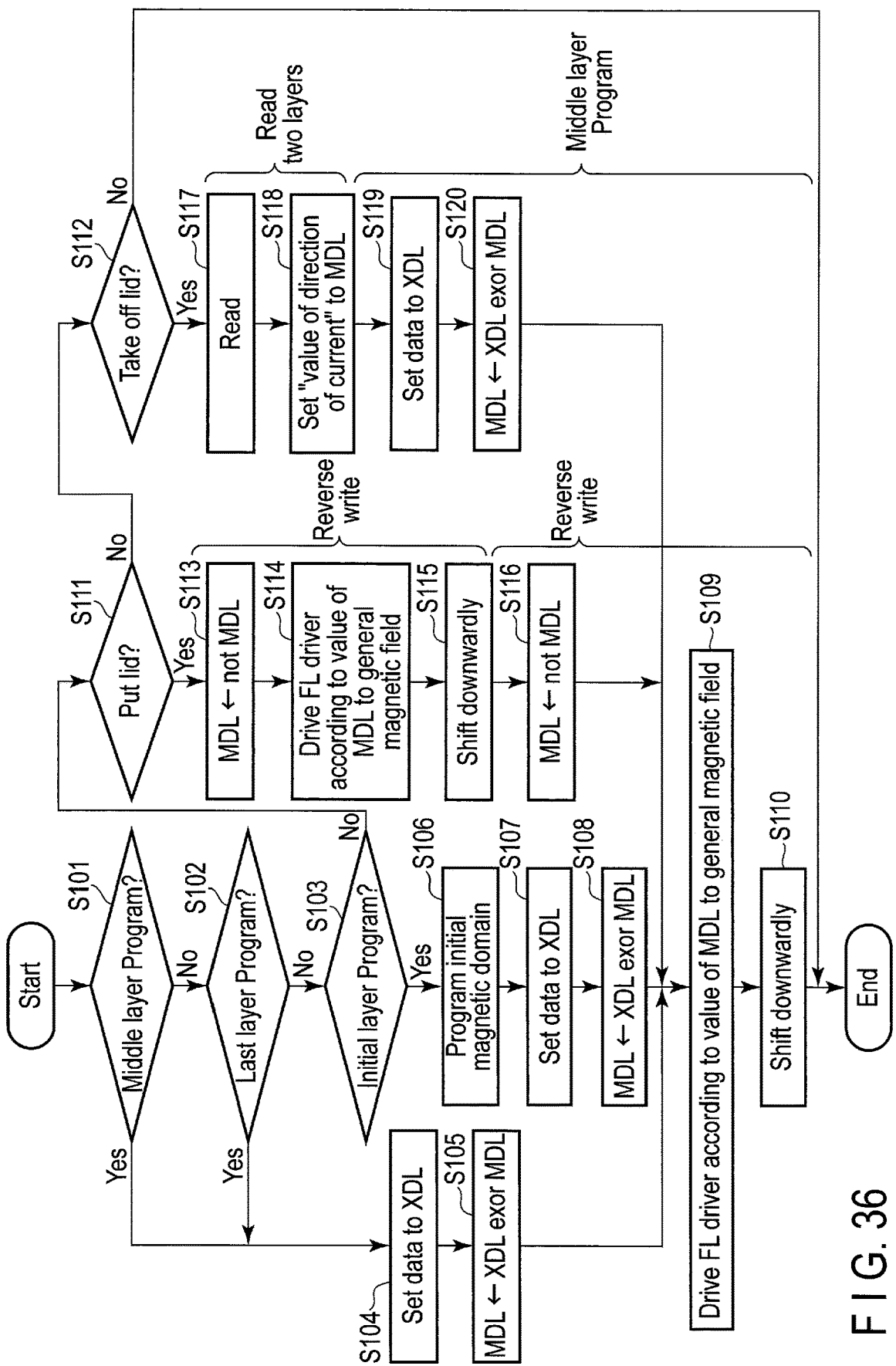
F I G. 36

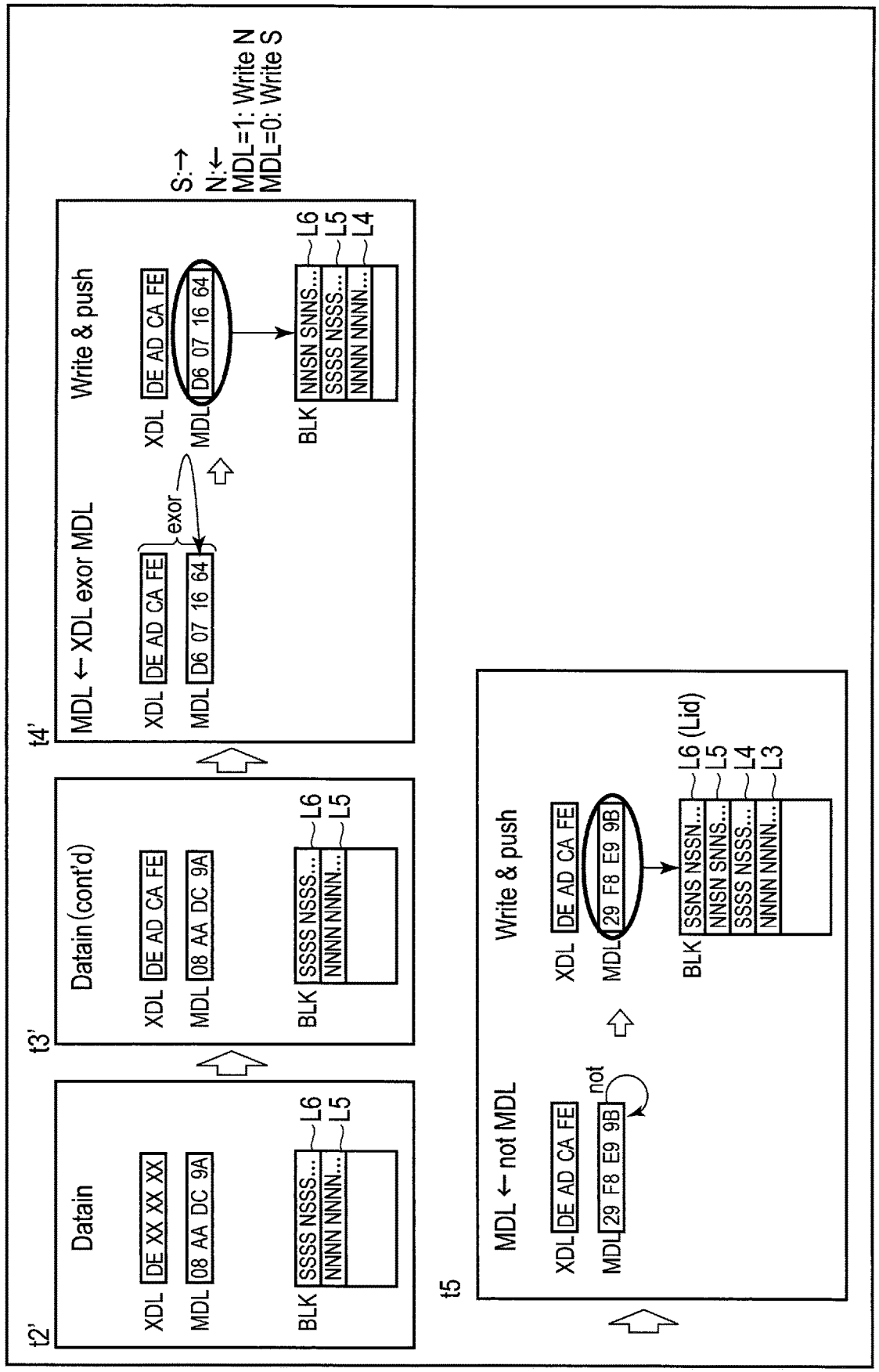
F I G. 37

Copy content of MDL#1 to MDL#2
| Write type | Copy command |
|---|---|
| Copy | 81h-Adr1(Column)-41h |
F I G. 44
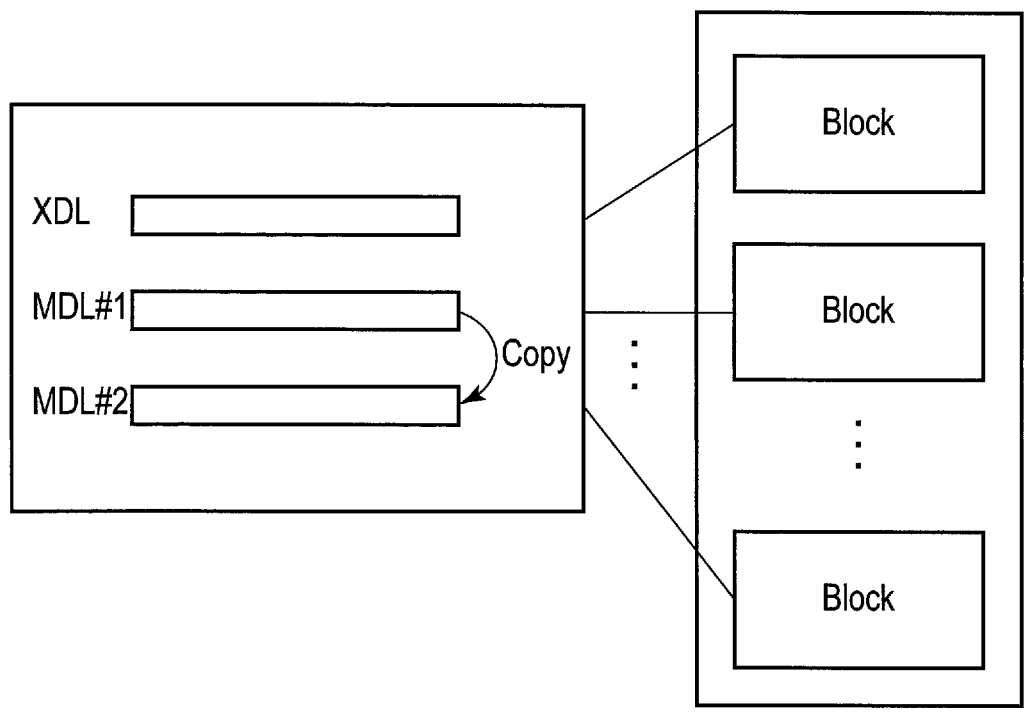
F I G. 45

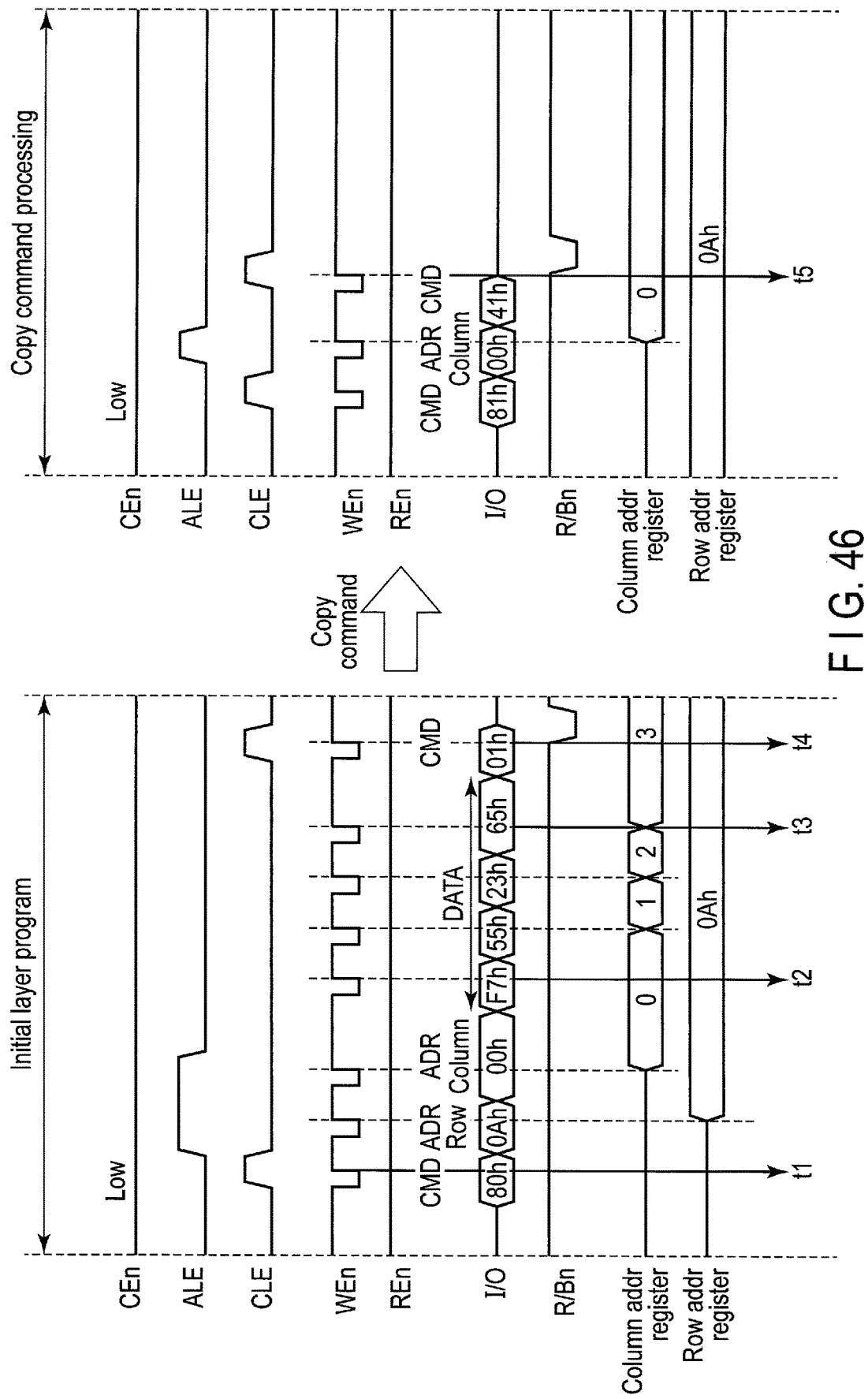
F I G. 46

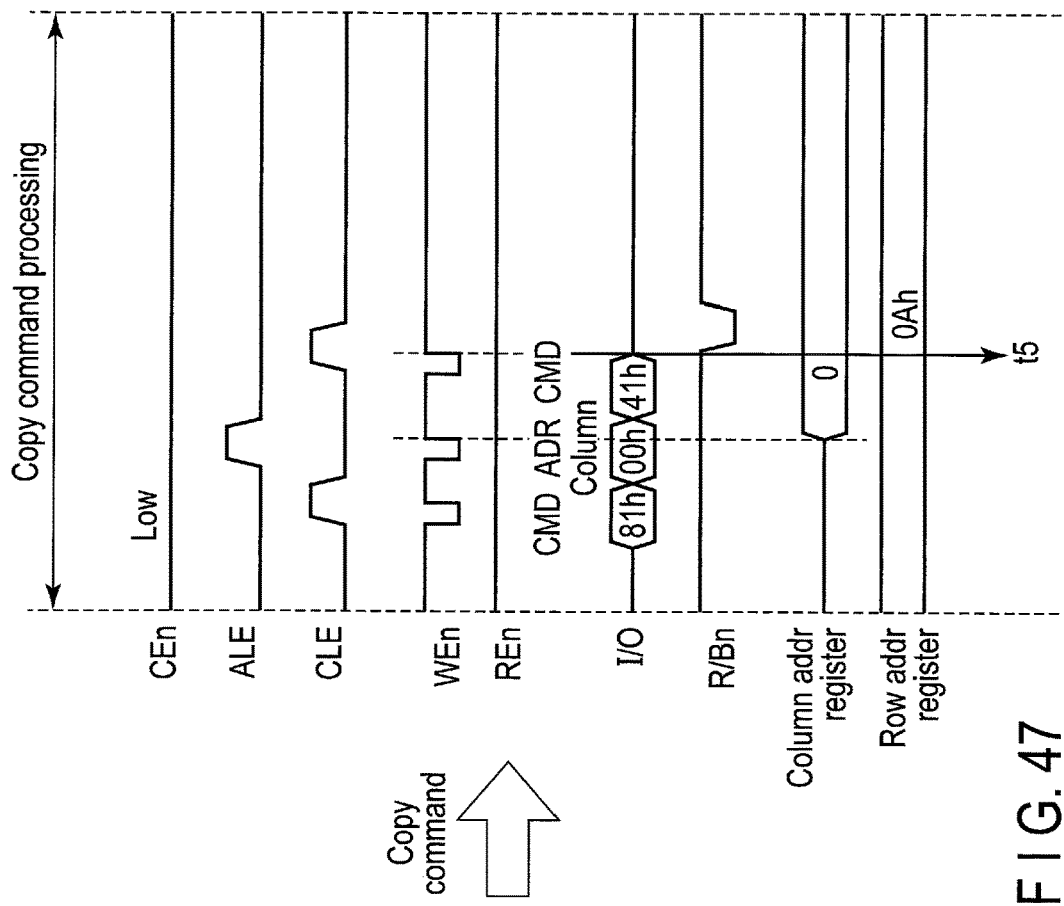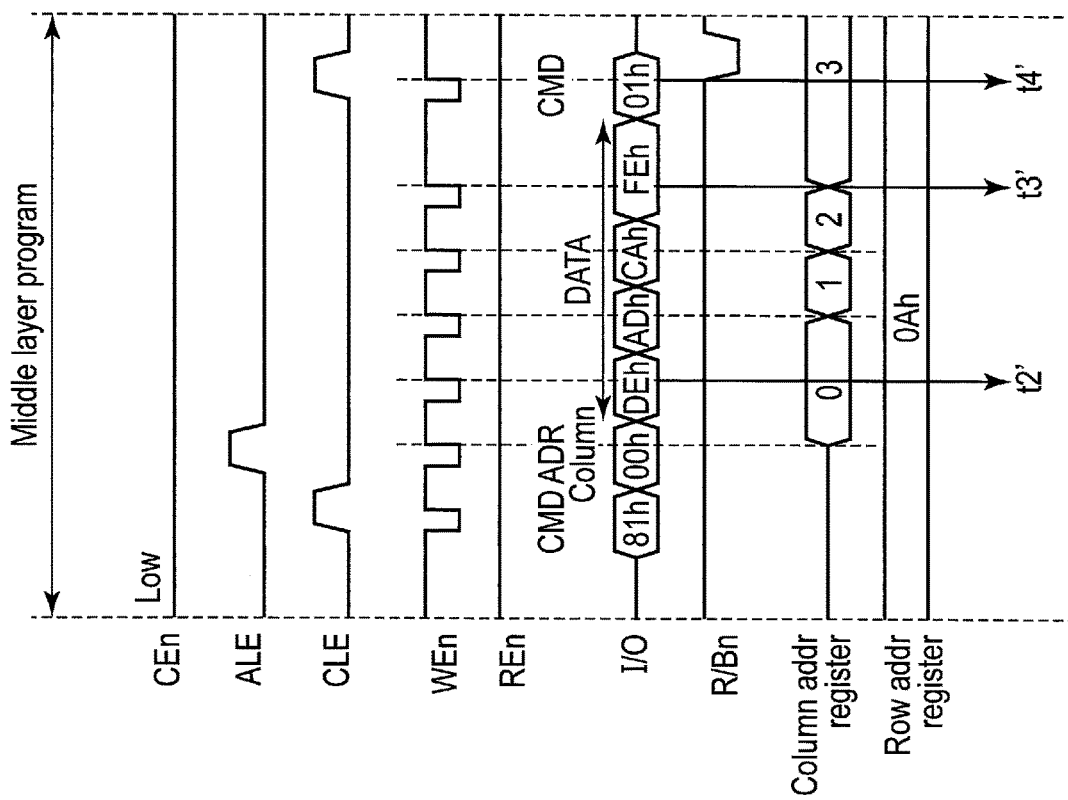
FIG. 47

MEMORY SYSTEM FOR CONTROLLING MAGNETIC MEMORY

CROSS-REFERENCE TO RELATED APPLICATIONS

This application is based upon and claims the benefit of priority from Japanese Patent Application No. 2019-045131, filed Mar. 12, 2019, the entire contents of which are incorporated herein by reference.

FIELD

Embodiments described herein relate generally to a technology of controlling a magnetic memory.

BACKGROUND

In recent years, memory systems comprising nonvolatile memories have been widely prevalent. One of the memory systems has been known as a solid state drive (SSD) comprising a NAND flash memory.

Recently, development of magnetic memories as next-generation nonvolatile memories has started.

BRIEF DESCRIPTION OF THE DRAWINGS

FIG. 1 is a block diagram illustrating a configuration example of a memory system according to an embodiment.

FIG. 2 is a diagram illustrating a configuration example of a memory cell array in a magnetic memory incorporated in the memory system according to the embodiment.

FIG. 4 is a perspective view illustrating a configuration example of the memory cell array in FIG. 2.

FIG. 9 is a diagram illustrating a configuration example of a circuit related to a write operation executed in the magnetic memory.

FIG. 10 is a flowchart illustrating a procedure of the write operation executed in the magnetic memory.

FIG. 15 is a diagram illustrating a continuing part of the write operation executed in the magnetic memory.

FIG. 16 is a table illustrating three types of program commands issued by the magnetic memory.

FIG. 17 is a flowchart illustrating a procedure of the write operation executed in block units.

FIG. 18 is a timing chart illustrating a sequence of an initial layer program operation.

FIG. 20 is a timing chart illustrating a sequence of a last layer program operation.

FIG. 24 is a block diagram illustrating a configuration example of one of unit circuits incorporated in a column control circuit of the magnetic memory in FIG. 23.

FIG. 26 is a diagram illustrating an operation of reading magnetic domains for lid for two layers and restoring magnetic data indicative of the magnetization direction of the layer last programmed.

FIG. 27 is a table illustrating an example of a command to add the magnetic domains for lid.

FIG. 28 is a table illustrating an example of a command to remove the magnetic domains for lid and to program.

FIG. 30 is a timing chart illustrating the middle layer program operation and an operation of adding the magnetic domains for lid.

FIG. 35 is a diagram illustrating variation of data in the magnetic memory in the operation illustrated in the timing chart of FIG. 32.

FIG. 36 is a flowchart illustrating a procedure of adding magnetic domains for lid for two layers and reading the magnetic domains for lid for two layers.

FIG. 37 is a diagram illustrating variation of data in the magnetic memory in the operation of writing the magnetic domains to the middle layer and adding the magnetic domains for lid for one layer.

FIG. 44 is a diagram illustrating an example of a command to copy a content of a first MDL to a second MDL.

FIG. 45 is a diagram illustrating two MDLs shared by a plurality of blocks in the magnetic memory.

FIG. 46 is a timing chart illustrating the initial layer program operation and the copy command processing.

FIG. 47 is a timing chart illustrating the middle layer program operation and the copy command processing.

DETAILED DESCRIPTION

Figure 3:
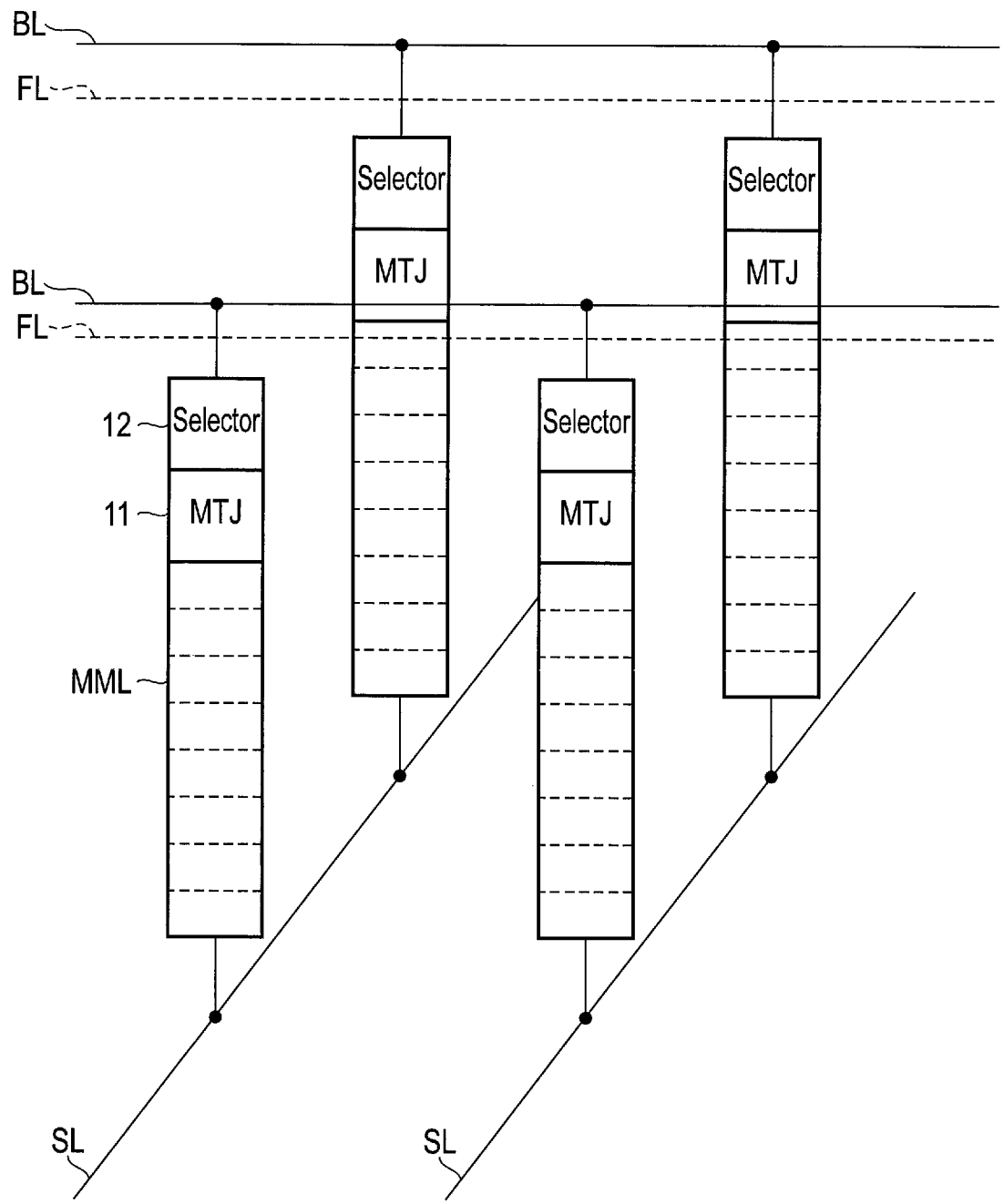
FIG. 3 is a diagram illustrating a circuit configuration example of the memory cell array in FIG. 2.

Various embodiments will be described hereinafter with reference to the accompanying drawings.

In general, according to one embodiment, a memory system comprises a magnetic memory and a controller which controls the magnetic memory. The magnetic memory includes a first magnetic memory line including a plurality of layers, each of the layers being capable of storing a magnetic domain.

The magnetic memory puts a first magnetic domain having a magnetization direction which is the same as or opposite to a magnetization direction of a magnetic domain stored in a first layer located on one end side of the first magnetic memory line, into the first layer, on the basis of a value of first data received from the controller and the magnetization direction of the magnetic domain stored in the first layer, such that a magnetic domain stored in each layer of the first magnetic memory line is moved by one layer in a first direction from the one end side to another end side of the first magnetic memory line.

When receiving a first command from the controller, the magnetic memory puts a first additional magnetic domain having a magnetization direction determined based on the magnetization direction of the first magnetic domain and a second additional magnetic domain having a magnetization direction opposite to the magnetization direction of the first additional magnetic domain, into the first magnetic memory line, such that the magnetic domain stored in each layer of the first magnetic memory line is moved by two layers in the first direction.

When receiving a second command from the controller, the magnetic memory reads the second additional magnetic domain and the first additional magnetic domain by moving the magnetic domain stored in each layer of the first magnetic memory line by two layers in a second direction from the other end side to the one end side of the first magnetic memory line, and determines the magnetization direction of the first magnetic domain, on the basis of the read second additional magnetic domain and the read first magnetic domain.

FIG. 1 illustrates a configuration example of a memory system according to a first embodiment. A memory system 1 includes a controller (hereinafter called a memory controller) 2 and a magnetic memory 3. The memory system 1 can be connected to a host (host device) 4, and FIG. 1 illustrates that the memory system 1 is connected to the host 4. The host 4 is an electronic device such as a personal computer, a server, or a portable terminal.

The magnetic memory 3 is configured to execute, by a last-in first-out method (also referred to as a first-in last-out method), writing and reading data in a certain capacity unit referred to as a block. The magnetic memory 3 includes a plurality of blocks. Each of the blocks includes a plurality of layers that function as a plurality of stages of a shift register. In other words, one layer functions as one of stages in the shift register. The magnetic memory 3 shifts a magnetic domain (also referred to as magnetization) stored in individual layers in a first direction from a layer corresponding to a first stage to a layer corresponding to a last stage or a second direction opposite to the first direction, in a unit of a layer, so as to execute writing and reading data for each block by the last-in first-out (LIFO) method. The magnetic memory 3 is also called a magnetic domain wall motion memory.

The memory system 1 may be implemented as a solid state drive (SSD) or may be implemented as a memory card in which the memory controller 2 and the magnetic memory 3 are configured as one package.

The memory controller 2 controls writing data to the magnetic memory 3 in response to a write request received from the host 4. In this case, the memory controller 2 transmits a program command to instruct write (program) of the data to the magnetic memory 3 together with an address and the data. In addition, the memory controller 2 controls reading data from the magnetic memory 3 in response to a read request received from the host 4. In this case, the memory controller 2 transmits a read command to instruct read of the data to the magnetic memory 3 together with an address.

The memory controller 2 may be implemented by a circuit such as a System-on-a-chip (SoC). The memory controller 2 comprises a host interface 21, a memory interface 22, a control unit 23, an encoder/decoder 24, and a data buffer 25. The host interface 21, the memory interface 22, the control unit 23, the encoder/decoder 24, and the data buffer 25 are connected to an internal bus 20.

The host interface 21 executes processing according to an interface standard between a host and a device, and outputs a request received from the host 4, user data, and the like to the internal bus 20. In addition, the host interface 21 transmits user data read from the magnetic memory 3, a response received from the control unit 23, and the like to the host 4. In the embodiment, data associated with the write request from the host 4 is referred to as user data.

The memory interface 22 executes a write operation for writing data to the magnetic memory 3, based on an instruction from the control unit 23. In addition, the memory interface 22 executes a read operation for reading data from the magnetic memory 3, based on an instruction from the control unit 23.

The control unit 23 comprehensively controls constituent elements of the memory system 1. The control unit 23 may be implemented as a CPU (processor).

When receiving a request from the host 4 via the host interface 21, the control unit 23 executes control according to the request. For example, the control unit 23 instructs the memory interface 22 to write the write data (user data, parity, and the like) to the magnetic memory 3 according to a write request received from the host 4. In addition, the control unit 23 instructs the memory interface 22 to read the data (user data, parity, and the like) from the magnetic memory 3 according to a read request received from the host 4. The parity means an error correction code (ECC) obtained by encoding the user data.

In addition, when receiving the write request from the host 4, the control unit 23 determines a storage area (memory area) on the magnetic memory 3 to which user data stored in the data buffer 25 is to be written. That is, the control unit 23 manages a write destination of the user data. The control unit 23 manages mapping between a logical address designated by the write request received from the host 4 and a physical address indicative of a storage area on the magnetic memory 3 in which the user data corresponding to the logical address is stored, by using a lookup table (LUT) that functions as an address translation table. The lookup table (LUT) may be stored in a RAM (dynamic RAM (DRAM) or static RAM (SRAM)) in the memory system 1 or stored in a nonvolatile state in the magnetic memory 3. In the latter case, when the memory system 1 is powered on, the LUT may be loaded from the magnetic memory 3 into the RAM in the memory system 1.

In addition, when receiving the read request from the host 4, the control unit 23 translates a logical address designated by the read request into a physical address, by using the above-mentioned LUT (address translation table), and instructs the memory interface 22 to read data from the physical address.

The data buffer 25 temporarily stores user data received from the host 4. In addition, the data buffer 25 temporarily stores user data read from the magnetic memory 3. Furthermore, the data buffer 25 temporarily stores encoded data (user data+ECC) created by encoding user data. The data buffer 25 is composed of, for example, the above-mentioned RAM (SRAM or DRAM).

The user data transmitted from the host 4 is transferred to the internal bus 20 and stored in the data buffer 25. The encoder/decoder 24 encodes data to be written in the magnetic memory 3 to create the encoded data (user data+ECC). Any coding may be used as the coding for this encoding. For example, Reed Solomon (RS) coding, Bose Chaudhuri Hocquenghem (BCH) coding, and Low Density Parity Check (LDPC) coding can be used. The encoder/decoder 24 comprises an encoding unit 26 and a decoding unit 27.

To simplify explanations, in the embodiment, the magnetic memory 3 is assumed to include one magnetic memory chip, but the embodiment can also be applied to a configuration in which the magnetic memory 3 includes a plurality of magnetic memory chips.

FIG. 2 illustrates a configuration example of the memory cell array included in the magnetic memory 3. In the following descriptions, a configuration example of a memory cell array will be explained by using specific numerical values to make the embodiment easily understood, and these numerical values are mere examples, and the embodiment are not limited to these specific numerical values but any numerical values can be applied to the configuration of the memory cell array of the embodiment.

The memory cell array includes a plurality of blocks. Each of the blocks is a unit of writing and reading data by the last-in first-out method.

It is assumed that each of the blocks includes a total of n layers, i.e., layer L1 to layer Ln. These n layers function as a plurality of stages of the above-described shift register. The layer Ln corresponds to the first stage of the shift register and the layer L1 corresponds to the last stage of the shift register.

The layers L1 to Ln of each block can be implemented by one or more magnetic memory lines MMLs included in this block.

Each of the blocks is assumed to include 512 magnetic memory lines MMLs. The magnetic memory line is a magnetic shift register and is implemented by, for example, a magnetic material extending in one direction. The magnetic memory line MML is also called a magnetic line, a magnetic nanowire, or a magnetic material pillar. The magnetic memory line MML includes a plurality of layers. Each of the layers is capable of storing a magnetic domain. These layers of the magnetic memory line MML are the elements of layer L1 to layer Ln of the block. For example, layer Ln of the block includes a set of 512 layers located on one-end side of 512 magnetic memory lines MMLs, and layer L1 of the block includes a set of 512 layers located on the other end side of 512 magnetic memory lines MMLs.

FIG. 2 illustrates a magnetic memory line MML including a set of a plurality of ellipses continuing in a longitudinal direction. Each of the ellipses is indicative of one layer in the magnetic memory line MML. A combination of 512 magnetic memory lines MMLs constitutes one block. Corner-rounded rectangles extending in a horizontal direction across 512 magnetic memory lines MMLs represent the layers L1 to Ln of the block.

Each of the magnetic memory lines MMLs is accessed by the last-in first-out method in which a storage position of data previously written is moved to a back side when next data is written, and the data on the back side cannot be read until the data programmed later is read.

In the write operation of writing data to the block, data (512 magnetic domains) stored in each layer of this block are shifted in a unit of a layer, in the first direction (i.e., the direction from the upper part to the lower part in FIG. 2) from the layer Ln corresponding to the first stage to the layer L1 corresponding to the last stage.

In the read operation of reading the data from the block, the data (512 magnetic domains) stored in each layer of the block are shifted in a unit of a layer, in the second direction (i.e., the direction from the lower part to the upper part in FIG. 2) opposite to the first direction.

FIG. 3 illustrates a circuit configuration example of the memory cell array in FIG. 2.

The memory cell array includes a plurality of bit lines BL, a plurality of source lines SL, and a plurality of field lines FL. The magnetic memory lines MML are electrically connected between the bit lines BL and the source lines SL. One block includes, for example, the same number of bit lines BL as the number of magnetic memory lines MMLs included in this block, the same number of field lines FL as the number of magnetic memory lines MMLs included in this block, and one source line SL.

One end of the magnetic memory line MML is connected to the bit line BL via a magnetoresistive element (or resistance change element or variable resistance element) 11 and a selector element (selector) 12, sequentially. That is, one end of the magnetic memory line MML is connected to one end of the magnetoresistive element 11, and the other end of the magnetoresistive element 11 is connected to one end of the selector element 12. The other end of the selector element 12 is connected to the bit line BL. Furthermore, the other end of the magnetic memory line MML is connected to the source line SL.

The magnetoresistive element 11 includes, for example, a magnetic tunnel junction (MTJ) element having resistance varied in accordance with the magnetized state of the magnetoresistive element 11. The selector element 12 includes, for example, an element which becomes a low resistance state when a voltage higher than or equal to a threshold voltage is applied to the selector element 12 and becomes a high resistance state when a voltage lower than the threshold voltage is applied to the selector element 12. The selector element 12 may be, for example, a two-terminal (binary) switching element. If the voltage applied between a pair of terminals is less than a threshold voltage, the switching element 12 can remain in a high resistance state, e.g., an electrically nonconductive state. If the voltage applied between the pair of terminals is greater than the threshold voltage, the switching element 12 can turn into a low resistance state, e.g., an electrically conductive state. The switching element 12 can be configured to perform this function regardless of a polarity of the voltage. The switching element 12 may include one or more chalcogen element selected from the group of Tellurium(Te), Selenium(Se) and Sulfur(S). The switching element may include a chalcogenide including a chalcogen element. Furthermore, the switching element may include one or more element selected from the group of Boron(B), Aluminium(Al), Gallium(Ga), Indium(In), Carbon(C), Silicon(Si), Gerumanium (Ge), Tin(Sn), Arsenic(As), Phosphorus(P), Antimony(Sb).

For example, a set of the magnetic memory lines MMLs, the magnetoresistive elements 11, and the selector elements 12 aligned in one direction is connected to the same bit line BL, at the other ends of these selector elements 12. Furthermore, one field line FL is arranged near one-side ends of the magnetic memory lines MMLs aligned in one direction. Each of the field lines FL is used to generate an induced magnetic field.

In contrast, a set of the magnetic memory lines MMLs, the magnetoresistive elements 11, and the selector elements 12 aligned in a direction intersecting this direction is connected to the same source line SL, at the other ends of the magnetoresistive elements MMLs.

FIG. 4 is a perspective view illustrating a configuration example of the memory cell array.

In FIG. 4, two directions orthogonal to each other are referred to as X direction and Y direction, and a direction which is orthogonal to the X direction and the Y direction (XY plane) and in which the magnetic memory lines MML extend is referred to as Z direction.

The source lines SL extending in the Y direction are aligned in the X direction. On the source lines SL, the magnetoresistive elements MMLs, the magnetoresistive elements 11, and the selector elements 12 are aligned in the Z direction. The magnetoresistive element 11 is composed of, for example, a magnetic tunnel junction (MTJ) element. The MTJ element includes a magnetic layer 11R, a nonmagnetic layer 11N, and a magnetic layer 11S. Details of the MTJ element will be described later.

The structure of the memory cell array will be explained in detail. The magnetic memory lines MMLs are provided on the source lines SL. The magnetic layer 11S is provided on one end of the magnetic memory line MML. The magnetic layer 11S extends in a certain distance in the Y direction, and the nonmagnetic layer 11N and the magnetic layer 11R are provided in order on the extending magnetic layer 11S. The bit lines BL are provided on the magnetic layers 11R via the selector elements 12. The magnetic layer 11S of the MTJ element may be provided on a magnetic layer arranged on one side end of the magnetic memory line MML and extending in the Y direction. In this case, the magnetic layer arranged on one side end of the magnetic memory line MML and extending in the Y direction functions as a part of the magnetic layer 11S of the MTJ element and is referred to as a magnetic layer 11S'.

The magnetic memory lines MMLs, the magnetoresistive elements 11, and the selector elements 12 provided in the Z direction are aligned in matrix in the X and Y directions. The bit lines BL are provided on the selector elements 12 aligned in the X direction. Furthermore, the field lines (write lines) FL are provided on the magnetic layers 11S.

One block includes one source line SL, b magnetic memory lines MML arranged on the source line SL, and b bit lines BL corresponding to b magnetic memory lines MML. If the number of layers in each magnetic memory line MML is n, one block can store b×n magnetic domains. Each of writing and reading of data to the block is executed in parallel for b magnetic memory lines MMLs included in this block, in a unit of a layer. In a case where b is 512, the data size corresponding to one layer of the block is 64 bytes (=512 bits). The number of source lines SL included in the memory cell array is s. Each of s, n, and b is generally an integer of 2 or more but, in principle, each of s, n, and b may be an integer of 1 or more.

The MTJ element will be explained in detail in the following descriptions. The MTJ element includes a magnetic layer 11R, a nonmagnetic layer 11N, and a magnetic layer 11S. The nonmagnetic layer 11N is arranged between the magnetic layer 11R and the magnetic layer 11S. The magnetic layer 11R functions as a reference layer, and the magnetic layer 11S functions as a storage layer. The nonmagnetic layer 11N functions as a tunnel barrier. The MTJ element may include further layers.

The magnetic layer (storage layer) 11S is magnetized in a direction along a certain axis. For example, the magnetization direction of the magnetic layer 11S is stable in a direction parallel to an interface between the layers 11S and 11R and an interface between the layers 11R and 11N. The magnetization direction of the magnetic layer 11S can be reversed by the induced magnetic field generated by the field line FL or the magnetic domains read from the magnetic memory line MML.

The magnetic layer (reference layer) 11R has magnetization of fixed or invariable direction and has, for example, a larger coercive force than the coercive force of the magnetic layer (storage layer) 11S. The "fixed" or "invariable" magnetization direction of the magnetic layer 11R indicates that the magnetization direction of the magnetic layer 11R is not reversed by the magnetization direction of the magnetic domains of the magnetic memory line MML, which reversed the magnetization of the magnetic layer (storage layer) 11S.

A phenomenon of magnetoresistance can be generated by a set of the magnetic layer 11R, the nonmagnetic layer 11N, and the magnetic layer 11S. More specifically, when the magnetization direction of the magnetic layer 11S is the same as (parallel to) the magnetization direction of the magnetic layer 11R, the MTJ element represents the minimum resistance value. In contrast, when the magnetization direction of the magnetic layer 11S is opposite to (antiparallel to) the magnetization direction of the magnetic layer 11R, the MTJ element represents the maximum resistance value. The magnetoresistive element (MTJ element) 11 can take a low resistance state when the relative relationship in magnetization direction between the magnetic layer (storage layer) 11S and the magnetic layer (reference layer) 11R is parallel, and can take a high resistance state when the relative relationship is anti-parallel.

Next, the magnetic domains of the magnetic memory line MML and an information storing method will be explained with reference to FIG. 5.

Figure 5:
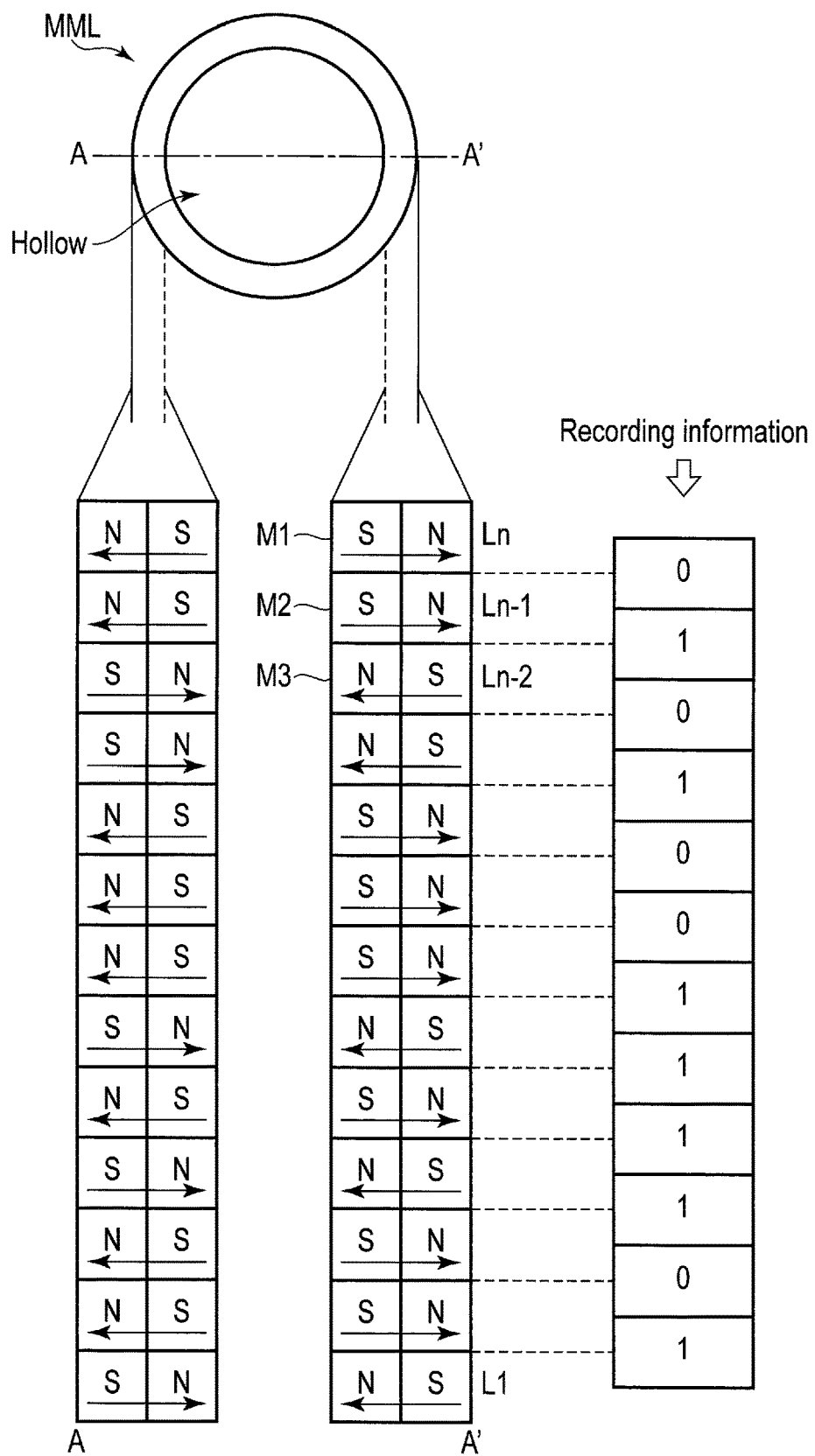
FIG. 5 is a diagram illustrating magnetic domains that are included in a magnetic memory line included in the memory cell array in FIG. 2, and an information storage method.

FIG. 5 illustrates a cross-sectional structure viewed along line A-A' of the magnetic memory line MML, an example of the magnetic domains (or the magnetization) of the magnetic memory line MML, and an information storing method using these magnetic domains.

The magnetic memory line MML is composed of, for example, a linear ferromagnetic body extending in the Z direction as illustrated in FIG. 4. For example, the linear ferromagnetic body may be shaped cylindrically to have a hollow part at the central portion as illustrated in FIG. 5 or may be shaped to have no hollow part at the central portion. The ferromagnetic body includes magnetic domains in the Z direction. For example, the magnetic memory line MML has magnetic domains (magnetization) M1, M2, M3, . . . along the Z direction in a cylindrical cross-section of the magnetic thin film. In other words, the magnetic memory line MML includes a plurality of layers along the Z direction and each of these layers holds the magnetic domain.

Each layer can hold the magnetic domain (or the magnetized state) in a direction or a direction opposite to this direction. Each layer has a magnetization direction formed in order of N pole and S pole from the outside of the cylinder or a magnetization direction formed in order of S pole and P pole, opposite to this, as illustrated in FIG. 5.

The magnetization direction may be a direction perpendicular to the Z direction in which the magnetic memory line MML extends (perpendicular magnetization film) or may be the Z direction in which the magnetic memory line MML extends (in-plane magnetization film).

In the embodiment, the magnetization direction of one magnetic domain is not indicative of information "1" or "0", but the information "1" or "0" is indicated in accordance with whether the magnetization directions of two magnetic domains adjacent in the Z direction are different from each other or the same as each other. That is, when the magnetization directions of two magnetic domains adjacent in the Z direction are different from each other, it is determined that first value data is stored in the information. In contrast, when the magnetization directions of two magnetic domains are the same as each other, it is determined that second value data is stored in the information. In FIG. 5, for example, magnetic domain M1 and magnetic domain M2 store "0" since the magnetization directions are the same each other. In contrast, magnetic domain M2 and magnetic domain M3 store "1" since the magnetization directions are different from each other.

Thus, the magnetization direction of a single magnetic domain does not correspond to "1" or "0", but the combination of two adjacent magnetic domains having the same magnetization direction corresponds to data "0" and the combination of two adjacent magnetic domains having the different magnetization directions corresponds to data "1". Note that the combination of two adjacent magnetic domains having the same magnetization direction may correspond to data "1" and the combination of two adjacent magnetic domains having the different magnetization directions may correspond to data "0".

Therefore, when one magnetic memory line MML includes n layers, the magnetic memory line MML can store n−1-bit data at maximum.

In the write operation of writing the data to the magnetic memory line MML, the magnetic memory 3 puts a new magnetic domain having the magnetization direction which is the same as or opposite to the magnetization direction of the magnetic domain currently stored in layer Ln located on one end side of the magnetic memory line MML, into the layer Ln of the magnetic memory line MML, on the basis of the value of the data to be written and the magnetization direction of the magnetic domain currently stored in layer Ln located on one end side of the magnetic memory line MML, such that the magnetic domain stored in each of layer Ln to layer L2 of the magnetic memory line MML is moved by one layer in a direction from one end side to the other end side of the magnetic memory line MML. More specifically, the magnetic memory 3 executes the following write operation.

The magnetic memory 3 first forms a magnetic domain having the magnetization direction which is the same as or opposite to the magnetization direction of the magnetic domain stored in layer Ln, in the magnetic layer 11S on one end of the magnetic memory line MML, on the basis of the value of the data to be written and the magnetization direction of the magnetic domain stored in the layer Ln. For example, when the value of the data to be written is "1", a magnetic domain having the magnetization direction which is opposite to the magnetization direction of the magnetic domain of the layer Ln is formed in the magnetic layer 11S. In contrast, when the value of the data to be written is "0", a magnetic domain having the magnetization direction which is the same as the magnetization direction of the magnetic domain of the layer Ln is formed in the magnetic layer 11S.

Then, the magnetic memory 3 moves the magnetic domain of each layer of the magnetic memory line MML by one layer in a direction from the layer Ln to the layer L1. Thus, the magnetic domain of the magnetic layer 11S propagates to the layer Ln and is pushed into the layer Ln, and the magnetic domain stored in each of the layer Ln to layer L2 of the magnetic memory line MML is moved by one layer in a direction from one end side to the other end side of the magnetic memory line MML. For example, the magnetic domain in the layer Ln is moved to layer Ln-1, and the magnetic domain in layer Ln-1 is moved to layer Ln-2.

Thus, since the combination of the magnetization directions of two adjacent magnetic domains corresponds to the data "0" or "1" in the embodiment, the magnetic memory 3 puts the magnetic domain having the magnetization direction which is the same as or opposite to the magnetization direction of the magnetic domain stored in the layer Ln, into the layer Ln of the magnetic memory line MML, on the basis of the value of the data to be written and the magnetization direction of the magnetic domain stored in the layer Ln (program operation). For example, if "0" is stored, the resistance of the magnetoresistive element 11 is not varied when two adjacent magnetic domains are read. In contrast, for example, if "1" is stored, the resistance of the magnetoresistive element 11 is varied when two adjacent magnetic domains of the magnetic memory line MML are read.

For this reason, the data "0" or "1" can be determined, based on whether the resistant state of the magnetoresistive element 11 is varied when two adjacent magnetic domains are read, i.e., based on whether a difference between a first sampling value corresponding to the resistant state of the magnetoresistive element 11 resulting from the magnetization direction of the first read magnetic domain and a second sampling value corresponding to the resistant state of the magnetoresistive element 11 resulting from the magnetization direction of the next read magnetic domain is larger than a threshold value or not.

Therefore, it does not need to be determined with high accuracy whether the resistance of the magnetoresistive element 11 is low resistance or high resistance when a certain magnetic domain is read, and a stable read operation can be executed.

Figure 6:
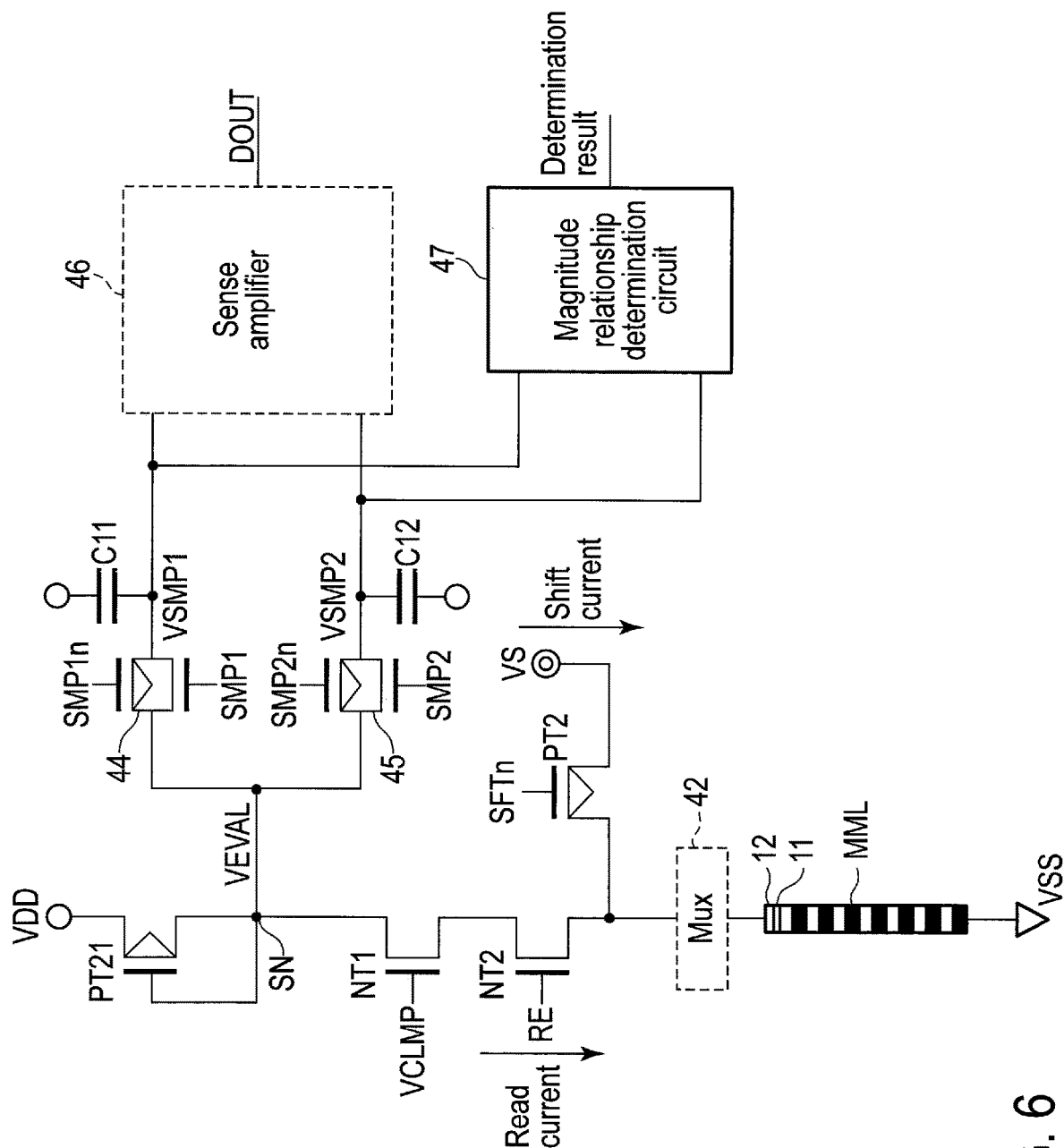
FIG. 6 is a circuit diagram illustrating a configuration example of a read control circuit in the magnetic memory.

FIG. 6 illustrates a configuration example of a read control circuit in the magnetic memory 3.

The read control circuit includes capacitors C11 and C12, a sense amplifier 46, a magnitude relationship determination circuit 47, path transistors 44 and 45, a multiplexer 42, pMOS transistors PT2 and PT21, and nMOS transistors NT1 and NT2.

Connection in the read control circuit illustrated in FIG. 6 will be explained in the following descriptions. A first input terminal of the sense amplifier 46 is connected to a first electrode of the capacitor C11 and a first terminal of the path transistor 44. A second input terminal of the sense amplifier 46 is connected to a first electrode of the capacitor C12 and a first terminal of the path transistor 45.

The pMOS transistor PT21 functions as a constant current circuit for making the read current constant. A source of the pMOS transistor PT21 is connected to a power supply terminal VDD, and a gate of the pMOS transistor PT21 is connected to a drain of the pMOS transistor PT21. A node (sense node: SN) between the gate and drain of the pMOS transistor PT21 is connected to a second terminal of each of the path transistors 44 and 45. The sense node SN is also connected to an input terminal of the multiplexer 42 via the nMOS transistors NT1 and NT2.

A clamp signal VCLMP is input to a gate of the nMOS transistor NT1. The nMOS transistor NT1 functions as a clamp circuit which prevents excessive current and voltage from being supplied to the selector element 12, the magnetoresistive element 11, and the magnetic memory line MML. A read enable signal RE is input to a gate of the nMOS transistor NT2. When the read enable signal RE transitions to an enable state, the nMOS transistor NT2 is turned on. The read current is thereby supplied to the selector element 12, the magnetoresistive element 11, and the magnetic memory line MML. As a result, the voltage value of the sense node SN is varied in accordance with the variation in the resistant state of the magnetoresistive element 11, and state signal VEVAL corresponding to the resistant state of the magnetoresistive element 11 is obtained.

Second electrodes of the capacitors C11 and C12 are connected to the power supply terminal VDD. Sample signals SMP1 and SMP1n are input to the two gates of the path transistor 44, respectively. Sample signals SMP2 and SMP2n are input to the two gates of the path transistor 45, respectively. The path transistor 44 is turned on at a first read operation. The voltage value of the state signal VEVAL is thereby stored as sampling voltage VSMP1 in the capacitor C11. The path transistor 45 is turned on in a next read operation. The voltage value of the state signal VEVAL is thereby stored as sampling voltage VSMP2 in the capacitor C12. The path transistor 44 is turned on in a further next read operation. The voltage value of the state signal VEVAL is thereby stored as sampling voltage VSMP1 in the capacitor C11.

The pMOS transistor PT2 is used to supply to the magnetic memory line MML a shift current (read shift current) that shifts the magnetic domain of each layer of the magnetic memory line MML in a direction from the other end side to one end side of the magnetic memory line MML (i.e., a direction from the layer L1 to the layer Ln). A shift voltage VS is supplied to a source of the pMOS transistor PT2, and a shift signal SFTn is input to a gate of the pMOS transistor PT2.

The multiplexer 42 changes the shift current which is to be supplied to the magnetic memory line MML between a read shift current and a write shift current. The write shift current is a shift current that shifts the magnetic domain of each layer of the magnetic memory line MML in a direction from one end side to the other end side of the magnetic memory line MML (i.e., a direction from the layer Ln to the layer L1). The write shift current is generated by the write circuit in the magnetic memory 3.

In the read operation, first, the shift current (read shift current) is supplied to the magnetic memory line MML, and the magnetic domain of each layer of the magnetic memory line MML is moved in a direction from the other end side to one end side of the magnetic memory line MML. As a result, the magnetic domain stored in the layer Ln of the magnetic memory line MML is read from the magnetic memory line MML, moved to the magnetic layer 11S, and the magnetic domain of each of the other layers of the magnetic memory line MML is also moved to an upper layer thereof. Then, the nMOS transistor NT1 is turned on, and the read current is supplied to the selector element 12, the magnetoresistive element 11, and the magnetic memory line MML. As a result, the state signal VEVAL corresponding to the resistant state of the magnetoresistive element 11 resulting from the magnetization direction of the magnetic domain moved to the magnetic layer 11S is obtained. The state signal VEVAL is stored as the sampling voltage VSMP1 (also referred to as first sampling value) in the capacitor C11.

In a next read operation, too, the shift current (read shift current) is supplied to the magnetic memory line MML, the magnetic domain of the layer Ln of the magnetic memory line MML is moved to the magnetic layer 11S, and the magnetic domain in each of the other layers of the magnetic memory line MML is moved to an upper layer thereof. As a result, the state signal VEVAL corresponding to the magnetic domain which has been originally present in the Ln-1 of the magnetic memory line MML is stored as sampling voltage VSMP2 (also referred to as second sampling value) in the capacitor C12.

The sense amplifier 46 compares the sampling voltage VSMP1 and the sampling voltage VSMP2 and, if a difference between VSMP1 and VSMP2 is smaller than or equal to a threshold value (offset voltage VOFST), outputs "0" as output data DOUT. In contrast, if the difference between VSMP1 and VSMP2 is larger than the threshold value (offset voltage VOFST), the sense amplifier 46 outputs "1" as the output data DOUT.

The magnitude relationship determination circuit 47 compares the sampling voltage VSMP1 and the sampling voltage VSMP2, and determines whether the relationship in size between VSMP1 and VSMP2 is VSMP1>VSMP2 or VSMP1<VSMP2. If the difference between VSMP1 and VSMP2 is larger than the threshold value (offset voltage VOFST), a determination result of the magnitude relationship determination circuit 47 can be used to specify the magnetization direction of each of two read magnetic domains.

Figure 7:
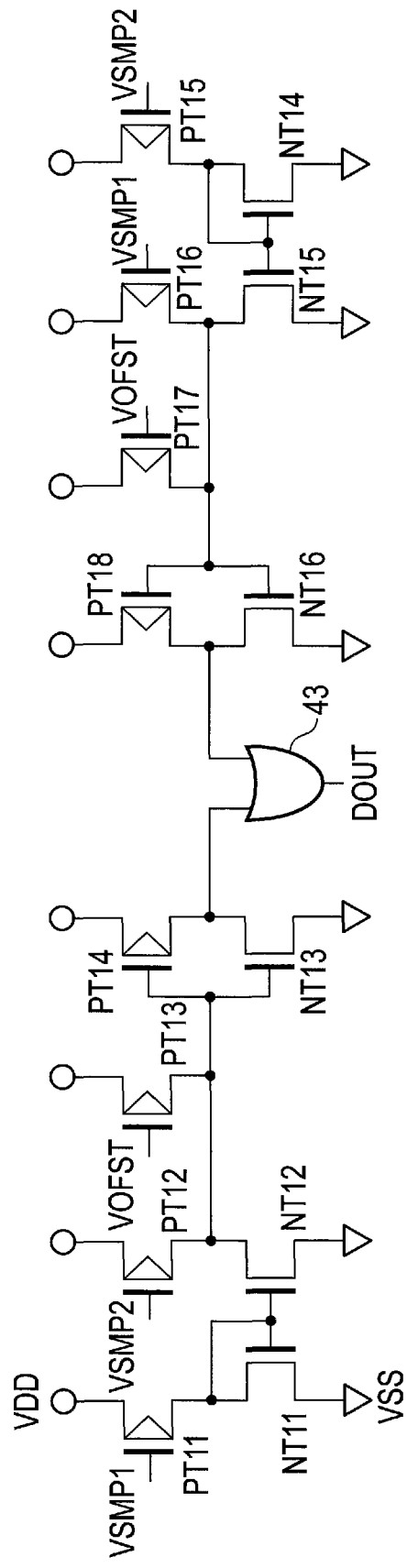
FIG. 7 is a circuit diagram illustrating a configuration example of a sense amplifier incorporated in the read control circuit in FIG. 6.

FIG. 7 illustrates a configuration example of the sense amplifier.

The sense amplifier 46 includes pMOS transistors PT11 to PT18, nMOS transistors NT11 to NT16, and an OR circuit 43.

A power supply voltage VDD is supplied to a source of the pMOS transistor PT11. A drain of the pMOS transistor PT11 is connected to a drain and a gate of the nMOS transistor NT11. A source of the nMOS transistor NT11 is connected to a reference voltage terminal VSS.

The power supply voltage VDD is supplied to sources of the pMOS transistors PT12 and PT13. A drain of the pMOS transistor PT12 is connected to a drain of the nMOS transistor NT12, a drain of the pMOS transistor PT13, and gates of the pMOS transistor PT14 and the nMOS transistor NT13. A source of the nMOS transistor NT12 is connected to the reference voltage terminal VSS.

The power supply voltage VDD is supplied to a source of the pMOS transistor PT14. A drain of the pMOS transistor PT14 is connected to a drain of the nMOS transistor NT13 and a first input terminal of the OR circuit 43. A source of the nMOS transistor NT13 is connected to the reference voltage terminal VSS.

The power supply voltage VDD is supplied to a source of the pMOS transistor PT15. A drain of the pMOS transistor PT15 is connected to a drain and a gate of the nMOS transistor NT14. A source of the nMOS transistor NT14 is connected to the reference voltage terminal VSS.

The power supply voltage VDD is supplied to sources of the pMOS transistors PT16 and PT17. A drain of the pMOS transistor PT16 is connected to a drain of the nMOS transistor NT15, a drain of the pMOS transistor PT17, and gates of the pMOS transistor PT18 and the nMOS transistor NT16. A source of the nMOS transistor NT15 is connected to the reference voltage terminal VSS.

The power supply voltage VDD is supplied to a source of the pMOS transistor PT18. A drain of the pMOS transistor PT18 is connected to a drain of the nMOS transistor NT16 and a second input terminal of the OR circuit 43. A source of the nMOS transistor NT16 is connected to the reference voltage terminal VSS.

Gates of the pMOS transistors PT11 and PT16 correspond to the first input terminal of the sense amplifier 46. A voltage VSMP1 is input to the gates of the pMOS transistors PT11 and PT16. Gates of the pMOS. transistors PT12 and PT15 correspond to the second input terminal of the sense amplifier 46. A voltage VSMP2 is input to the gates of the pMOS transistors PT12 and PT15. The offset voltage VOFST is input to the gates of the pMOS transistors PT13 and PT17. Furthermore, output data DOUT is output from the output terminal of the OR circuit 43.

The pMOS transistors PT13 and PT17 to which the offset voltage VOFST is input are provided to correct errors which occur when comparing the state signals due to temperature properties of the elements, manufacturing tolerance, and the like. More specifically, the sense amplifier 46 outputs, for example, "L" (=data "0") if a difference between the voltage VSMP1 and the voltage VSMP2 is smaller than or equal to a threshold voltage and outputs, for example, "H" (=data "1") if the difference between the voltage VSMP1 and the voltage VSMP2 is larger than the threshold voltage. The threshold voltage at this time is set as the offset voltage VOFST.

Figure 8:
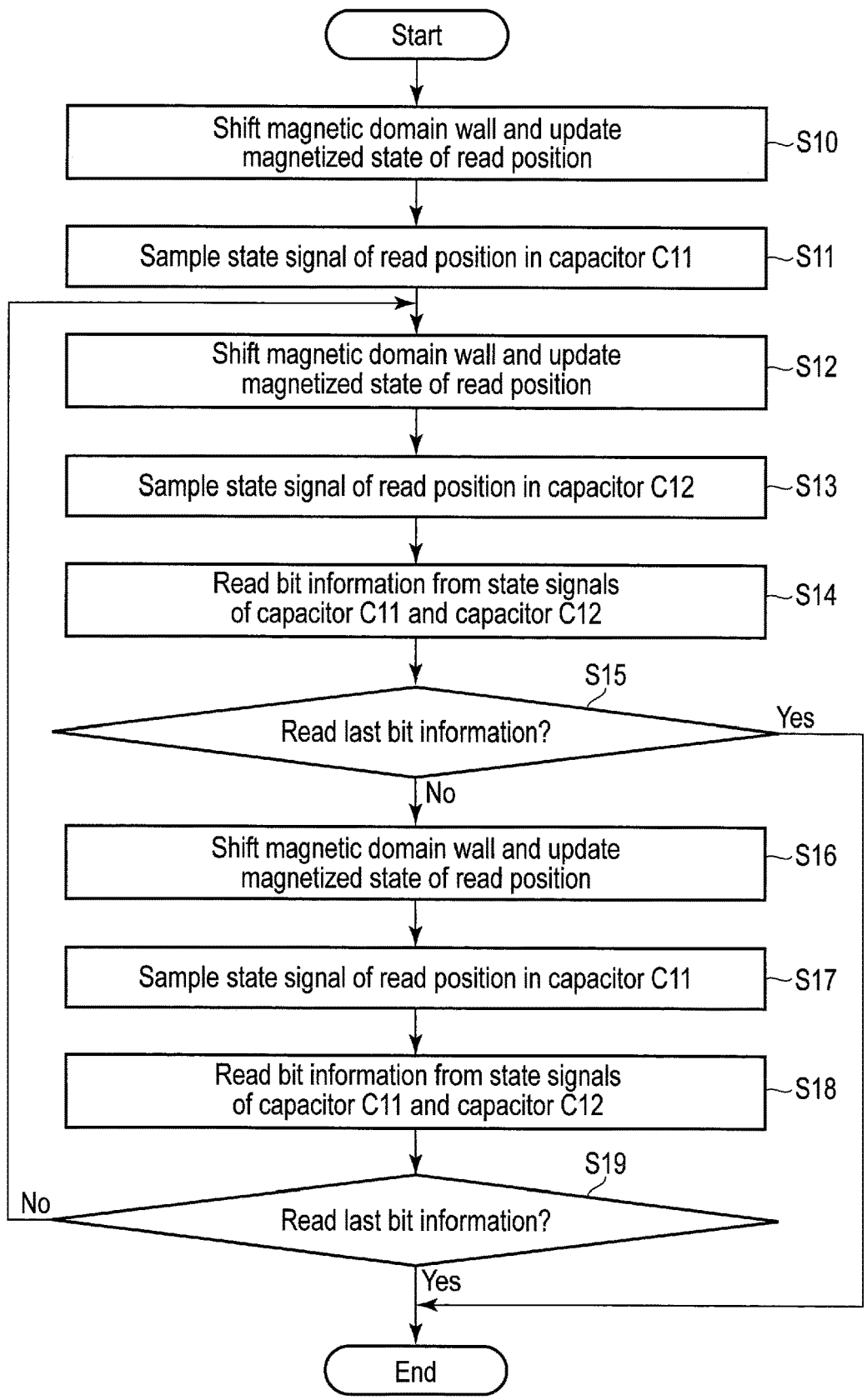
FIG. 8 is a flowchart illustrating a procedure of a read operation executed in the magnetic memory.

A flowchart of FIG. 8 illustrates a procedure of the read operation executed in the magnetic memory 3.

In step S10, the read shift current to shift each magnetic domain (magnetic domain wall) of the magnetic memory line MML is made to flow to the selector element 12, the magnetoresistive element 11, and the magnetic memory line MML, and the magnetic domain of each layer of the magnetic memory line MML is shifted by one layer in the direction from the other end side to one end side of the magnetic memory line MML. Thus, the magnetic domain M1 stored in the layer Ln is read and moved to the read position (magnetic layers 11S and 11S'), and the magnetized state of the read position (magnetic layers 11S and 11S') is updated. At the same time, the magnetic domain of each of the other layers is also moved to an upper layer thereof.

The state signal VEVAL corresponding to the resistance of the magnetoresistive element 11 which results from the magnetization direction of the magnetic domain M1 is sampled by the capacitor C11 (step S11).

Next, the read shift current is made to flow again to the magnetoresistive element 11 and the magnetic memory line MML, and the magnetic domain of each layer of the magnetic memory line MML is shifted by one layer in the direction from the other end side to one end side of the magnetic memory line MML. Thus, the magnetic domain M2 currently existing in the layer Ln is read and moved to the read position (magnetic layers 11S and 11S'), and the magnetized state of the read position (magnetic layers 11S and 11S') is updated (step S12). At the same time, the magnetic domain of each of the other layers is also moved to an upper layer thereof.

The state signal VEVAL corresponding to the resistance of the magnetoresistive element 11 which results from the magnetization direction of the magnetic domain M2 is sampled by the capacitor C12 (step S13).

Next, the state signal (i.e., state signal of previous magnetic domain M1) stored in the capacitor C11 and the state signal (i.e., state signal of current magnetic domain M2) stored in the capacitor C12 are compared, and the data (bit information) "0" or "1" is read based on whether the difference between the state signals is larger than a threshold value or not (step S14).

Next, it is determined whether the last bit information is read or not (step S15). If the last bit information is not read (No in step S15), the processing proceeds to step S16. In contrast, if the last bit information is already read (Yes in step S15), the read operation is finished.

In step S16, the read shift current is made to flow again to the magnetoresistive element 11 and the magnetic memory line MML, and the magnetic domain of each layer of the magnetic memory line MML is shifted by one layer in the direction from the other end side to one end side of the magnetic memory line MML. Thus, the magnetic domain M3 currently existing in the layer Ln is read and moved to the read position (magnetic layers 11S and 11S'), and the magnetized state of the read position (magnetic layers 11S and 11S') is updated. At the same time, the magnetic domain of each of the other layers is also moved to an upper layer thereof.

The state signal VEVAL corresponding to the resistance of the magnetoresistive element 11 which results from the magnetization direction of the magnetic domain M3 is sampled by the capacitor C11 (step S17).

Next, the state signal (i.e., state signal of previous magnetic domain M2) stored in the capacitor C12 and the state signal (i.e., state signal of current magnetic domain M3) stored in the capacitor C11 are compared, and the data (bit information) "0" or "1" is read based on whether the difference between the state signals is larger than the threshold value or not (step S18).

Next, it is determined whether the last bit information is read or not (step S19). If the last bit information is not read (No in step S19), the processing returns to step S12 and the operations following step S12 are repeated. In contrast, if the last bit information is already read (Yes in step S19), the read operation is finished.

FIG. 9 illustrates a configuration example of the circuit related to the write operation.

In FIG. 9, a shift control circuit 50 is arranged on one end side of the magnetic memory line MML. The shift control circuit 50 is arranged on a side opposite to the magnetic memory line MML with the nMOS transistor NT13, the multiplexer 42, and the field line FL interposed therebetween.

The nMOS transistor NT13 is used to supply to the magnetic memory line MML a shift current (write shift current) that shifts the magnetic domain of each layer of the magnetic memory line MML in a direction from the layer Ln to the layer L1. A gate of the nMOS transistor NT13 is electrically connected to the shift control circuit 50. The shift control circuit 50 generates a shift signal SFT and supplies the shift signal SFT to the gate of the nMOS transistor NT13. When the active-level shift signal SFT is supplied to the gate of the nMOS transistor NT13, the nMOS transistor NT13 is turned on. Thus, the nMOS transistor NT13 can make the write shift current flow to the magnetic memory line MML.

The multiplexer 42 can select and electrically connect the shift circuit for write (nMOS transistor NT13) or the shift circuit for read (pMOS transistor PT2 in FIG. 6) to the magnetic memory line MML. In the write operation, the multiplexer 42 can select the shift circuit for write (nMOS transistor NT13) and electrically connect the shift circuit for write (nMOS transistor NT13) to the magnetic memory line MML.

The field line FL passes near the one end of the magnetic memory line MML. More specifically, the field line FL passes near the one end of the magnetic memory line MML, at a position eccentric from a center axis of the magnetic memory line MML. Therefore, when a current (write current) flows to the field line FL in a desired direction, the vicinity of the one end of the magnetic memory line MML can be magnetized in a desired magnetization direction.

An FL driver 60 comprises two inverters INVa and INVb. The inverters INVa and INVb are arranged on both ends of the field line FL.

The inverter INVa comprises the nMOS transistor NT11 and the pMOS transistor PT11. The nMOS transistor NT11 and the pMOS transistor PT11 are connected between a ground potential and a write reference potential Vw. The write reference potential Vw is a potential higher than the ground potential and a potential different from a shift reference potential VS. The drain of the nMOS transistor NT11 and the drain of the pMOS transistor PT11 are commonly connected to an end FLa of the field line FL. The gate of the nMOS transistor NT11 and the gate of the pMOS transistor PT11 are commonly connected to a write control circuit 80.

The inverter INVa can turn off the nMOS transistor NT11 and turn on the pMOS transistor PT11 to pull up the potential of the end FLa of the field line FL to the write reference potential Vw side when receiving an active-level control signal WTAn. The control signal WTAn can be a low-active control signal (n is indicative of low-active). At this time, a control signal WTBn is inactive-level (H level) and the inverter INVb pulls down the potential of the other end FLb of the field line FL to the ground potential. The current can be thereby made to flow to the field line FL, in a direction from the end FLa of the field line FL to the other end FLb of the field line FL.

The inverter INVb comprises the nMOS transistor NT12 and the pMOS transistor PT12. The nMOS transistor NT12 and the pMOS transistor PT12 are connected between the ground potential and the write reference potential Vw. The drain of the nMOS transistor NT12 and the drain of the pMOS transistor PT12 are commonly connected to the other end FLb of the field line FL. The gate of the nMOS transistor NT12 and the gate of the pMOS transistor PT12 are commonly connected to the write control circuit 80. The inverter INVb can turn off the nMOS transistor NT12 and turn on the pMOS transistor PT12 to pull up the potential of the other end FLb of the field line FL to the write reference potential Vw side when receiving an active-level control signal WTBn. The control signal WTBn can be a low-active control signal (n is indicative of low-active). At this time, a control signal WTAn is inactive-level (H level) and the inverter INVa pulls down the potential of the end FLa of the field line FL to the ground potential. The current can be thereby made to flow in a direction from the other end FLb to the end FLa with respect to the field line FL.

A flowchart of FIG. 10 illustrates a procedure of the write operation executed in the magnetic memory 3.

When the magnetic memory 3 selects a write target block, the magnetic memory 3 determines whether the current data write to the selected block is the first data write (first write of the magnetic domain to each magnetic memory line MML in the selected block) or not (step S1). If the current data write is the first data write (Yes in step S1), the magnetic memory 3 executes preparation for writing data (Pre Write). In Pre Write, the magnetic memory 3 sets the control signal WTAn or the control signal WTBn to the active level, makes the current flow to the field line FL, and thereby writes a magnetic domain having a predetermined magnetization direction as the initial magnetic domain to the write position (magnetic layers 11S and 11S') of the magnetic memory line MML (step S2). The magnetic memory 3 makes the shift current (write shift current) flow to the magnetic memory line MML (step S3). The initial magnetic domain at the write position of the magnetic memory line MML is thereby shifted (moved) downwardly by one layer, and the initial magnetic domain is put into the layer Ln of the magnetic memory line MML. Then, the magnetic memory 3 determines the value of data to be written to the magnetic memory line MML (step S4).

If the value of the data to be written is "1" ("1" in step S4), the magnetic memory 3 changes the direction of the current flowing to the field line FL to allow the magnetic domain having a magnetization direction which is opposite to the magnetization direction of the initial magnetic domain to be put into the magnetic memory line MML (step S5).

If the value of the data to be written is "0" ("0" in step S4), the magnetic memory 3 does not change the direction of the current flowing to the field line FL to allow the magnetic domain having a magnetization direction which is the same as the magnetization direction of the initial magnetic domain to be put into the magnetic memory line MML.

Then, the magnetic memory 3 makes the shift current flow to the magnetic memory line MML (step S3). The magnetic domain at the write position of the magnetic memory line MML is thereby shifted (moved) downwardly by one layer, and the magnetic domain is put into the layer Ln of the magnetic memory line MML. The initial magnetic domain in the layer Ln is moved to the layer Ln-1.

If all the data to be written are written to the magnetic memory line MML (Yes in step S8), the magnetic memory 3 finishes the processing.

Figure 11:
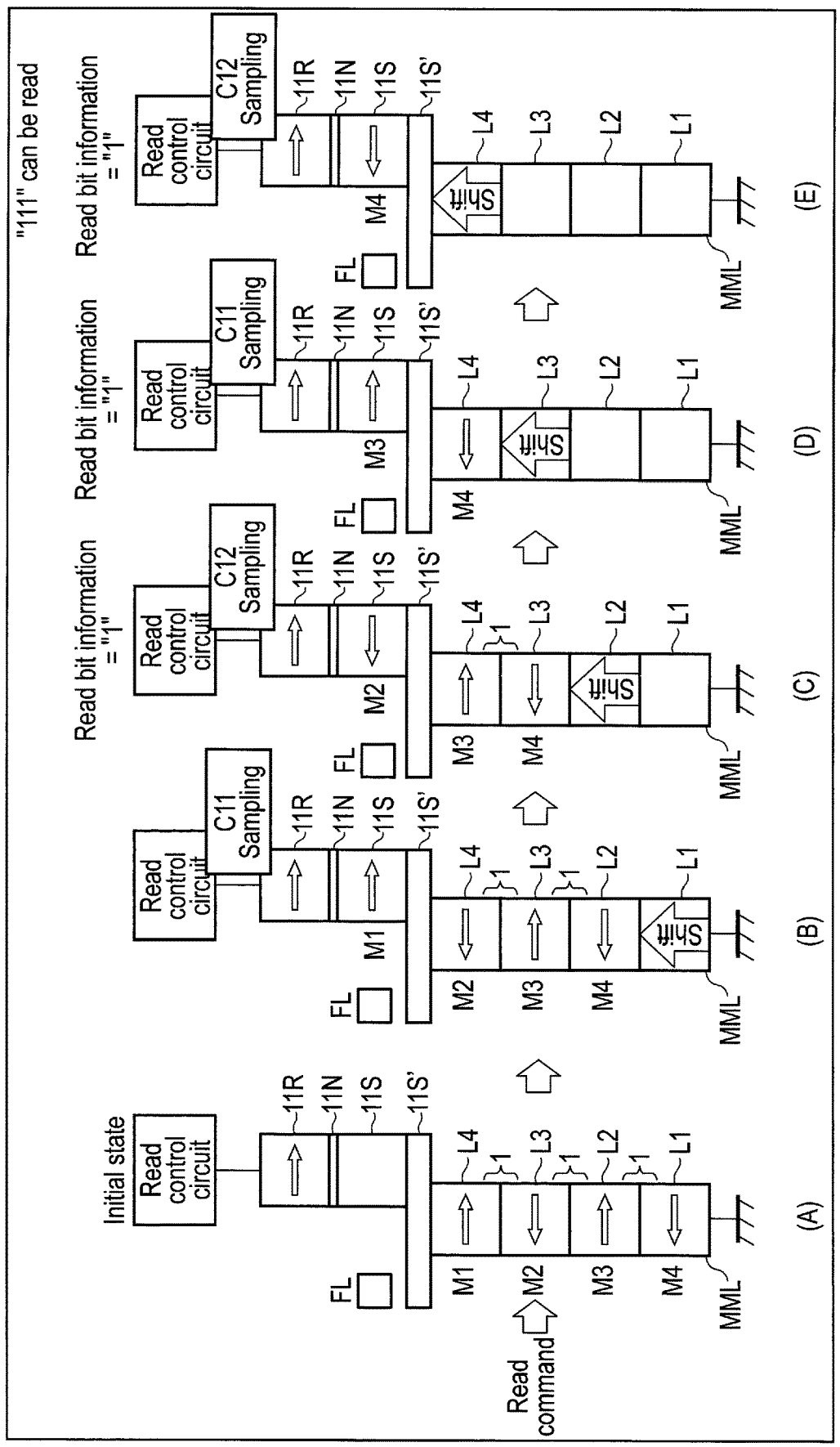
FIG. 11 is a diagram illustrating the read operation executed in the magnetic memory.

FIG. 11 illustrates the read operation executed in the magnetic memory 3.

To simplify the illustration, it is assumed that the total number of layers included in the magnetic memory line MML is 4 and that 3-bit data are stored in the magnetic memory line MML. In addition, in FIG. 11, the magnetization direction of each magnetic domain is represented by a right arrow "→" or a left arrow "←". Furthermore, in FIG. 11, the magnetic layer (reference layer) 11R of the magnetoresistive element 11 is assumed to hold the magnetization having a fixed magnetization direction represented by a right arrow "→".

(A) of FIG. 11 illustrates the magnetic memory line MML storing 3-bit data ("111" in this case). A layer L1 of the magnetic memory line MML holds an initial magnetic domain M4 programmed by Pre write. A layer L2 of the magnetic memory line MML holds the magnetic domain M3. The magnetic domain M3 has a magnetization direction which is opposite to a magnetization direction of the initial magnetic domain M4. A set of the magnetic domain M3 and the initial magnetic domain M4 corresponds to bit information "1".

A layer L3 of the magnetic memory line MML holds the magnetic domain M2. The magnetic domain M2 has a magnetization direction which is opposite to a magnetization direction of the magnetic domain M3. A set of the magnetic domain M2 and the magnetic domain M3 corresponds to bit information "1".

An uppermost layer L4 of the magnetic memory line MML holds the magnetic domain M1. The magnetic domain M1 has a magnetization direction which is opposite to a magnetization direction of the magnetic domain M2. A set of the magnetic domain M1 and the magnetic domain M2 corresponds to bit information "1".

The magnetic memory 3 first executes the shift operation of moving the magnetic domain of each layer of the magnetic memory line MML by one layer in a direction (upward direction) from the other end side to the one end side of the magnetic memory line MML as illustrated in (B) of FIG. 11. The magnetic domain M1 is thereby pushed out of the magnetic memory line MML. That is, the magnetic domain M1 read from the layer L4 of the magnetic memory line MML and moved to the read position (magnetic layers 11S and 11S'). In addition, the magnetic domain M2, the magnetic domain M3, and the magnetic domain M4 are moved to the layer L4, the layer L3, and the layer L2, respectively. When the magnetic domain M1 is moved to the read position (magnetic layers 11S and 11S'), the state signal VEVAL corresponding to the resistant state (low resistance in this case) of the magnetoresistive element 11 resulting from the magnetic domain M1 is stored as the voltage VSMP1 in the capacitor C11 (C11 sampling).

As illustrated in (C) of FIG. 11, the magnetic memory 3 executes the shift operation of upwardly moving the magnetic domain of each layer of the magnetic memory line MML by one layer. The magnetic domain M2 is thereby read from the magnetic memory line MML and moved to the read position (magnetic layers 11S and 11S'). In addition, the magnetic domain M3 and the magnetic domain M4 are moved to the layer L4 and the layer L3, respectively. When the magnetic domain M2 is moved to the read position (magnetic layers 11S and 11S'), the state signal VEVAL corresponding to the resistant state (high resistance in this case) of the magnetoresistive element 11 resulting from the magnetic domain M2 is stored as the voltage VSMP2 in the capacitor C12 (C12 sampling). Since the resistant state of the magnetoresistive element 11 is changed (from a low resistance state to a high resistance state in this case), the difference between the voltage VSMP1 and the voltage VSMP2 becomes larger than the threshold voltage. As a result, output data DOUT of the sense amplifier 46 becomes "1", and bit information "1" corresponding to the set of the magnetic domain M1 and the magnetic domain M2 is read.

As illustrated in (D) of FIG. 11, the magnetic memory 3 executes the shift operation of upwardly moving the magnetic domain of each layer of the magnetic memory line MML by one layer. The magnetic domain M3 is thereby read from the magnetic memory line MML and moved to the read position (magnetic layers 11S and 11S'). In addition, the magnetic domain M4 is also moved to the layer L4. When the magnetic domain M3 is moved to the read position (magnetic layers 11S and 11S'), the state signal VEVAL corresponding to the resistant state (low resistance in this case) of the magnetoresistive element 11 resulting from the magnetic domain M3 is stored as the voltage VSMP1 in the capacitor C11 (C11 sampling). Since the resistant state of the magnetoresistive element 11 is changed (from a high resistance state to a low resistance state in this case), the difference between the voltage VSMP1 and the voltage VSMP2 becomes larger than the threshold voltage. As a result, output data DOUT of the sense amplifier 46 becomes "1", and bit information "1" corresponding to the set of the magnetic domain M2 and the magnetic domain M3 is read.

As illustrated in (E) of FIG. 11, the magnetic memory 3 executes the shift operation of upwardly moving the magnetic domain of each layer of the magnetic memory line MML by one layer. The magnetic domain M4 is thereby read from the magnetic memory line MML and moved to the read position (magnetic layers 11S and 11S'). When the magnetic domain M1 is moved to the read position (magnetic layers 11S and 11S'), the state signal VEVAL corresponding to the resistant state (high resistance in this case) of the magnetoresistive element 11 resulting from the magnetic domain M4 is stored as the voltage VSMP2 in the capacitor C12 (C12 sampling). Since the resistant state of the magnetoresistive element 11 is changed (from a low resistance state to a high resistance state in this case), the difference between the voltage VSMP1 and the voltage VSMP2 becomes larger than the threshold voltage. As a result, output data DOUT of the sense amplifier 46 becomes "1", and bit information "1" corresponding to the set of the magnetic domain M3 and the magnetic domain M4 is read.

Figure 12:
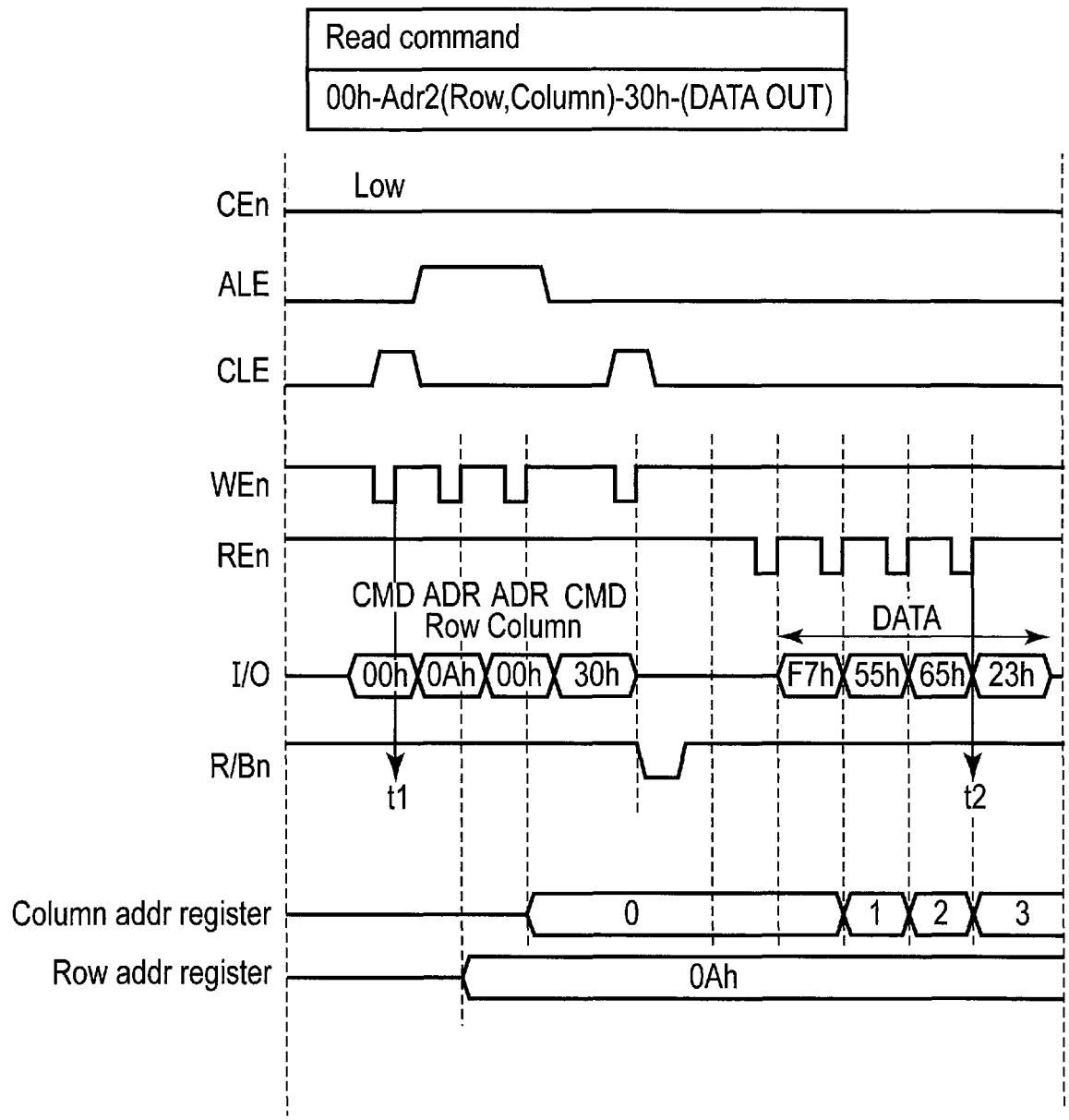
FIG. 12 is a timing chart illustrating a sequence of the read operation.

A timing chart of FIG. 12 illustrates a sequence of the read operation.

Communication signals between the memory controller 2 and the magnetic memory 3 include chip enable signal CEn, address latch enable signal ALE, command latch enable signal CLE, write enable signal WEn, read enable signal REn, I/O signal <7:0>, and ready/busy signal R/Bn. In this example, "n" at the end of each signal name indicates that the signal is a low-active signal.

The memory controller 2 transmits a read command sequence to the magnetic memory 3. The read command sequence is used to read data for one layer from one of the blocks in the magnetic memory 3. The read command sequence includes read command "00h", row address, column address, and read command "30h"

That is, the memory controller 2 issues the read command "00h" and asserts the command latch enable signal CLE. Subsequently, the memory controller 2 issues addresses (row address and column address) in, for example, two cycles and asserts the address latch enable signal ALE. The row address designates one source line SL corresponding to a block from which data is to be read. The column address designates, for example, one of a plurality of columns. One column corresponds to, for example, eight bit lines BL. After that, the memory controller 2 issues the read command "30h" and asserts the command latch enable signal CLE.

The magnetic memory 3 includes a row address register and a column address register. The row address received from the memory controller 2 is held in the row address register. In addition, the column address received from the memory controller 2 is held in the column address register. The value of the column address held in the column address register is automatically incremented in accordance with the data read operation.

When receiving the read command "30h", the magnetic memory 3 starts the operation of reading the data from the block corresponding to the source line SL designated by the row address and becomes a busy state. In the magnetic memory 3, the data of the size corresponding to one layer is read from the block and the read data is held in the latch circuit XDL in the magnetic memory 3. In FIG. 12, the data size corresponding to one layer is set to 4 bytes to simplify the illustration.

After that, when the magnetic memory 3 becomes a ready state, the memory controller 2 repeats asserting the read enable signal REn. Every time the read enable signal REn is asserted, the data in the data latch circuit XDL are transmitted to the memory controller 2 in a unit of a 1-byte.

Figure 13:
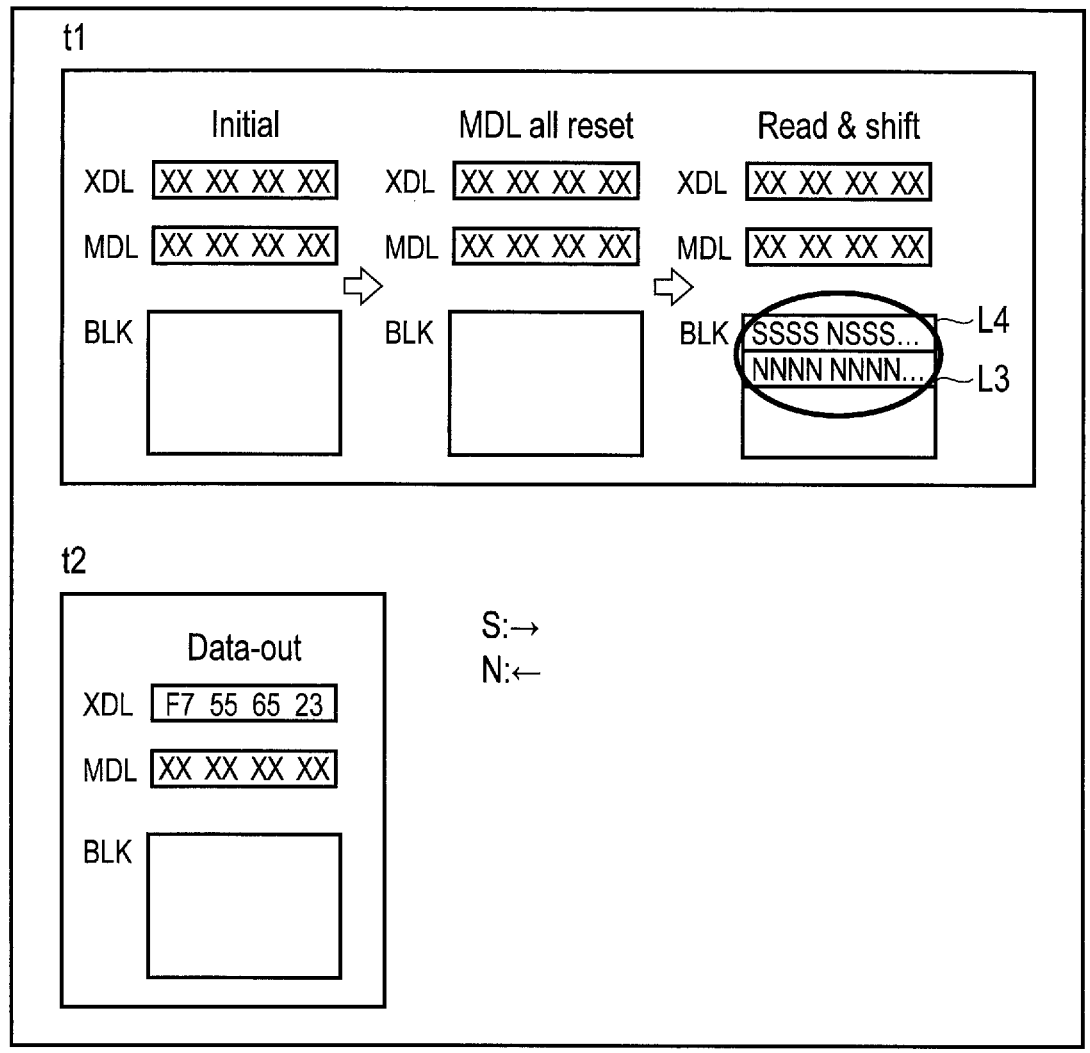
FIG. 13 is a diagram illustrating variation of data in the magnetic memory in the read operation illustrated in the timing chart of FIG. 12.

FIG. 13 illustrates variation of the data in the magnetic memory 3 in the read operation illustrated in the timing chart of FIG. 12.

The magnetic memory 3 includes the latch circuit XDL and a latch circuit MDL. The latch circuit XDL is used for communication with the memory controller 2. In the read operation, the data read from the block BLK is stored in the latch circuit XDL. In the write operation, the data (write data) received from the memory controller 2 is stored in the latch circuit XDL. The latch circuit XDL is shared by all of the blocks in the magnetic memory 3.

The latch circuit MDL stores the magnetic data indicative of the direction of the current flowing to the field line FL, i.e., the magnetic data indicative of a magnetization direction of a magnetic domain which is to be written to the magnetic memory line MML. The magnetic data is also referred to as mdata. The latch circuit MDL is also shared by the blocks in the magnetic memory 3.

In addition, in FIG. 13, symbol "N" is indicative of a magnetic domain having the magnetization direction corresponding to the left arrow in FIG. 11, and symbol "S" is indicative of a magnetic domain having the magnetization direction corresponding to the right arrow in FIG. 11.

At timing t1 of the timing chart of FIG. 12, the content of XDL is indefinite and the content of MDL is also indefinite. For example, the contents of XDL and MDL are reset in accordance with reception of the read command "30h". When the read command "30h" is received, the operation (read & shift) of reading the data from the block BLK is executed. In FIG. 13, the total number of layers of the block BLK is assumed to be 4. In addition, the read command sequence of FIG. 12 is assumed to be received in a state in which the data for four layers are stored in the block BLK. In this case, the magnetic domains of the layer L4 are first read and then the magnetic domains of the layer L3 are read.

In this example, the magnetic domains "NNNN NNNN . . . " corresponding to the write data for one layer from the controller 2 are stored in the layer L3.

The magnetic domains "SSSS NSSS . . . " stored in the layer L4 corresponds to the write data for subsequent one layer from the controller 2. In this write data, each magnetic domain corresponding to a bit position of "1" has reverse polarity (S) of a magnetic domain (N) at the corresponding bit position of the layer L3, and each magnetic domain corresponding to the bit position of "0" has the polarity (N) which is the same as the magnetic domain (N) at the corresponding bit position of the layer L3.

When the read command "30h" is received, the magnetic memory 3 executes the shift operation of upwardly moving the magnetic domain of each of the magnetic memory lines MMLs constituting the block BLK by one layer, at two times. In each of the magnetic memory lines MMLs, each magnetic domain is moved upwardly by two layers, and the magnetic domains for two layers "SSSS NSSS . . . " and "NNNN NNNN . . . " are read from the block BLK. The magnetic memory 3 generates the output data for one layer (4-byte data in this example) by comparing two voltages VSMP1 and VSMP2 corresponding to each bit line BL, and the magnetic memory 3 stores the output data in XDL. For example, when upper 1 byte of the output data is focused, upper 1 byte of the output data is "1111 01111" (=F7h) since the magnetic domains for upper 1 byte of the layer L4 are "SSSS NSSS" and the magnetic domains for upper 1 byte of the layer L3 are "NNNN NNNN".

Figure 14:
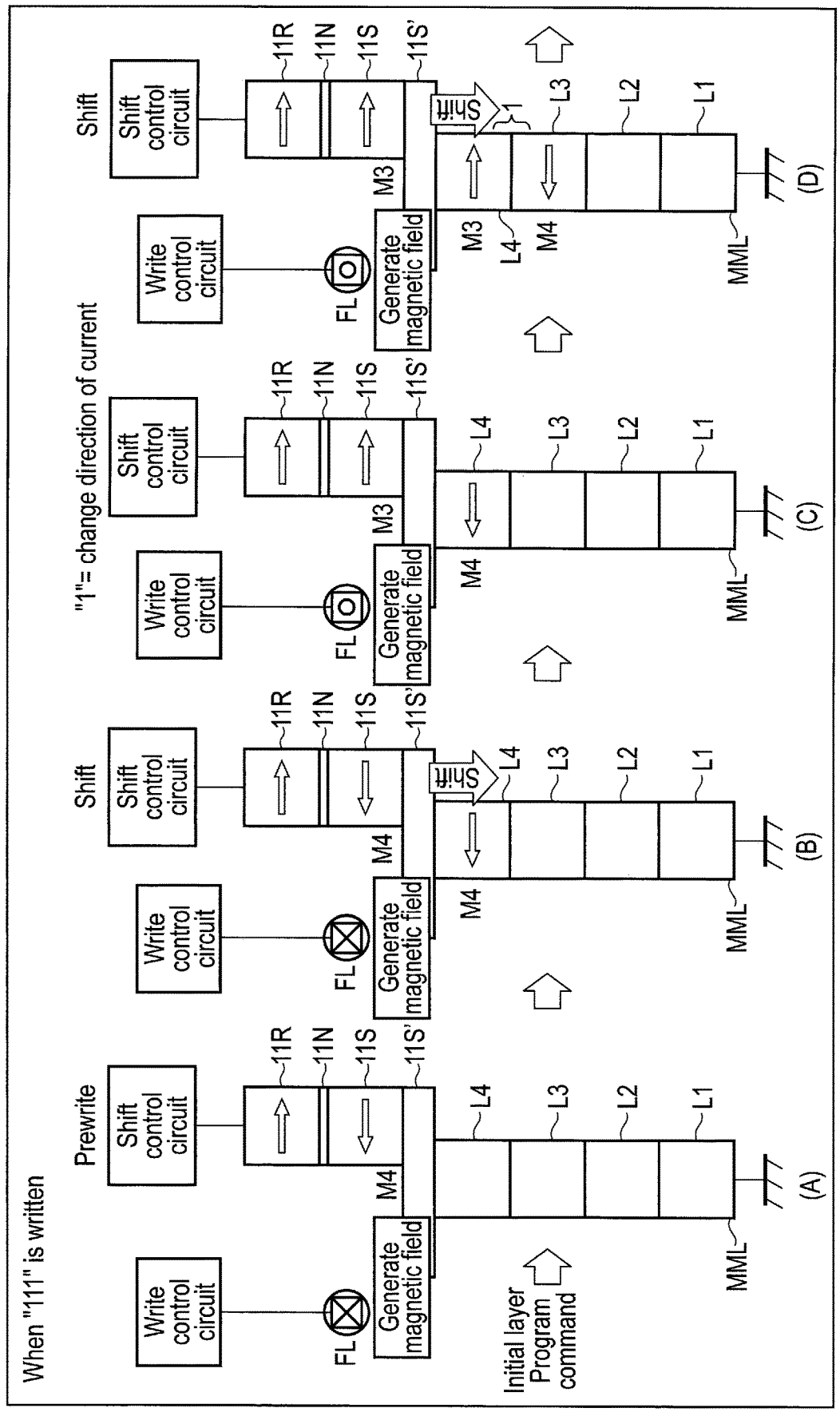
FIG. 14 is a diagram illustrating a part of the write operation executed in the magnetic memory.

FIG. 14 illustrates a part of the write operation executed in the magnetic memory 3. It is assumed that the number of total layers included in each magnetic memory line MML is 4 and that 3-bit data ("111" in this example) are written to each magnetic memory line MML.

In the embodiment, three types of program commands, i.e., initial layer program command, middle layer program command, and last layer program command are used. The initial layer program command is used to write data for the first one layer to the block. The middle layer program command is used to write the data for one layer to any one of middle layers other than the first layer and the last layer of the block. The last layer program command is used to write the data for one layer to the last layer to the block.

When receiving the initial layer program command, the magnetic memory 3 writes to the block the magnetic domains for total two layers including the initial magnetic domains for one layer and the magnetic domains for one layer corresponding to the write data for one layer ((A) to (D) in FIG. 14).

As illustrated in (A) of FIG. 14, the magnetic memory 3 first makes the current flow to the field line FL in a direction from the front side to the depth side of the drawing, and causes the field line FL to generate an induced magnetic field for forming the magnetic domain having the magnetization direction "←". The magnetic domain M4 having the magnetization direction "←" is formed at the write position (magnetic layers 11S and 11S').

As illustrated in (B) of FIG. 14, the magnetic memory 3 executes the shift operation of downwardly moving the magnetic domain of each layer of the magnetic memory line MML and thereby puts the initial magnetic domain M4 into the layer L4 of the magnetic memory line MML.

Next, as illustrated in (C) of FIG. 14, the magnetic memory 3 changes the direction of the current flowing to the field line FL since the write data associated with the initial layer program command is "1". That is, the magnetic memory 3 makes the current flow to the field line FL in a direction from the depth side to the front side of the drawing, and causes the field line FL to generate an induced magnetic field for forming the magnetic domain having the magnetization direction "→". The magnetic domain M3 having the magnetization direction "→" is thereby formed at the write position (magnetic layers 11S and 11S').

As illustrated in (D) of FIG. 14, the magnetic memory 3 executes the shift operation of downwardly moving the magnetic domain of each layer of the magnetic memory line MML and thereby puts the magnetic domain M3 into the layer L4 of the magnetic memory line MML. At this time, the initial magnetic domain M4 is moved to the layer L3. A set of the magnetic domain M3 and the magnetic domain M4 corresponds to bit information "1".

FIG. 15 illustrates a continuing part of the write operation executed in the magnetic memory 3.

When receiving the middle layer program command, the magnetic memory 3 writes to this block the magnetic domain for one layer corresponding to the write data associated with the middle layer program command ((E) and (F) in FIG. 15).

As illustrated in (E) of FIG. 15, the magnetic memory 3 changes the direction of the current flowing to the field line FL since the write data associated with the middle layer program command is "1". That is, the magnetic memory 3 makes the current flow to the field line FL in a direction from the front side to the depth side of the drawing, and causes the field line FL to generate an induced magnetic field for forming the magnetic domain having the magnetization direction "←". The magnetic domain M2 having the magnetization direction "←" is formed at the write position (magnetic layers 11S and 11S').

As illustrated in (F) of FIG. 15, the magnetic memory 3 executes the shift operation of downwardly moving the magnetic domain of each layer of the magnetic memory line MML and thereby puts the magnetic domain M2 into the layer L4 of the magnetic memory line MML. At this time, the initial magnetic domain M4 is moved to the layer L2, and the magnetic domain M3 is moved to the layer L3. A set of the magnetic domain M2 and the magnetic domain M3 corresponds to bit information "1".

When receiving the last layer program command, the magnetic memory 3 writes to this block the magnetic domain for one layer corresponding to the write data associated with the last layer program command ((G) and (H) in FIG. 15).

As illustrated in (G) of FIG. 15, the magnetic memory 3 changes the direction of the current flowing to the field line FL since the write data associated with the last layer program command is "1". That is, the magnetic memory 3 makes the current flow to the field line FL in a direction from the depth side to the front side of the drawing, and causes the field line FL to generate an induced magnetic field for forming the magnetic domain having the magnetization direction "→". The magnetic domain M1 having the magnetization direction "→" is thereby formed at the write position (magnetic layers 11S and 11S').

As illustrated in (H) of FIG. 15, the magnetic memory 3 executes the shift operation of downwardly moving the magnetic domain of each layer of the magnetic memory line MML and thereby puts the magnetic domain M1 into the layer L4 of the magnetic memory line MML. At this time, the initial magnetic domain M4 is moved to the layer L1, the magnetic domain M3 is moved to the layer L2, and the magnetic domain M2 is moved to the layer L3. A set of the magnetic domain M1 and the magnetic domain M2 corresponds to bit information "1".

FIG. 16 illustrates three types of program commands issued to the magnetic memory 3 by the memory controller 2.

The command sequence of the initial layer program command includes program command "80h", row address, column address, data (data for one layer, for example, 64 bytes), and program command "01h".

The command sequence of the middle layer program command includes program command "81h", column address, data (data for one layer, for example, 64 bytes), and program command "01h".

The command sequence of the last layer program command includes program command "81h", column address, data (data for one layer, for example, 64 bytes), and program command "00h".

The program command "01h" used in each of the initial layer program command and the middle layer program command indicates that the content of the MDL should be maintained after completion of the write operation of the write data for one layer corresponding to the initial layer program command or the middle layer program command, in order to write to subsequent layer of this block. In contrast, the program command "00h" used in the last layer program command indicates that the content of the MDL can be released (changed) after completion of the write operation of the write data for one layer corresponding to the last layer program command.

Each of the middle layer program command and the last layer program command may designate not only the column address, but the row address.

A flowchart of FIG. 17 illustrates a procedure of the write operation executed in a unit of a block.

In order to write the data of the size corresponding to the block size to a certain block, the memory controller 2 executes the following processing.

First, the memory controller 2 issues the initial layer program command including the row address designating the source lines SL corresponding to this block, to the magnetic memory 3 (step S21). The magnetic memory 3 executes a write operation corresponding to the initial layer program command (also referred to as an initial layer program operation). When the magnetic memory 3 completes the initial layer program operation, the memory controller 2 issues the middle layer program command to the magnetic memory 3 (step S22). The magnetic memory 3 executes a write operation corresponding to the middle layer program command (also referred to as a middle layer program operation). When the magnetic memory 3 completes the middle layer program operation, the memory controller 2 determines whether an unwritten layer of this block is only one layer or not (step S23).

If two or more unwritten layers exist (NO in step S23), the memory controller 2 issues a next middle layer program command to the magnetic memory 3.

Thus, the memory controller 2 repeats issuing the middle layer program command to the magnetic memory 3 until the unwritten layers of this block are reduced to one layer (NO in step S23, step S22).

If the unwritten layers of this block are reduced to one layer (YES in step S23), the memory controller 2 issues the last layer program command to the magnetic memory 3 (step S24). The magnetic memory 3 executes a write operation corresponding to the last layer program command (also referred to as a last layer program operation). When the magnetic memory 3 completes the last layer program operation, the memory controller 2 finishes the processing of writing to this block.

Thus, the memory controller 2 manages the states of the block, for example, (1) the unwritten state in which the data is unwritten to any layers of the block, (2) the state in which the data is written to one or more layers of the block and two or more unwritten layers exist, (3) the state in which the data is written to one or more layers of the block and the unwritten layer is only one layer, (4) unwritten layers do not exist, and the like. The memory controller 2 selectively issues three program commands to execute the program in a unit of a layer, i.e., the initial layer program command, the middle layer program command, and the last layer program command, in accordance with the block state.

FIG. 18 is a timing chart illustrating a sequence of the initial layer program operation. The data size of one layer of the block is assumed to be 4 bytes to simplify the illustration.

The memory controller 2 issues program command "80h" and asserts the command latch enable signal CLE. Subsequently, the memory controller 2 issues addresses (row address and column address) in, for example, two cycles and asserts the address latch enable signal ALE. The row address designates one source line SL corresponding to the block to which the data is to be written. The column address designates, for example, one of a plurality of columns. One column corresponds to, for example, eight bit lines BL. After that, the memory controller 2 transfers the write data for one layer (for example, F7h, 55h, 23h, and 65h) to the magnetic memory 3. After that, the memory controller 2 issues program command "01h" and asserts the command latch enable signal CLE.

In the magnetic memory 3, the row address received from the memory controller 2 is held in the row address register. In addition, the column address received from the memory controller 2 is held in the column address register. The value of the column address held in the column address register is automatically incremented every time 1-byte write data is received.

The magnetic memory 3 starts the initial layer program operation for the block corresponding to the source line SL designated by the row address and becomes a busy state. In the initial layer program operation, writing of the magnetic domains for total two layers including writing of the initial magnetic domains for one layer and writing of the magnetic domains for one layer corresponding to the write data for one layer is executed.

Figure 19:
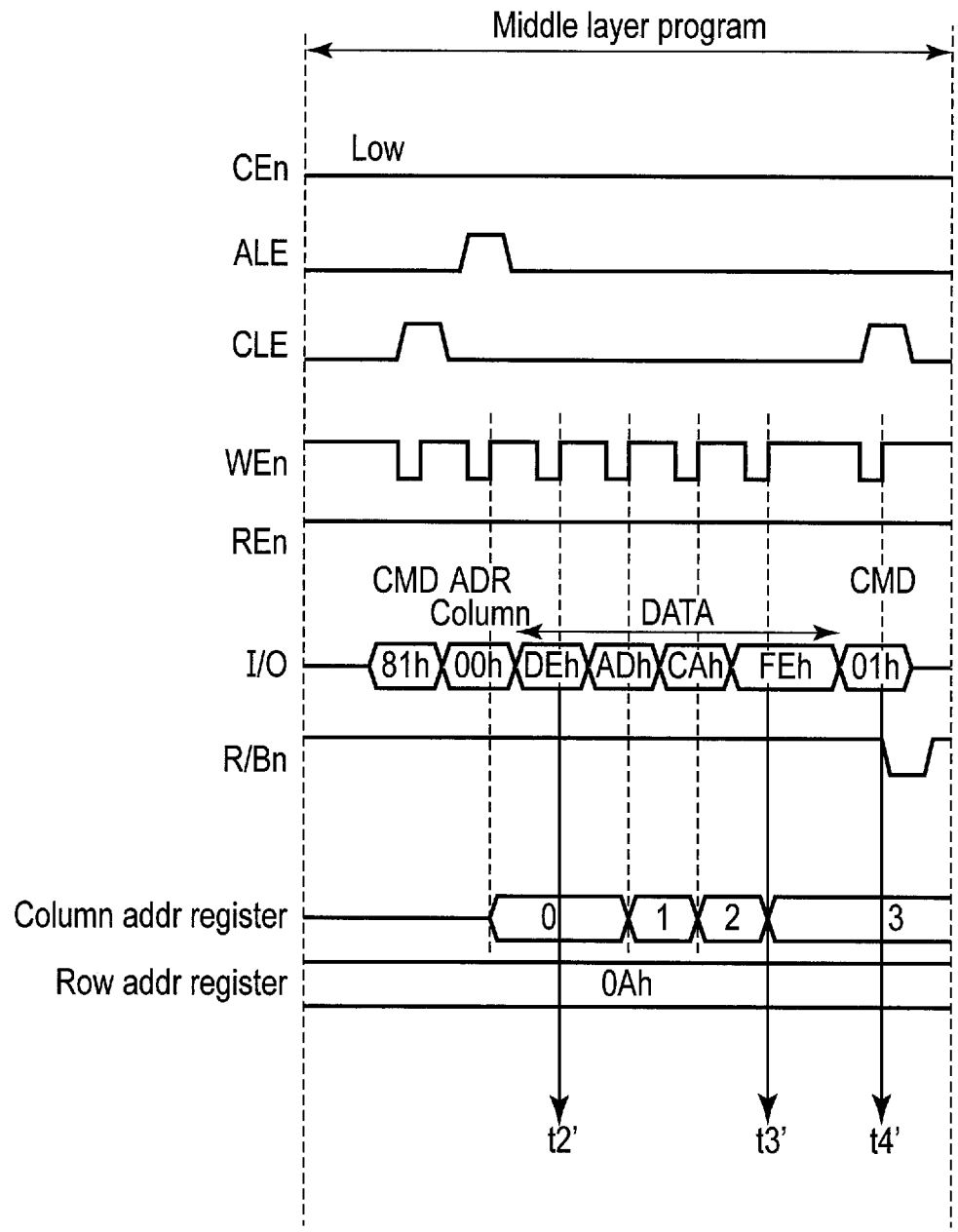
FIG. 19 is a timing chart illustrating a sequence of a middle layer program operation.

FIG. 19 is a timing chart illustrating a sequence of the middle layer program operation.

The memory controller 2 issues program command "81h" and asserts the command latch enable signal CLE. Subsequently, the memory controller 2 issues the column address and asserts the address latch enable signal ALE. After that, the memory controller 2 transfers the write data for one layer (for example, DEh, ADh, CAh, and FEh) to the magnetic memory 3. After that, the memory controller 2 issues program command "01h" and asserts the command latch enable signal CLE.

The row address designated by the initial layer program command is held in the row address register of the magnetic memory 3. The magnetic memory 3 selects the block corresponding to the source line SL designated by the row address, starts the middle layer program operation for this block, and becomes a busy state. In the middle layer program operation, writing of the magnetic domains for one layer corresponding to the write data for one layer is executed.

FIG. 20 is a timing chart illustrating a sequence of the last layer program operation.

The memory controller 2 issues program command "81h" and asserts the command latch enable signal CLE. Subsequently, the memory controller 2 issues the column address and asserts the address latch enable signal ALE. After that, the memory controller 2 transfers the write data for one layer (for example, F7h, 55h, 23h, and 65h) to the magnetic memory 3. After that, the memory controller 2 issues program command "00h" and asserts the command latch enable signal CLE.

The row address designated by the initial layer program command is held in the row address register of the magnetic memory 3. The magnetic memory 3 selects the block corresponding to the source line SL designated by the row address, starts the last layer program operation for this block, and becomes a busy state. In the last layer program operation, writing of the magnetic domains for one layer corresponding to the write data for one layer is executed.

Figure 21:
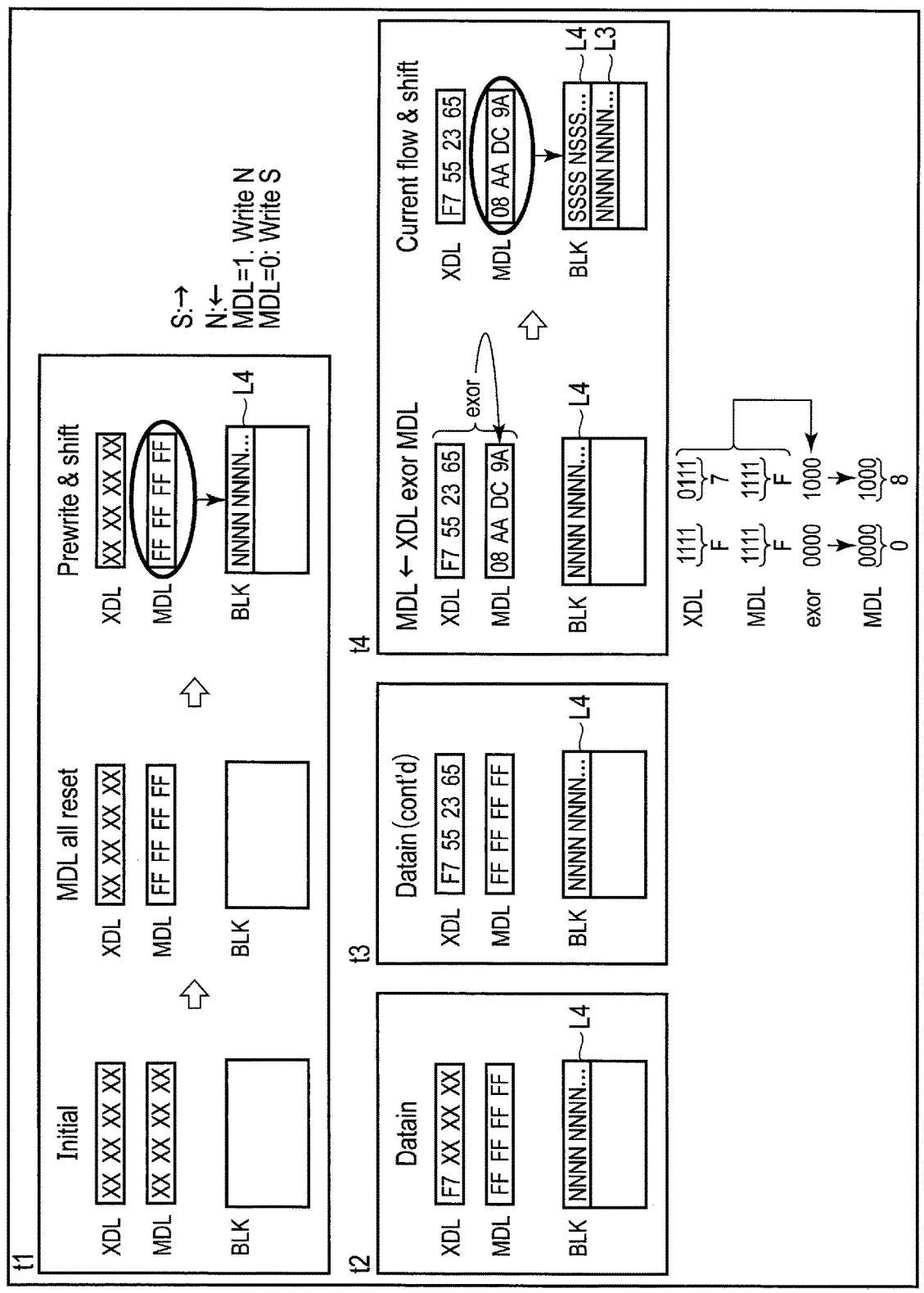
FIG. 21 is a diagram illustrating variation of data in the magnetic memory in the initial layer program operation illustrated in the timing chart of FIG. 18.

FIG. 21 illustrates the variation of data in the magnetic memory 3 in the initial layer program operation illustrated in the timing chart of FIG. 18.

At timing t1 of the timing chart of FIG. 18, the content of XDL is indefinite and the content of MDL is also indefinite. Then, for example, the magnetic memory 3 resets the content (mdata) of the MDL to, for example, all 1 (=FFFFFFFFh) in response to the reception of the program command "80h" corresponding to the initial layer program command. In the MDL, the bit of "1" of the mdata indicates that the magnetic domain (N) having the magnetization direction "←" should be written, i.e., the current of the direction necessary to form the magnetic domain (N) should flow to the field line FL. The bit of "0" of the mdata indicates that the magnetic domain (S) having the magnetization direction "→" should be written, i.e., the current of the direction necessary to form the magnetic domain (S) should flow to the field line FL.

The magnetic memory 3 writes the initial magnetic domains for one layer (magnetic domains (N) each having the magnetization direction "←") to the layer L4 of all the magnetic memory lines MMLs constituting the block BLK (pre write & shift).

At timing t2 of the timing chart of FIG. 18, the first 1-byte write data F7h of the 4-byte write data is set to the XDL. At timing t3 of the timing chart of FIG. 18, all the 4-byte write data for one layer (F7h 55h 23h 65h) are arranged together in the XDL.

When the program command "01h" is received, the magnetic memory 3 updates the mdata of MDL in accordance with the write data for one layer stored in the XDL. In the embodiment, the combination of two adjacent magnetic domains having the same magnetization direction corresponds to data "0" and the combination of two adjacent magnetic domains having the different magnetization directions corresponds to data "1". Therefore, the magnetic memory 3 reverses the value of the bit in the MDL corresponding to the bit position of "1" in the XDL. In this case, a logical operation [XDL exor MDL] to obtain exclusive OR of XDL and MDL is executed, the result of the logical operation [XDL exor MDL] is stored in the MDL, and the content of the MDL is thereby updated.

For example, when upper 1 byte of the write data for one layer is focused, upper 1 byte of the write data is F7h (=1111 0111) and upper 1 byte of the mdata of the MDL is FFh (=1111 1111). Therefore, upper 1 byte of the mdata is updated from FFh (=1111 1111) to 08h (=0000 1000).

The magnetic memory 3 makes the current flow to each of the field lines FLs, based on the updated MDL, executes the shift operation, and thereby pushes the magnetic domains for one layer "SSSS NSSS . . . " into the block BLK (Current flow & shift). The magnetic domains for one layer "SSSS NSSS . . . " are pushed into the layer L4 of all the magnetic memory lines MMLs constituting the block BLK, and the initial magnetic domains for one layer "NNNN NNNN . . . " are moved from the layer L4 to the layer L3 of the magnetic memory lines MMLs.

Next, an interleave operation of transitioning to the processing for the other block during the write to the block will be explained with reference to FIG. 22.

Figure 22:
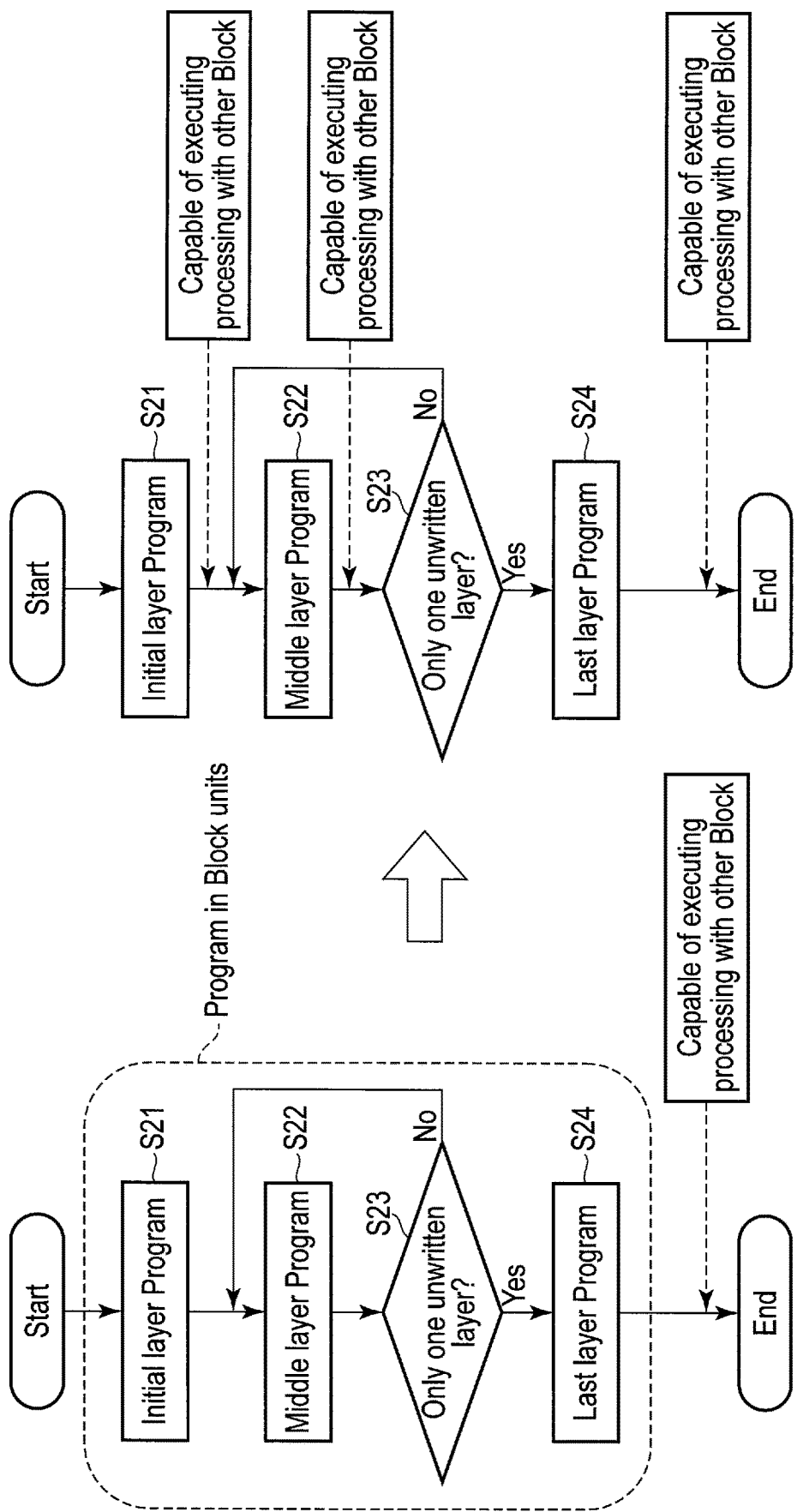
FIG. 22 is a flowchart illustrating a summary of a procedure of the write operation which can transition to an operation for a block when completing write to any one layer in the block.

A flowchart at the left part of FIG. 22 illustrates a procedure of the write operation of writing the data in a unit of a block (i.e., the write operation explained with reference to FIG. 17). When the procedure of this write operation is used for data writing to the block BLK, the processing for the other block (for example, write of data to the other block or read of data from the other block) can be executed in general only when the last layer program operation for the block BLK is finished. This is because since the MDL is shared by a plurality of blocks, the content of the MDL may be rewritten if write or read of the other block is executed during the write of the block BLK. In this case, information indicative of the direction of the current flowing to the field line FL at the last write to the block BLK is lost. Therefore, even if the operation of writing the data to the block BLK is restarted, correctly determining the magnetization direction of the magnetic domain corresponding to the value of subsequent write data becomes difficult and correct write to the block BLK cannot be executed.

In the embodiment, as illustrated at the right part of FIG. 22, a new write operation which can transition to the operation for the other block when completing write to any one layer in the block BLK is implemented. The operation for the other block can be started after the initial layer program operation or the middle layer program operation of the block BLK.

In the embodiment, the magnetic memory 3 comprises, roughly, two new functions explained below, to enable an interleave operation of transitioning to the processing for the other block during the write to a certain block. The block in which the write is being executed indicates a block in which write to one or more layers is executed and one or more unwritten layers exist.

(1) Function of Writing Additional Magnetic Domain

The function of writing the additional magnetic domain writes to the block BLK the magnetic domain to restore the magnetization direction of the magnetic domain last written to the block BLK, i.e., the direction of the current flowing to the field line FL at the last write to the block BLK as the additional magnetic domain (also hereinafter referred to as the magnetic domain for lid), reads the additional magnetic domain, and restores the content of the MDL immediately before the interleave operation. More specifically, this function can be implemented by any one of three methods mentioned below.

(1-1) Write additional magnetic domains for two layers and read additional magnetic domains for two layers (1-2) Write additional magnetic domains for one layer, read the magnetic domains for two layers, and write back magnetic domains for one layer (1-3) Write the initial magnetic domains having a predetermined fixed magnetization direction at start of an interleave operation or at restart of write (2) Function of Maintaining Content of MDL The function of maintaining the content of the MDL is a function of holding the content of the MDL in the latch circuit in the magnetic memory or the buffer in the memory controller 2.

Details of these functions will be explained with reference to FIG. 25 and the following drawings.

Figure 23:
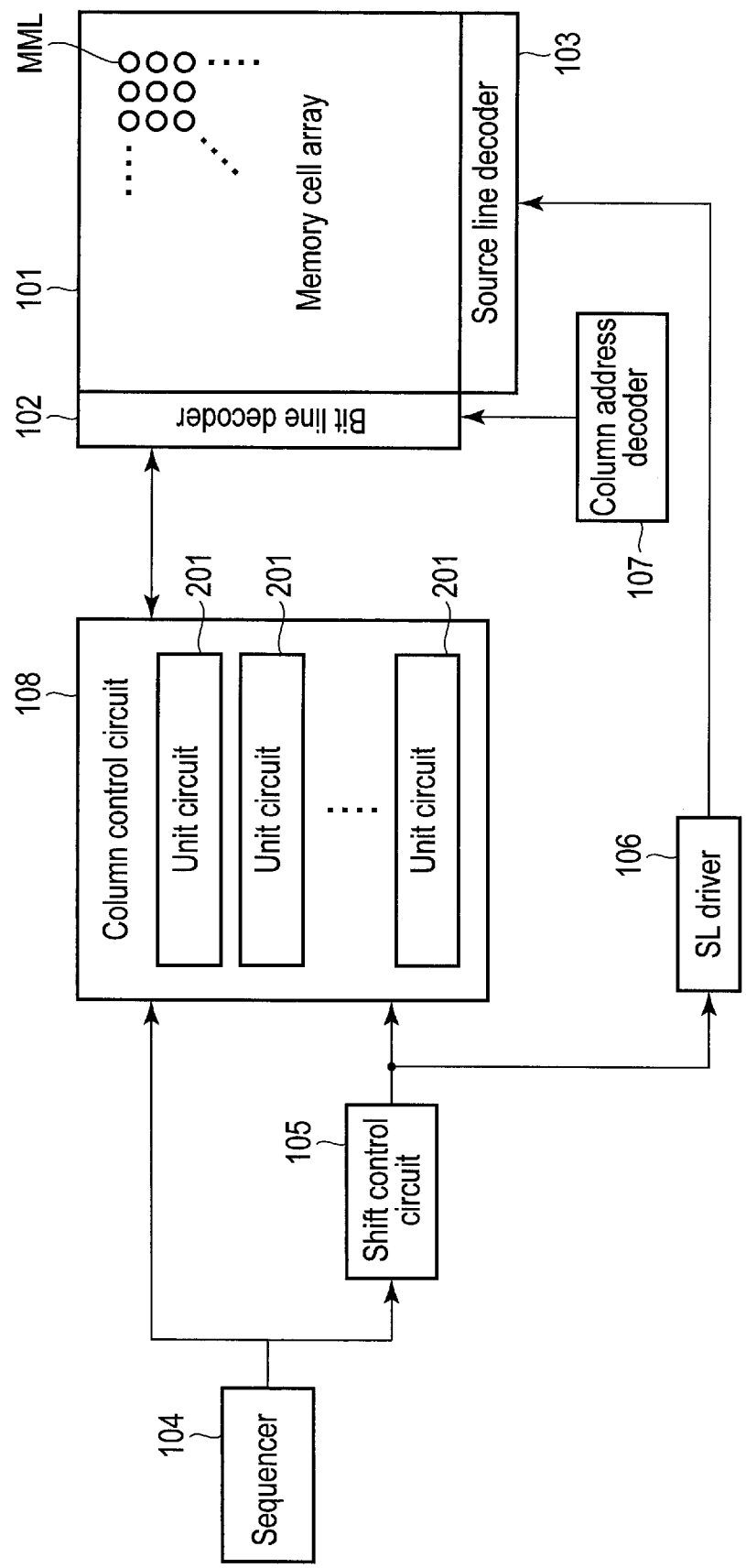
FIG. 23 is a block diagram illustrating an example of circuit configuration of the magnetic memory.

Next, a circuit configuration of the magnetic memory 3 will be explained with reference to FIG. 23.

The magnetic memory 3 includes a memory cell array 101, a bit line decoder 102, a source line decoder 103, a sequencer 104, a shift control circuit 105, a source line driver 106, a column address decoder 107, a column control circuit 108, and the like.

The memory cell array 101 includes the magnetic memory lines MML, the bit lines BL, the field lines FL, and the source lines SL as explained with reference to FIG. 2 to FIG. 5. The bit line decoder 102 selects one of the bit lines BL under the control of the column address decoder 107. The source line decoder 103 selects one of the source lines SL under the control of the source line driver 106.

The sequencer 104 is a control circuit configured to control the overall operations of the magnetic memory 3, and controls the shift control circuit 105, the column control circuit 108, and the like in response to various commands received from the memory controller 2, and executes operations necessary for the processing of each command. The shift control circuit 105 executes control of shifting each of the magnetic domains stored in each magnetic memory line MML in a unit of a layer, in a direction from the layer Ln to the layer L1 or a direction from the layer L1 to the layer Ln, under the control of the sequencer 104.

The column control circuit 108 executes operations for the control of the bit lines BL and the control of the field lines FL under the control of the sequencer 104. The column control circuit 108 includes plural unit circuits 201. The number of unit circuits 201 is equal to the number of bit lines BLs (i.e., the number of field lines FLs). Each of the unit circuits 201 controls one bit line BL corresponding to the unit circuit 201 and one field line FL corresponding to the unit circuit 201.

As illustrated in FIG. 24, the unit circuit 201 includes a data latch circuit 211, a write control circuit 212, a field line (FL) driver 213, a bit line driver 214, a read control circuit 215, and the like.

The latch circuit XDL corresponding to one unit circuit 201 is used to hold 1-bit data corresponding to one bit line BL (or one field line FL) corresponding to the unit circuit 201. The latch circuit MDL corresponding to one unit circuit 201 is used to hold 1-bit magnetic data (mdata) corresponding to one bit line BL (or one field line FL) corresponding to the unit circuit 201.

The write control circuit 212 executes controls of determining the direction of the current (write current) flowing to the field line FL, by using the content of the latch circuit XDL and the content of the latch circuit MDL used for the previous write, and changing the direction of the current (write current) flowing to the field line FL via the field line (FL) driver 213.

The bit line driver 214 executes the control for the corresponding bit lines BL via the bit line decoder 102, under the control of the shift control circuit 105. The read control circuit 215 includes the sense amplifier 46 and the circuits of the previous stages explained with reference to FIG. 6, the magnitude relationship determination circuit 47 explained with reference to FIG. 6, and the like.

If the output data corresponding to the result of comparison between the voltage VSMP1 and the voltage VSMP2 corresponding to two magnetic domains read from the uppermost layer and the layer under the uppermost layer of the magnetic memory line MML is "1", it is determined in the read control circuit 215 which of the conditions VSMP1>VSMP2 and VSMP1<VSMP2 is satisfied (magnitude relationship determination). The magnetization direction of each of two magnetic domains, i.e., the direction of the write current used when writing each of these two magnetic domains can be specified based on the determination result. For example, in a case where the magnetic layer (reference layer) 11R of the magnetoresistive element 11 is magnetized in the magnetization direction (S) represented by the right arrow, and the read control circuit 215 is configured such that the voltage value of the state signal VEVAL is lowered when the resistant state of the magnetoresistive element 11 is changed from a high resistance to a low resistance, the magnetization direction of the magnetic domain of the uppermost layer is determined to be N and the magnetization direction of the magnetic domain of the layer under the uppermost layer is determined to be S if VSMP1>VSMP2. In contrast, if VSMP1<VSMP2, the magnetization direction of the magnetic domain in the uppermost layer is determined to be S, and the magnetization direction of the magnetic domain in the layer under the uppermost layer is determined to be N. Therefore, subsequent data can be written by generating the mdata indicative of the specified direction of the write current in the read control circuit 215 and transferring the mdata to the latch circuit MDL.

Next, an operation of writing additional magnetic domains for two layers and then reading additional magnetic domains for two layers will be explained.

First, the operation of writing additional magnetic domains (magnetic domains for lid) for two layers will be explained with reference to FIG. 25. In each of the magnetic memory lines MMLs, it is assumed that an additional magnetic domain of the first layer has a magnetization direction opposite to the magnetization direction of the uppermost layer of the magnetic memory line MML and that an additional magnetic domain of the second layer has a magnetization direction opposite to the magnetization direction of the additional magnetic domain of the first layer. Note that the additional magnetic domain of the first layer may have a magnetization direction which is the same as the magnetization direction of the uppermost layer of the magnetic memory line MML and the additional magnetic domain of the second layer may have the magnetization direction opposite to the magnetization direction of the additional magnetic domain of the first layer.

Figure 25:
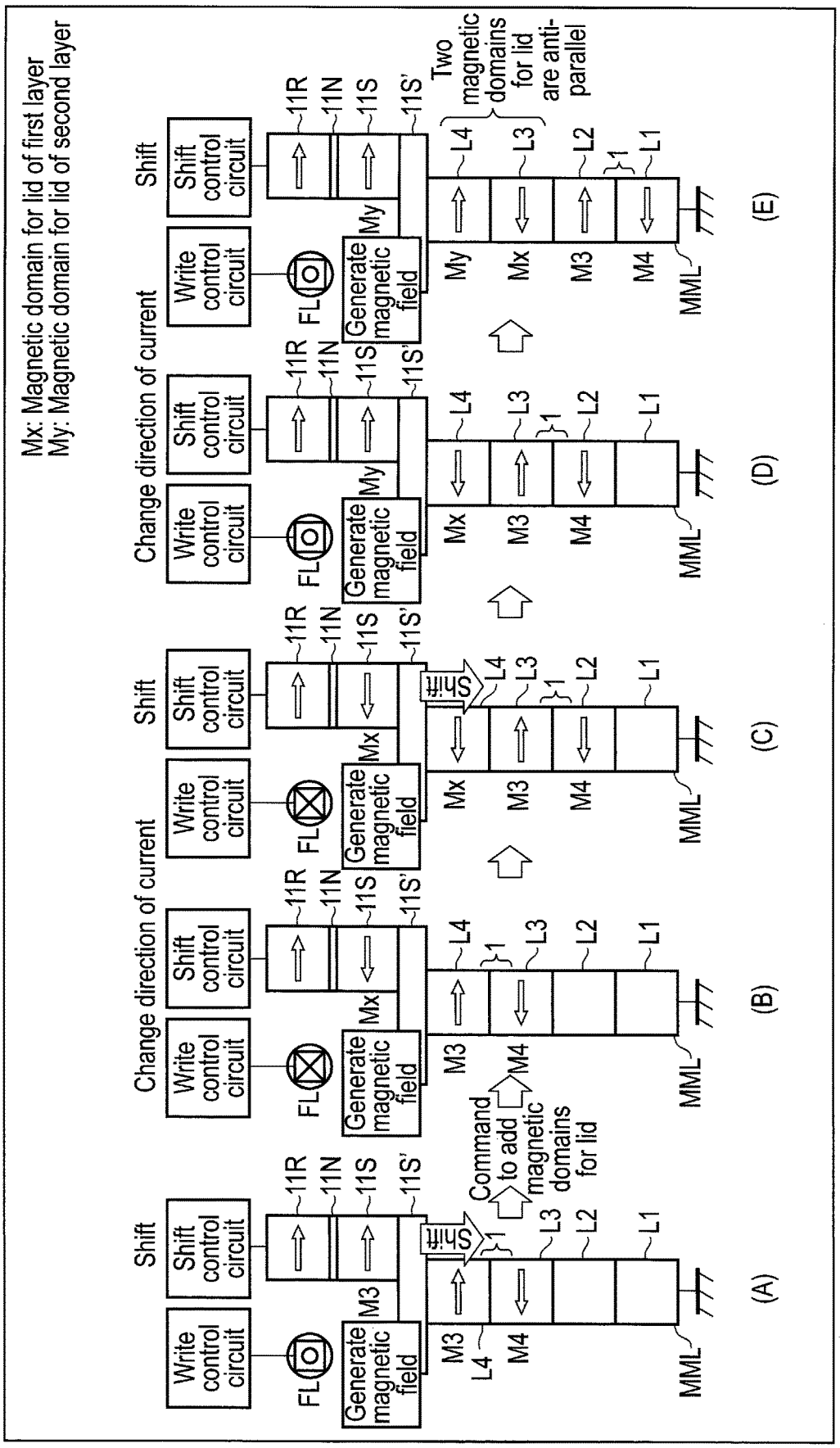
FIG. 25 is a diagram illustrating an operation of writing additional magnetic domains (magnetic domains for lid) for two layers for restoring a magnetization direction of a layer last programmed in the magnetic memory line.

(A) of FIG. 25 illustrates a state immediately after the initial layer program operation of the block BLK. First, the magnetic domain M3 having a predetermined magnetization direction that is determined based on the magnetization direction "←" of the initial magnetic domain M4 or, in this case, the magnetization direction "→" which is opposite to the magnetization direction "←" of the initial magnetic domain M4 is pushed into the magnetic memory line MML by the shift operation, the magnetic domain M3 is thereby put into the uppermost layer L4, and the initial magnetic domain M4 is moved from the uppermost layer L4 to the layer L3.

When starting the interleave operation of executing processing of the block other than the block BLK in which write is being executed, the memory controller 2 issues a command to add magnetic domains for lid (also referred to as a first command) to the magnetic memory 3. The command to add the magnetic domains for lid is a command to instruct magnetic domains capable of restoring the magnetization directions of the magnetic domains last written to the block BLK to be written to the block BLK.

When receiving the command to add the magnetic domains for lid from the memory controller 2, the magnetic memory 3 changes the direction of the current flowing to the field line FL, in order to write the additional magnetic domain Mx of the first layer having the magnetization direction "←", which is opposite to the magnetic domain M3 of the uppermost layer L4, as illustrated in (B) of FIG. 25. That is, the magnetic memory 3 makes the current flow to the field line FL in a direction from the front side to the depth side of the drawing, and causes the field line FL to generate an induced magnetic field for forming the additional magnetic domain Mx having the magnetization direction "←". The additional magnetic domain Mx having the magnetization direction "←" is formed at the write position (magnetic layers 11S and 11S').

As illustrated in (C) of FIG. 25, the magnetic memory 3 executes the shift operation of downwardly moving the magnetic domain of each layer of the magnetic memory line MML. The additional magnetic domain Mx is thereby pushed into the magnetic memory line MML and put into the uppermost layer L4. At this time, the initial magnetic domain M4 is moved to the layer L2, and the magnetic domain M3 is moved to the layer L3.

As illustrated at (D) of FIG. 25, the magnetic memory 3 changes the direction of the current flowing to the field line FL, in order to write the additional magnetic domain My of the second layer having the magnetization direction "→", which is opposite to the additional magnetic domain Mx. That is, the magnetic memory 3 makes the current flow to the field line FL in a direction from the depth side to the front side of the drawing, and causes the field line FL to generate an induced magnetic field for forming the additional magnetic domain My having the magnetization direction "→". The additional magnetic domain Mx having the magnetization direction "→" is formed at the write position (magnetic layers 11S and 11S').

As illustrated in (E) of FIG. 25, the magnetic memory 3 executes the shift operation of downwardly moving the magnetic domain of each layer of the magnetic memory line MML. The additional magnetic domain My is thereby pushed into the magnetic memory line MML and put into the uppermost layer L4. AL this time, the initial magnetic domain M4 is moved to the layer L1, the magnetic domain M3 is moved to the layer L2, and the magnetic domain Mx is moved to the layer L3.

Thus, the additional magnetic domains for lid My and Mx are put into the magnetic memory line MML such that the magnetic domains of the respective layers of the magnetic memory line MML are moved downwardly by two layers. As a result, the magnetic domains for lid My and Mx are written to the layers L4 and L3 of the magnetic memory line MML. The additional magnetic domains My and Mx for two layers are anti-parallel to each other.

Next, an operation of reading additional magnetic domains for two layers will be explained with reference to FIG. 26.

When restarting the write operation to the block BLK after executing the interleave operation, the memory controller 2 issues a command to remove the magnetic domains for lid and to program (also referred to as a second command) to the magnetic memory 3. The command to remove the magnetic domains for lid and to program is a command to instruct restoring the magnetization direction of the magnetic domain of the uppermost layer immediately before the magnetic domains for lid are written, i.e., the direction of the current flowing to the field line FL immediately before the magnetic domains for lid are written, and writing the data (magnetic domains) for one layer.

(A) of FIG. 26 illustrates the state of the magnetic memory line MML in the block BLK at the restart of write.

A layer L1 of the magnetic memory line MML holds the magnetic domain M4 having the magnetization direction "←". A layer L2 of the magnetic memory line MML holds the magnetic domain M3 having the magnetization direction "→". A layer L3 of the magnetic memory line MML holds the magnetic domain Mx which is a magnetic domain for lid of the first layer. The magnetic domain Mx has a magnetization direction "←", which is opposite to a magnetization direction of the magnetic domain M3. A layer L4 of the magnetic memory line MML holds the magnetic domain My, which is a magnetic domain for lid of the second layer. The magnetic domain My has a magnetization direction "→", which is opposite to a magnetization direction of the magnetic domain Mx.

When receiving a command to remove the magnetic domains for lid and to program, the magnetic memory 3 first executes the shift operation of upwardly moving the magnetic domain of each layer of the magnetic memory line MML as illustrated in (B) of FIG. 26. The magnetic domain My is thereby read from the magnetic memory line MML and moved to the read position (magnetic layers 11S and 11S'). In addition, the magnetic domain Mx, the magnetic domain M3, and the magnetic domain M4 are moved to the layer L4, the layer L3, and the layer L2, respectively. When the magnetic domain My is moved to the read position (magnetic layers 11S and 11S'), the state signal VEVAL corresponding to the resistant state of the magnetoresistive element 11 resulting from the magnetization direction of the magnetic domain My is stored as the voltage VSMP1 (also referred to as a first sampling value) in the capacitor C11 (C11 sampling).

As illustrated in (C) of FIG. 26, the magnetic memory 3 executes the shift operation of upwardly moving the magnetic domain of each layer of the magnetic memory line MML. The magnetic domain Mx is thereby read from the magnetic memory line MML and moved to the read position (magnetic layers 11S and 11S'). In addition, the magnetic domain M3 and the magnetic domain M4 are moved to the layer L4 and the layer L3, respectively. When the magnetic domain Mx is moved to the read position (magnetic layers 11S and 11S'), the state signal VEVAL corresponding to the resistant state of the magnetoresistive element 11 resulting from the magnetization direction of the magnetic domain Mx is stored as the voltage VSMP2 (also referred to as a second sampling value) in the capacitor C12 (C12 sampling).

Since the magnetization direction of the magnetic domain My is anti-parallel to the magnetization direction of the magnetic domain Mx, the resistance of the magnetoresistive element 11 at reading the magnetic domain My is different from the resistance of the magnetoresistive element 11 at reading the magnetic domain Mx. Therefore, the difference between the voltage VSMP1 and the voltage VSMP2 becomes larger than the threshold voltage. As a result, output data DOUT of the sense amplifier 46 becomes "1". The magnetic memory 3 determines which of the conditions VSMP1>VSMP2 and VSMP1<VSMP2 is satisfied by using the magnitude relationship determination circuit 47. The magnetic memory 3 determines the magnetization direction of the magnetic domain M3 which has been in the uppermost layer L4 before writing the magnetic domains for lid Mx and My to the magnetic memory line MML, based on the determination result.

That is, the magnetization direction of each of two magnetic domains My and Mx is specified in accordance with the result of determining which of the conditions VSMP1>VSMP2 and VSMP1<VSMP2 is satisfied. Since the magnetic domain Mx and the magnetic domain M3 have magnetization directions opposite to each other, the magnetization direction of the magnetic domain M3, i.e., the direction of the write current used to generate the induced magnetic field for forming the magnetic domain M3 in the field line FL is specified based on the magnetization direction of the magnetic domain Mx.

As illustrated in (D) of FIG. 26, the magnetic memory 3 can restore the content of the MDL before the interleave operation, by generating the mdata indicative of the magnetization direction (i.e., the specified direction of the write current) of the magnetic domain M3. That is, the mdata of the MDL is updated such that the mdata of the MDL is indicative of the specified direction of the write current.

The magnetic memory 3 can therefore correctly determine the magnetization direction of the magnetic domain necessary to write the subsequent write data, based on the value of the subsequent write data and the restored content of the MDL. The magnetic memory 3 drives the FL driver 213 and cause the field line FL to generate a magnetic field corresponding to the magnetization direction of this magnetic domain. Then, the magnetic memory 3 executes the shift operation, puts the magnetic domain into the uppermost layer L4 of the magnetic memory line MML, and downwardly moves the magnetic domains of the respective layers of the magnetic memory line MML.

FIG. 27 illustrates an example of a command to add the magnetic domains for lid.

The command sequence of the command to add the magnetic domains for lid includes program command "81h", column address, and program command "21h". The command sequence of the command to add the magnetic domains for lid does not include the write data.

FIG. 28 illustrates an example of a command to remove the magnetic domains for lid and to program.

The command to remove the magnetic domains for lid and to program is not limited but, for example, may be implemented by using the above-explained initial layer program command, middle layer program command, and last layer program command.

If upper 4 bits [7:4] of the command "01h" included in the command sequence of the initial layer program command are "0h", the initial layer program command is handled as a normal initial layer program command that does not execute the operation of removing the magnetic domains for lid.

If upper 4 bits [7:4] of the command "01h" included in the command sequence of the initial layer program command are "1h", the initial layer program command may be handled as an initial layer program command that also executes the operation of removing the magnetic domains for lid.

If upper 4 bits [7:4] of the command "01h" included in the command sequence of the middle layer program command are "0h", the middle layer program command is handled as a normal middle layer program command that does not execute the operation of removing the magnetic domains for lid.

If upper 4 bits [7:4] of the command "01h" included in the command sequence of the middle layer program command are "1h", the middle layer program command may be handled as a middle layer program command that also executes the operation of removing the magnetic domains for lid.

If upper 4 bits [7:4] of the command "00h" included in the command sequence of the last layer program command are "0h", the last layer program command is handled as a normal last layer program command that does not execute the operation of removing the magnetic domains for lid.

If upper 4 bits [7:4] of the command "00h" included in the command sequence of the last layer program command are "0h", the last layer program command may be handled as the last layer program command that also executes the operation of removing the magnetic domains for lid.

Note that the command sequence of each of the middle layer program command and the last layer program command used as the command to remove the magnetic domains for lid and to program may include both a column address and a row address.

Figure 29:
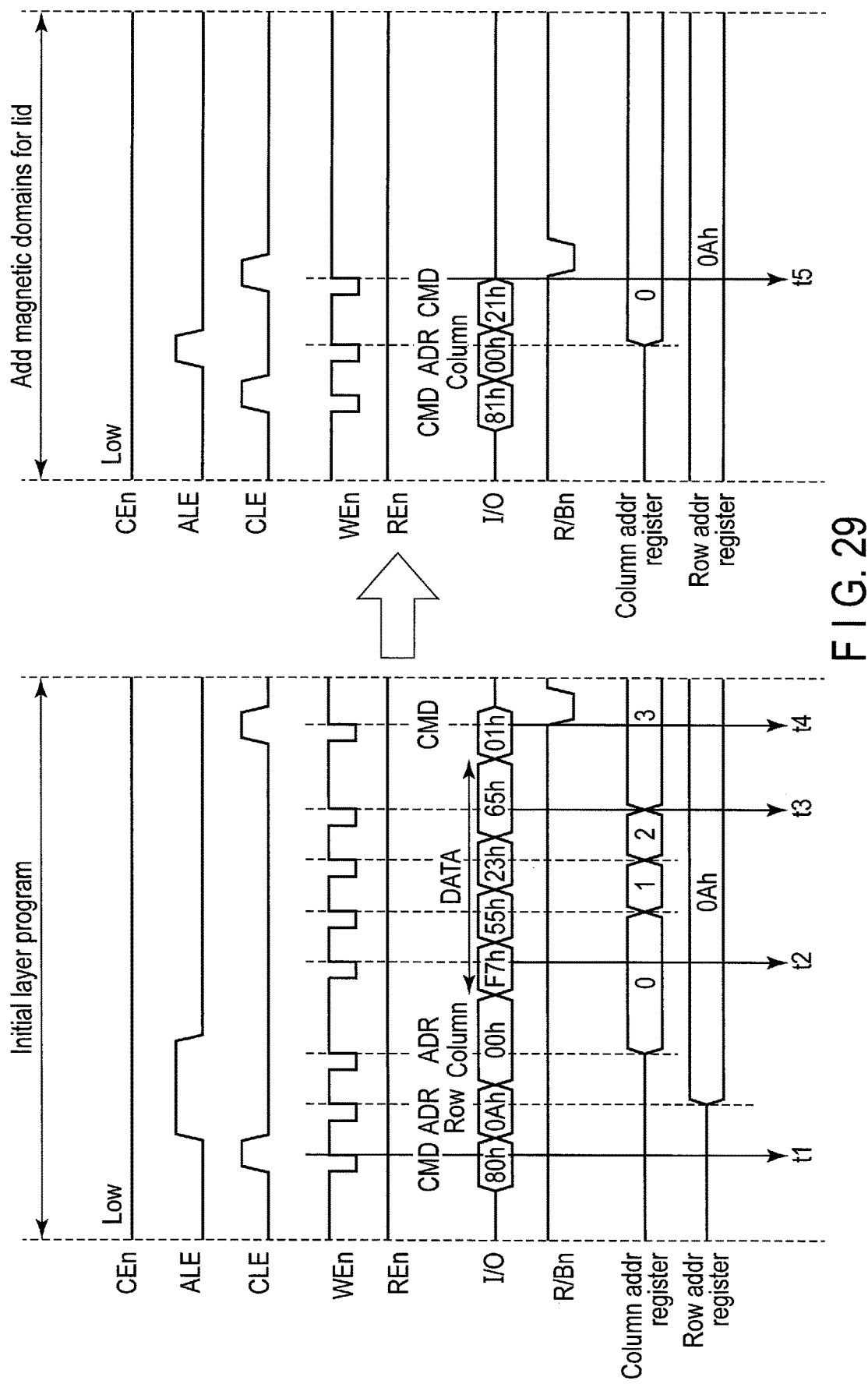
FIG. 29 is a timing chart illustrating the initial layer program operation and an operation of adding the magnetic domains for lid.

A timing chart of FIG. 29 illustrates the initial layer program operation and an operation of adding the magnetic domains for lid.

It is assumed that the magnetic memory 3 receives the command to add the magnetic domains for lid from the memory controller 2 after completing the initial layer program command.

When the initial layer program operation is completed, the memory controller 2 issues program command "81h" and asserts the command latch enable signal CLE. Subsequently, the memory controller 2 issues the column address ("00h") and asserts the address latch enable signal ALE. After that, the memory controller 2 issues program command "21h" and asserts the command latch enable signal CLE.

The row address designated by the initial layer program command is held in the row address register of the magnetic memory 3. The magnetic memory 3 selects the block corresponding to the source line SL designated by the row address, starts the program operation for adding the magnetic domains for lid, and becomes a busy state. In the program operation for adding the magnetic domains for lid, write of the magnetic domains for lid for two layers is executed.

A timing chart of FIG. 30 illustrates the middle layer program operation and an operation of adding the magnetic domains for lid.

It is assumed that the magnetic memory 3 receives the command to add the magnetic domains for lid from the memory controller 2 after completing the middle layer program command.

When the middle layer program operation is completed, the memory controller 2 issues program command "81h" and asserts the command latch enable signal CLE. Subsequently, the memory controller 2 issues the column address ("00h") and asserts the address latch enable signal ALE. After that, the memory controller 2 issues program command "21h" and asserts the command latch enable signal CLE.

The row address designated by the initial layer program command is held in the row address register of the magnetic memory 3. The magnetic memory 3 selects the block corresponding to the source line SL designated by the row address, starts the program operation for adding the magnetic domains for lid, and becomes a busy state. In the program operation for adding the magnetic domains for lid, write of the magnetic domains for lid for two layers is executed.

Figure 31:
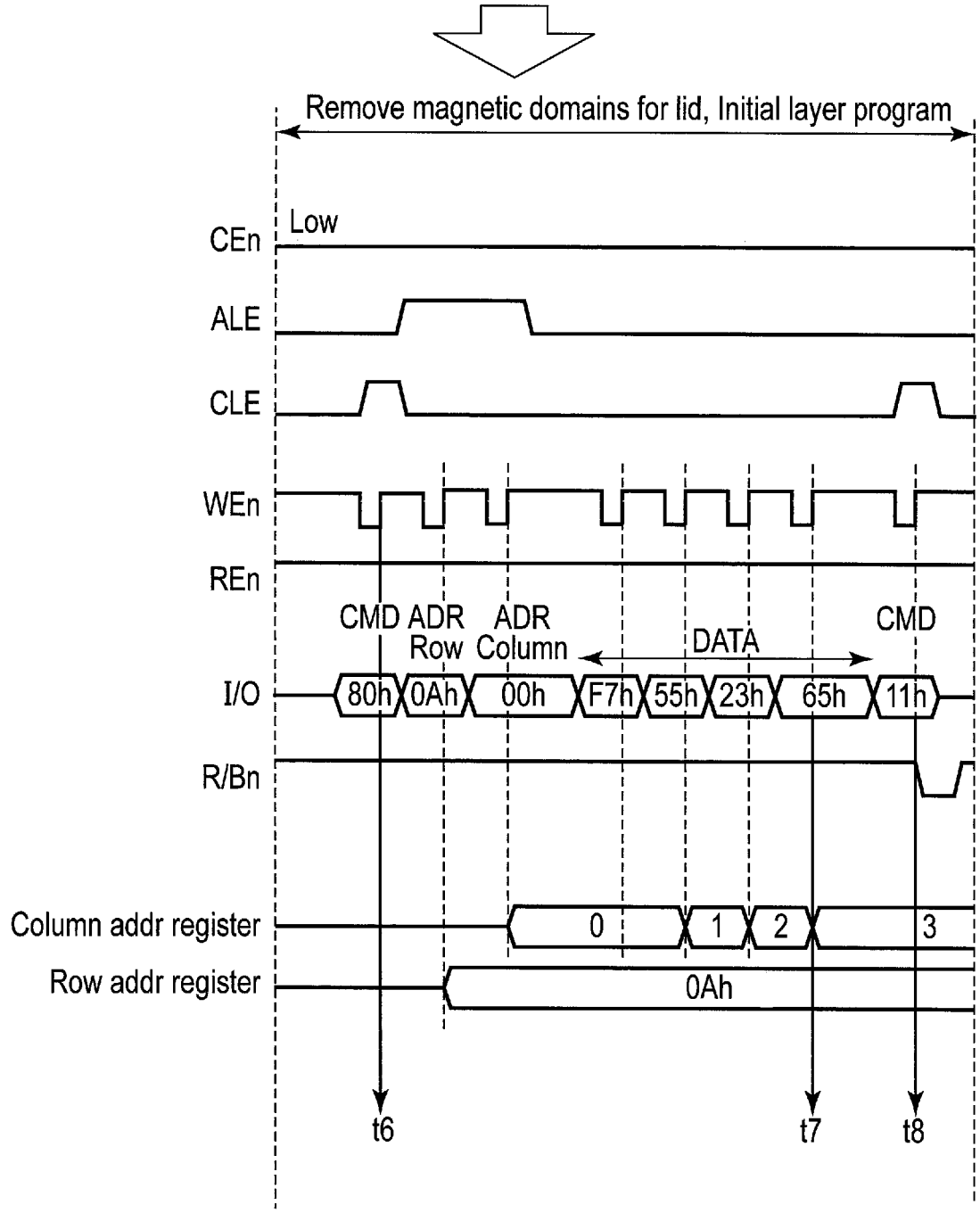
FIG. 31 is a timing chart illustrating a processing sequence executed in response to an initial layer program command to remove the magnetic domains for lid and to program.

FIG. 31 is a timing chart illustrating a sequence for the initial layer program command which also executes an operation of removing the magnetic domains for lid.

The memory controller 2 issues program command "80h" and asserts the command latch enable signal CLE. Subsequently, the memory controller 2 issues addresses (row address and column address) in, for example, two cycles and asserts the address latch enable signal ALE. The row address designates one source line SL corresponding to the block to which the data is to be written. After that, the memory controller 2 transfers the write data for one layer (for example, F7h, 55h, 23h, and 65h) to the magnetic memory 3. After that, the memory controller 2 issues program command "11h" and asserts the command latch enable signal CLE.

In the magnetic memory 3, the row address received from the memory controller 2 is held in the row address register. In addition, the column address received from the memory controller 2 is held in the column address register. The value of the column address held in the column address register is automatically incremented every time the write data is received.

The magnetic memory 3 starts the operation of reading the magnetic domains for two layers from the block corresponding to the source line SL designated by the row address and the initial layer program operation, and becomes a busy state.

Figure 32:
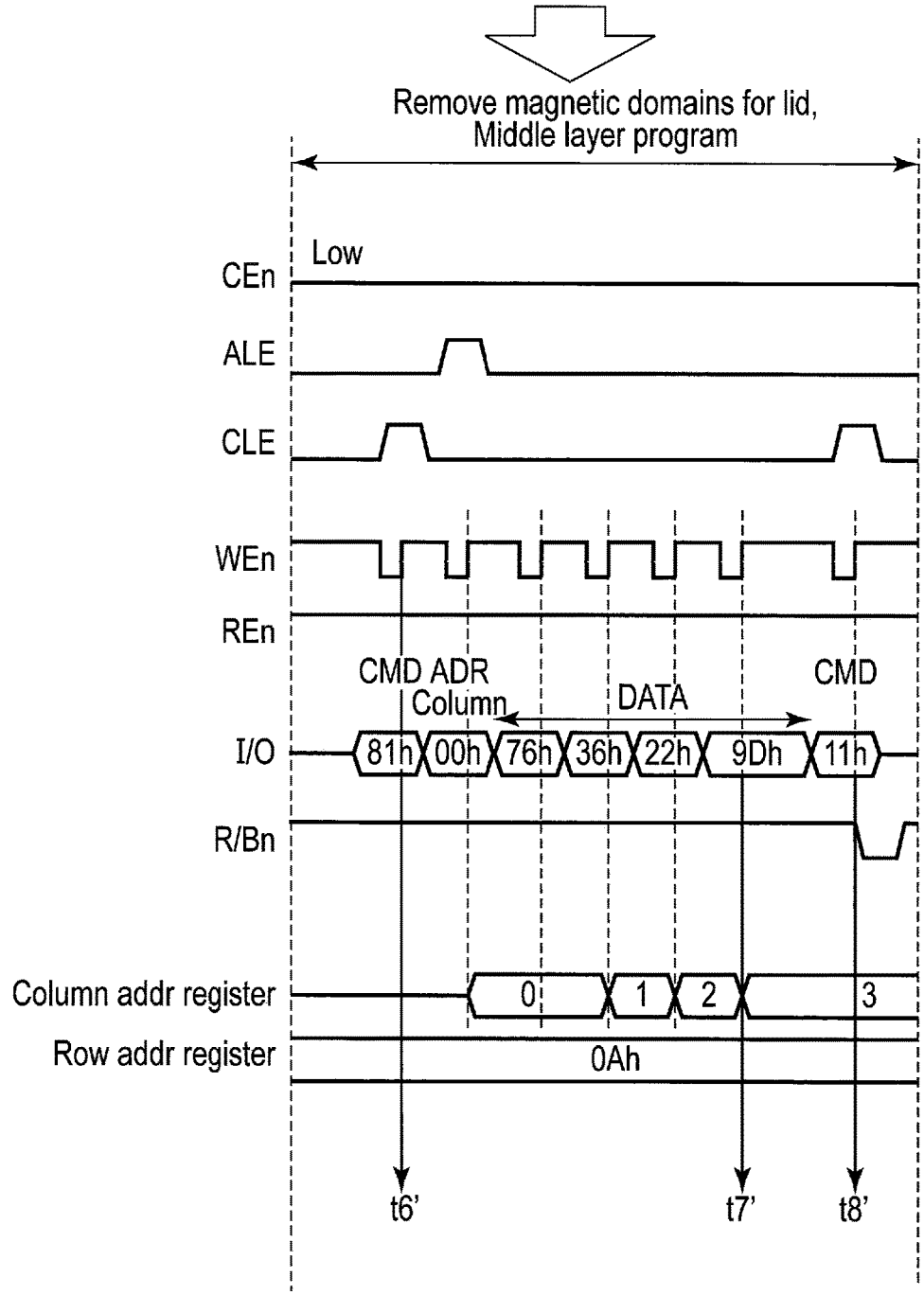
FIG. 32 is a timing chart illustrating a processing sequence executed in response to a middle layer program command to remove the magnetic domains for lid and to program.

FIG. 32 is a timing chart illustrating a sequence for the middle layer program command which also executes an operation of removing the magnetic domains for lid.

The memory controller 2 issues program command "81h" and asserts the command latch enable signal CLE. Subsequently, the memory controller 2 issues the column address and asserts the address latch enable signal ALE. After that, the memory controller 2 transfers the write data for one layer (for example, 76h, 36h, 22h, and 9Dh) to the magnetic memory 3. After that, the memory controller 2 issues program command "11h" and asserts the command latch enable signal CLE.

The row address designated by the initial layer program command is held in the row address register of the magnetic memory 3. The magnetic memory 3 selects the block corresponding to the source line SL designated by the row address, starts the operation of reading the magnetic domains for two layers from this block and the middle layer program operation, and becomes a busy state.

Figure 33:
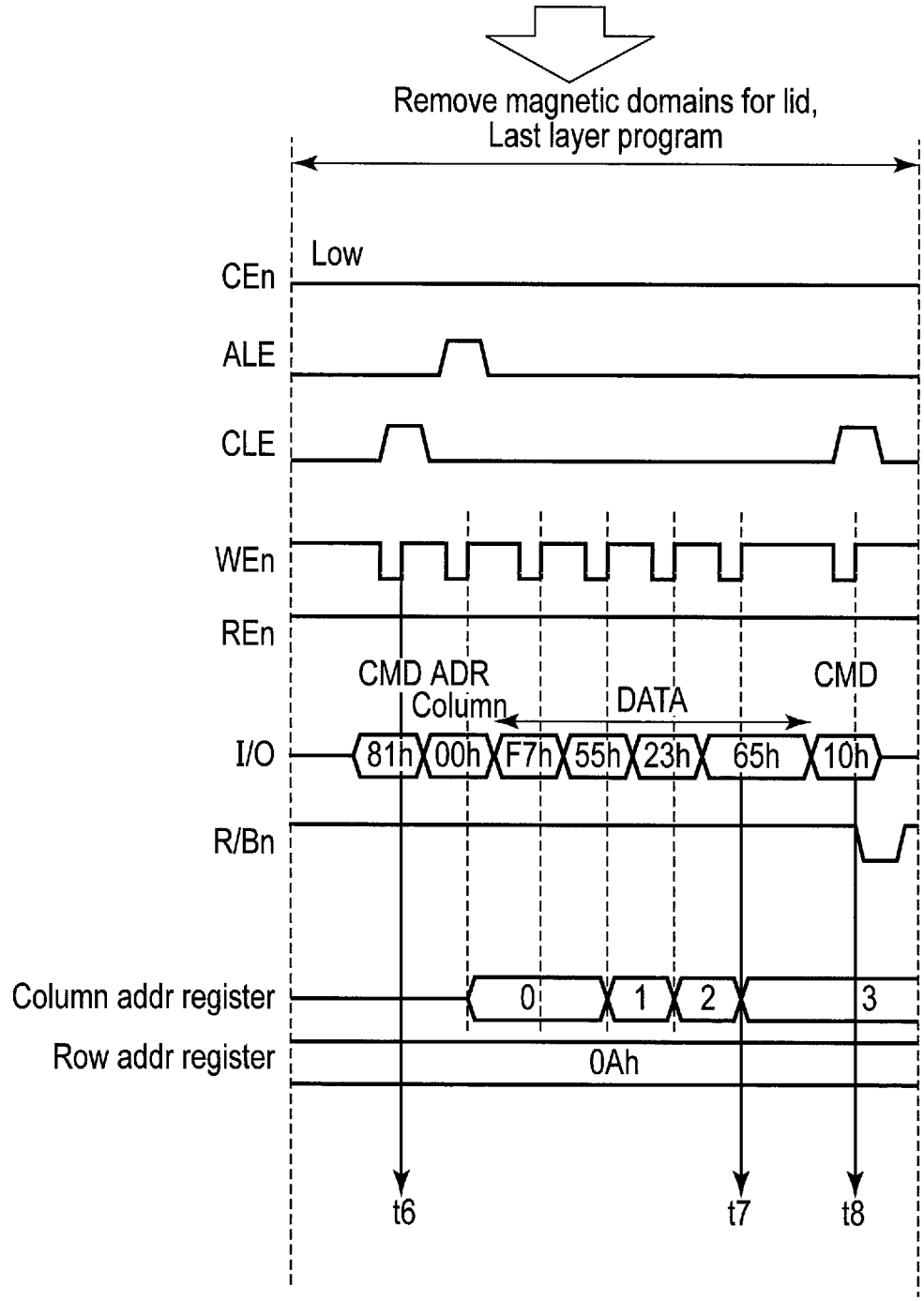
FIG. 33 is a timing chart illustrating a processing sequence executed in response to a last layer program command to remove the magnetic domains for lid and to program.

FIG. 33 is a timing chart illustrating a sequence for the final layer program command which also executes an operation of removing the magnetic domains for lid.

The memory controller 2 issues program command "81h" and asserts the command latch enable signal CLE. Subsequently, the memory controller 2 issues the column address and asserts the address latch enable signal ALE. After that, the memory controller 2 transfers the write data for one layer (for example, F7h, 55h, 23h, and 65h) to the magnetic memory 3. After that, the memory controller 2 issues program command "10h" and asserts the command latch enable signal CLE.

The row address designated by the initial layer program command is held in the row address register of the magnetic memory 3. The magnetic memory 3 selects the block corresponding to the source line SL designated by the row address, starts the operation of reading the magnetic domains for two layers from this block and the last layer program operation, and becomes a busy state.

<Write Additional Magnetic Domains for Two Layers and Read Additional Magnetic Domains for Two Layers>

Next, an operation of writing additional magnetic domains for two layers and reading additional magnetic domains for two layers will be explained.

Figure 34:
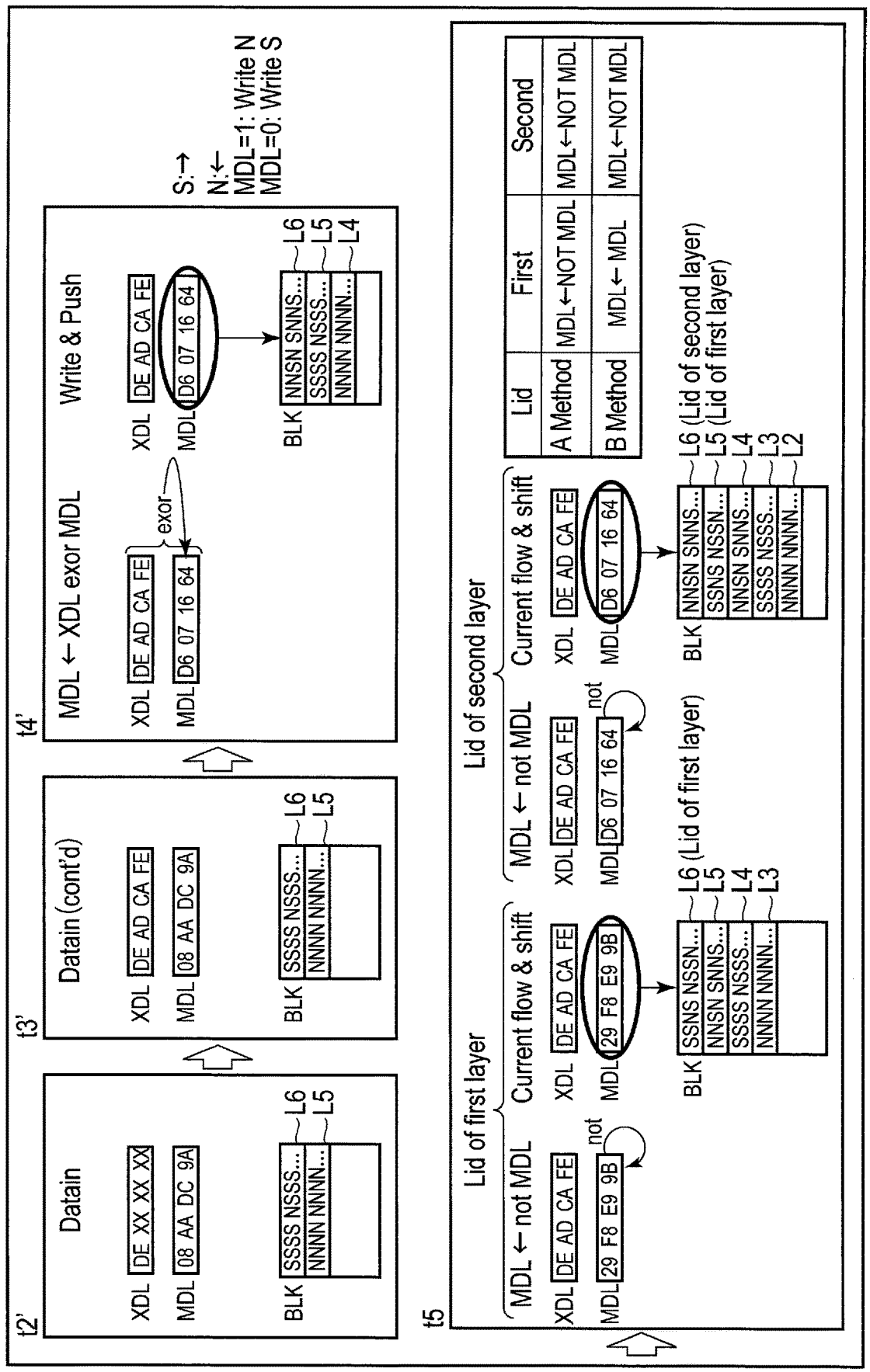
FIG. 34 is a diagram illustrating variation of data in the magnetic memory in the operation illustrated in the timing chart of FIG. 30.

FIG. 34 illustrates variation of data in the magnetic memory 3 in the operation of writing the magnetic domains for lid for two layers. In FIG. 34, each magnetic memory line MML is assumed to be composed of total six layers L1 to L6.

The variation of the data in the magnetic memory 3 at timing t2' to t4' (middle layer program operation) of the timing chart of FIG. 30, and the variation of the data in the magnetic memory 3 at timing t5 (i.e., the operation of writing the magnetic domains for lid) of the timing chart of FIG. 30, will be explained below.

At timing t2' of the timing chart of FIG. 30, the first 1-byte write data DEh of the 4-byte write data is set to XDL. In the MDL, the mdata (08h AAh DCh 9Ah) corresponding to the magnetic domains (SSSS NSSS . . . ) of the uppermost layer L6 written by the initial layer program operation has been stored.

At timing t3' of the timing chart of FIG. 30, all the 4-byte write data for one layer (DEh ADh CAh FEh) are arranged together in the XDL.

When the program command "01h" is received at timing t4' of the timing chart of FIG. 30, the magnetic memory 3 updates the mdata of the MDL in accordance with the write data for one layer stored in the XDL. In the embodiment, the combination of two adjacent magnetic domains having the same magnetization direction corresponds to data "0" and the combination of two adjacent magnetic domains having the different magnetization directions corresponds to data "1". Therefore, the magnetic memory 3 reverses the value of the bit in the MDL corresponding to the bit position of "1" in the XDL. In this case, a logical operation [XDL exor MDL] to obtain exclusive OR of the XDL and the MDL is executed, and the result of the logical operation [XDL exor MDL] is stored in the MDL, and the MDL is thereby updated.

For example, when upper 1 byte of the write data for one layer is focused, upper 1 byte of the write data is DEh (=1101 1110) and upper 1 byte of the mdata of the MDL is 08h (=0000 1000). Therefore, the bit value of the mdata corresponding to the bit position of "1" in the write data is reversed and upper 1 byte of the mdata is updated from 08h (=0000 1000) to D6h (=1101 0110).

The magnetic memory 3 makes the current flow to each of the field lines FLs, based on the updated MDL, and writes magnetic domain walls for one layer "NNSN SNNS . . . " to the write positions of all the magnetic memory lines MMLs constituting the block BLK. Then, the magnetic memory 3 executes the shift operation and pushes the magnetic domains for one layer "NNSN SNNS . . . " into the block BLK. The magnetic domains for one layer "NNSN SNNS . . . " are put into the layer L6 of all the magnetic memory lines MMLs constituting the block BLK, the magnetic domains for one layer "SSSS NSSS . . . " which have been in the layer L6 are moved to the layer L5 of the magnetic memory lines MMLs, and the magnetic domains for one layer "NNNN NNNN . . . " which have been in the layer L5 are moved to the layer L4 of the magnetic memory lines MMLs.

When the command to add the magnetic domains for lid is received at timing t5 of the timing chart of FIG. 30, the magnetic memory 3 reverses each of all the bit values of the MDl. in order to write the magnetic domains for lid of the first layer having the reversed polarity of the magnetic domains "NNSN SNNS . . . " of the layer L6. In this case, a logical operation [not MDL] to reverse each bit of MDL is executed, the result of the logical operation [not MDL] is stored in the MDL, and the content of the MDL is thereby updated.

For example, when upper 1 byte of the mdata of the MDL is focused, upper 1 byte of the mdata of the MDL is D6h (=1101 0110). Therefore, upper 1 byte of the mdata is updated from D6h (=1101 0110) to 29h (=0010 1001).

The magnetic memory 3 makes the current flow to each of the field lines FLs, based on the updated MDL, and executes the shift operation to push the magnetic domains for lid for the first layer "SSNS NSSN . . . " into the block BLK (Current flow & shift). The magnetic domains for lid for the first layer "SSNS NSSN . . . " are put into the layer L6 of all the magnetic memory lines MMLs constituting the block BLK, the magnetic domains for one layer "NNSN SNNS . . . " which have been in the layer L6 are moved to the layer L5 of the magnetic memory lines MMLs, the magnetic domains for one layer "SSSS NSSS . . . " which have been in the layer L5 are moved to the layer L4 of the magnetic memory lines MMLs, and the initial magnetic domains for one layer "NNNN NNNN . . . " which have been in the layer L4 are moved to the layer L3 of the magnetic memory lines MMLs.

Next, the magnetic memory 3 reverses each of all the bit values of the MDL in order to write the magnetic domains for lid for the second layer. In this case, a logical operation [not MDL] to reverse each bit of MDL is executed, the result of the logical operation [not MDL] is stored in the MDL, and the content of the MDL is thereby updated.

For example, when upper 1 byte of the mdata of the MDL is focused, upper 1 byte of the mdata of the MDL is 29h (=0010 1001). Therefore, upper 1 byte of the mdata is updated from 29h (=0010 1001) to D6h (=1101 0110).

The magnetic memory 3 makes the current flow to each of the field lines FLs, based on the updated MDL, executes the shift operation to push the magnetic domains for lid for the second layer "NNSN SNNS . . . " into the block BLK (Current flow & shift). The magnetic domains for lid for the second layer "NNSN SNNS . . . " are put into the layer L6 of all the magnetic memory lines MMLs constituting the block BLK, the magnetic domains for lid for the first layer "SSNS NSSN . . . " which have been in the layer L6 are moved to the layer L5, the magnetic domains for one layer "NNSN SNNS . . . " which have been in the layer L5 are moved to the layer L4 of the magnetic memory lines MMLs, the magnetic domains for one layer "SSSS NSSS . . . " which have been in the layer L4 are moved to the layer L3 of the magnetic memory lines MMLs, and the initial magnetic domains for one layer "NNNN NNNN . . . " which have been in the layer L3 are moved to the layer L2 of the magnetic memory lines MMLs.

Note that, as illustrated as B method in FIG. 34, the magnetic domains for lid of the first layer may have magnetization directions which are the same as the magnetization directions (i.e., the magnetization directions of the magnetic domains last written) referred to as MDL, and the magnetic domains for lid of the second layer may have the magnetization directions opposite to the magnetization directions of the magnetic domains for lid of the first layer. That is, the magnetic domains for lid for the first layer and the magnetic domains for lid for the second layer need to have magnetization directions opposite to each other, but the magnetic domains for lid for the first layer may have the magnetization directions determined based on the magnetization directions of the last written magnetic domains (i.e., the magnetization directions which are the same as or opposite to the magnetization directions of the last written magnetic domains).

FIG. 35 illustrates variation of data in the magnetic memory 3 in the operation of removing the magnetic domains for lid for two layers and programming.

The middle layer program command which also executes an operation of removing the magnetic domains for lid as explained with reference to the timing chart of FIG. 32 is assumed to be received.

After finishing the interleave operation, the memory controller 2 issues the program command "81h" for the magnetic memory 3 in order to restart the write operation for the block BLK, at timing t6' of the timing chart of FIG. 32. At this time, contents of XDL and MDL are indefinite.

At timing t7' of the timing chart of FIG. 32, all the write data for one layer (76h 36h 22h 90h) are arranged together in the XDL.

When the program command "11h" is received at timing t8' of the timing chart of FIG. 32, the magnetic memory 3 first reads the magnetic domains for lid "NNSN SNNS . . . " from the uppermost layer L6 of the block BLK and upwardly moves the magnetic domains of each of the layers of the block BLK by one layer, by executing the shift operation of upwardly shifting the magnetic domains of each of the layers of the block BLK. Voltages VSMP1 for one layer corresponding to the read magnetic domains for lid for one layer "NNSN SNNS . . . " are stored in the capacitors C11 for one layer, respectively.

Next, the magnetic memory 3 reads the magnetic domains for lid "SSNS NNSN . . . " from the uppermost layer L6 of the block BLK and upwardly moves the magnetic domains of each of the layers of the block BLK by one layer, by executing the shift operation of upwardly shifting the magnetic domains of each of the layers of the block BLK. Voltages SAMP2 for one layer corresponding to the read magnetic domains for lid for one layer "SSNS NSSN . . . " are stored in the capacitors C12 for one layer, respectively.

The magnetic memory 3 compares the sampling voltage VSMP1 of each capacitor C11 and the sampling voltage VSMP2 of each capacitor C12, and determines whether the magnitude relationship between VSMP1 and VSMP2 is VSMP1>VSMP2 or VSMP1<VSMP2. The magnetic memory 3 specifies the magnetization directions of the magnetic domains for lid "SSNS NSSN . . . " of the first layer, which has been in the layer L5, and updates the MDL with the mdata indicative of reverse of the magnetization directions of the magnetic domains for lid of the first layer, based on the determination result (Compare C11&C12→MDL).

For example, when upper 1 byte of the mdata of the MDL is focused, the magnetic domains for upper 1 byte of the magnetic domain for lid of the first layer are "SSNS NSSN". Therefore, upper 1 byte of the updated MDL becomes D6h (=1101 0110) indicative of the reversed polarity "NNSN SNNS" of "SSNS NSSN". As a result, the content of the MDL immediately before writing the magnetic domains for lid of two layers (i.e., the directions of the currents used for write of the magnetic domains for one layer which are current in the layer L6) can be restored.

The magnetic memory 3 can therefore restart the middle layer program for the block BLK, based on the content of the XDL and the content of the restored MDL.

A flowchart of FIG. 36 illustrates a procedure of the operation of adding the magnetic domains for two layers and reading the magnetic domains for lid for two layers.

The magnetic memory 3 determines which of the middle layer program, the last layer program, and the initial layer program is the program operation which should be executed, in accordance with the program command received from the memory controller 2 (steps S101 to S103).

If the type of the program operation which should be executed is the middle layer program or the last layer program (YES in step S101 or YES in step S102), the magnetic memory 3 sets the write data for one layer transferred from the memory controller 2 in the XDL (step S104). The magnetic memory 3 executes a logical operation [XDL exor MDL] to obtain exclusive OR of XDL and MDL, and stores the result of the logical operation [XDL exor MDL] in the MDL to update the content of the MDL (step S105). The magnetic memory 3 drives the FL driver 213 to generate a magnetic field in the field line FL corresponding to each magnetic memory line MML in the block BLK, based on the value of MDL (step S109). The magnetic memory 3 executes the shift operation, thereby puts the magnetic domains corresponding to the write data for one layer into the uppermost layer of the magnetic memory lines MMLs to downwardly shift (move) the magnetic domains of each layer of the magnetic memory lines MMLs by one layer (step S110).

If the type of the program operation which should be executed is the initial layer program (YES in step S103), the magnetic memory 3 puts the initial magnetic domains for one layer into the uppermost layer of the magnetic memory lines MMLs (step S106). In step S106, the magnetic memory 3 sets all 1 or all 0 in the MDL. The magnetic memory 3 drives the FL driver 213, based on the value of MDL, to generate magnetic fields corresponding to the same magnetization direction in all the field lines FL corresponding to the magnetic memory lines MMLs in the block BLK, and the magnetic memory 3 executes a shift operation and thereby puts the initial magnetic domains for one layer into uppermost layer of the magnetic memory lines MMLs.

After the initial magnetic domains for one layer are put into the uppermost layer of the magnetic memory lines MMLs, the magnetic memory 3 sets the write data for one layer transferred from the memory controller 2, in the XDL (step S107). The magnetic memory 3 executes a logical operation [XDL exor MDL] to obtain exclusive OR of XDL and MDL, and stores the result of the logical operation [XDL exor MDL] in the MDL to update the content of the MDL (step S108). Then, the magnetic memory 3 executes the processing in steps S109 and S110, puts the magnetic domains for one layer corresponding to the write data for one layer into the uppermost layer of the magnetic memory lines MMLs to downwardly move the initial magnetic domain by one layer.

If the type of the program operation which should be executed is the operation of adding the magnetic domains for lid (putting a lid), i.e., when a command to add the magnetic domains for lid is received (YES in step S111), the magnetic memory 3 first executes the processing of steps S113 to S115 in order to program the magnetic domain for lid to the block BLK.

In step S113, the magnetic memory 3 executes a logical operation [not MDL] to reverse each bit of the MDL, and stores the result of the logical operation [not MDL] in the MDL to update the content of the MDL.

In step S114, the magnetic memory 3 drives the FL driver 213 to generate a magnetic field in the field line FL corresponding to each magnetic memory line MML in the block BLK, based on the value of MDL.

In step S115, the magnetic memory 3 executes the shift operation, thereby puts the magnetic domains for lid for one layer into the uppermost layer of the magnetic memory lines MMLs to downwardly shift (move) the magnetic domains of each layer of the magnetic memory lines MMLs by one layer.

Next, the magnetic memory 3 executes the processing of steps S116, S109, and S110 in order to program the magnetic domains for lid of the second layer to the block BLK.

In step S116, the magnetic memory 3 executes a logical operation [not MDL] to reverse each bit of the MDL, and stores the result of the logical operation [not MDL] in the MDL, to update the content of the MDL.

In step S109, the magnetic memory 3 drives the FL driver 213 to generate a magnetic field in the field line FL corresponding to each magnetic memory line MML in the block BLK, based on the value of MDL.

In step S110, the magnetic memory 3 executes the shift operation, thereby puts the magnetic domains for lid of the second layer into the uppermost layer of the magnetic memory lines MMLs to downwardly shift (move) the magnetic domains of each layer of the magnetic memory lines MMLs by one layer.

If the type of the program operation which should be executed is the operation of removing the magnetic domains for lid (taking off a lid), i.e., when a command to remove the magnetic domains for lid and to program is received (YES in step S112), the magnetic memory 3 first upwardly moves the magnetic domains of each layer of the magnetic memory lines MMLs by two layers, and reads the magnetic domains for lid of the second layer and the magnetic domains for lid of the first layer from the magnetic memory lines MMLs (step S117). The magnetic memory 3 restores "value of the direction of the current", i.e., mdata indicative of the direction of the current flowing to the field line FL at the last write of the write data for one layer to the block BLK, on the basis of the read magnetic domains for lid of the second layer and the read magnetic domains for lid of the first layer, and sets the restored "value of the direction of the current" in the MDL (step S118).

When one magnetic memory line MML is focused, in step S118, the magnetic memory 3 specifies the direction of the current used to generate in the field line FL the induced magnetic field to form the magnetic domain put into the magnetic memory line MML before the magnetic domain for lid Mx, based on the magnitude relationship between VSMP1 (first sampling value) corresponding to the resistant state of the magnetoresistive element 11 resulting from the magnetization direction of the magnetic domain for lid My read from the magnetic memory line MML and VSMP2 (second sampling value) corresponding to the resistant state of the magnetoresistive element 11 resulting from the magnetization direction of the magnetic domain for lid Mx read from the magnetic memory line MML. Then, the magnetic memory 3 restores the content of the MDL such that the mdata is indicative of the specified direction of the current.

After the content of the MDL is restored, the magnetic memory 3 programs the write data for one layer, which is associated with the command to remove the magnetic domains for lid and to program, in the block BLK (steps S119, S120, S109, and S110).

In step S119, the magnetic memory 3 sets the write data for one layer transferred from the memory controller 2, in the XDL.

In step S120, the magnetic memory 3 executes a logical operation [XDL exor MDL] to obtain exclusive OR of the XDL and the restored MDL, and stores the result of the logical operation [XDL exor MDL] in the MDL to update the content of the MDL.

In step S109, based on the value of MDL, the magnetic memory 3 drives the FL driver 213 to generate a magnetic field in the field line FL corresponding to each magnetic memory line MML in the block BLK.

In step S110, the magnetic memory 3 executes the shift operation, thereby puts the magnetic domains for lid for one layer corresponding to the write data for one layer into the uppermost layer of the magnetic memory lines MMLs, and downwardly shifts (moves) the magnetic domains of each layer of the magnetic memory lines MMLs by one layer.

Next, the operations of writing an additional magnetic domain for one layer, reading the magnetic domains for two layers, and writing back a magnetic domain for one layer will be explained.

FIG. 37 illustrates variation of data in the magnetic memory 3 in the operation of writing the magnetic domains for lid for one layer. In FIG. 37, each magnetic memory line MML is assumed to be composed of total six layers L1 to L6.

The variation of the data in the magnetic memory 3 at timing t2' to t4' (middle layer program operation) of the timing chart of FIG. 30, and the variation of the data in the magnetic memory 3 at timing t5 (i.e., the operation of writing the magnetic domains for lid) of the timing chart of FIG. 30, will be explained below.

The operations executed at timing t2' to t4' of the timing chart of FIG. 30 are the same as the operations explained with reference to FIG. 34.

When receiving the command to add the magnetic domains for lid at timing t5 of the timing chart of FIG. 30, the magnetic memory 3 reverses each of all the bit values of the MDL in order to write the magnetic domains for lid for one layer having the reversed polarity of the magnetic domains "NNSN SNNS . . . " of the layer L6. In this case, a logical operation [not MDL] to reverse each bit of MDL is executed, the result of the logical operation [not MDL] is stored in the MDL, and the MDL is thereby updated.

For example, when upper 1 byte of the mdata of the MDL is focused, upper 1 byte of the mdata of the MDL is D6h (=1101 0110). Therefore, upper 1 byte of the mdata is updated from D6h (=1101 0110) to 29h (=0010 1001).

The magnetic memory 3 makes the current flow to each of the field lines FLs, based on the updated MDL, executes the shift operation, and pushes the magnetic domains for lid for one layer "SSNS NSSN . . . " into the block BLK (Write & push). The magnetic domains for lid for one layer "SSNS NSSN . . . " are pushed into the layer L6 of all the magnetic memory lines MMLs constituting the block BLK, the magnetic domains for one layer "NNSN SNNS . . . " which have been in the layer L6 are moved to the layer L5 of the magnetic memory lines MMLs, the magnetic domains for one layer "SSSS NSSS . . . " which have been in the layer L5 are moved to the layer L4 of the magnetic memory lines MMLs, and the initial magnetic domains for one layer "NNNN NNNN . . . " which have been in the layer L4 are moved to the layer L3 of the magnetic memory lines MMLs.

Figure 38:
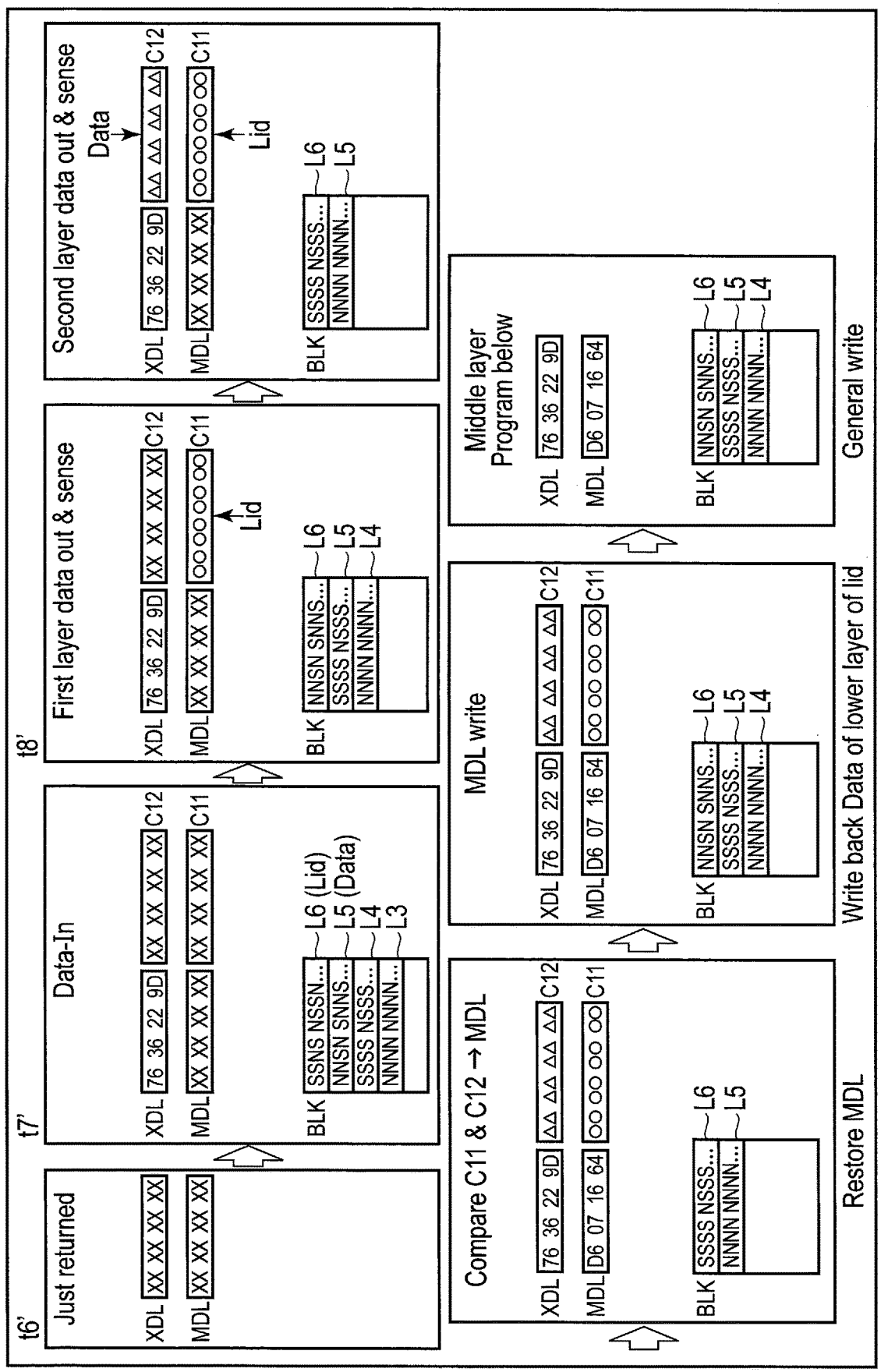
FIG. 38 is a diagram illustrating variation of data in the magnetic memory in the operation of reading the magnetic domains for lid for one layer.

FIG. 38 illustrates variation of data in the magnetic memory 3 in the operation of removing the magnetic domains for lid for one layer and programming.

The middle layer program command which also executes an operation of removing the magnetic domains for lid as explained with reference to the timing chart of FIG. 32 is assumed to be received.

After finishing the interleave operation, the memory controller 2 issues the program command "81h" for the magnetic memory 3 in order to restart the write operation for the block BLK, at timing t6' of the timing chart of FIG. 32. At this time, contents of XDL and MDL are indefinite.

As illustrated in FIG. 38, at timing t7' of the timing chart of FIG. 32, all the write data for one layer (76h 36h 22h 90h) are arranged together in the XDL.

When receiving the program command "11h" at timing t8' of the timing chart of FIG. 32, the magnetic memory 3 first executes the shift operation of upwardly shifting the magnetic domains of each layer of the block BLK, thereby reads the magnetic domains for lid "SSNS NSSN . . . " from the uppermost layer L6 of the block BLK and upwardly moves the magnetic domains of each layer of the block BLK by one layer. Voltages VSMP1 for one layer corresponding to the read magnetic domains for lid for one layer "SSNS NSSN . . . " are stored in the capacitors C11 for one layer, respectively.

Next, the magnetic memory 3 executes the shift operation of upwardly shifting the magnetic domains of each layer of the block BLK, thereby reads the magnetic domain for one layer "NNSN SNNS . . . " from the uppermost layer L6 of the block BLK and upwardly moves the magnetic domains of each layer of the block BLK by one layer. Voltages VSMP2 for one layer corresponding to the read magnetic domains for one layer "NNSN SNNS . . . " are stored in the capacitors C12 for one layer, respectively.

The magnetic memory 3 compares the sampling voltage VSMP1 of each capacitor C11 and the sampling voltage VSMP2 of each capacitor C12, and determines whether the magnitude relationship between VSMP1 and VSMP2 is VSMP1>VSMP2 or VSMP1<VSMP2. The magnetic memory 3 can determine the magnetization directions of the magnetic domains for one layer "NNSN SNNS . . . " which has been in the layer L5, based on the determination result. The magnetic memory 3 restores the content of the MDL before the magnetic domains for lid are added, by using the mdata indicative of the determined magnetization directions of the magnetic domains.

For example, when upper 1 byte of the mdata of the MDL is focused, the magnetic domains for upper 1 byte of the write data for one layer which has been in the layer L5 are "NNSN SNNS". Therefore, upper 1 byte of the restored MDL becomes D6h (=1101 0110) indicative of "NNSN SNNS".

The magnetic memory 3 writes back the magnetic domains for one layer "NNSN SNNS . . . " having the specified magnetization directions to the uppermost layers L6 of the magnetic memory lines MMLs included in the block BLK, and downwardly moves the magnetic domains of each layer of the magnetic memory lines MMLs by one layer (MDL write).

In the MDL write, the magnetic memory 3 makes the current flow to each of the field lines FLs, based on the restored MDL, executes the shift operation, and thereby pushes the magnetic domains for one layer "NNSN SNNS . . . " corresponding to the write data for one layer into the block BLK. The magnetic domains for one layer "NNSN SNNS . . . " corresponding to the write data for one layer are put into the layer L6 of all the magnetic memory lines MMLs constituting the block BLK, and the magnetic domains of each layer of the magnetic memory lines MMLs are moved by one layer.

Thus, the content of the MDL immediately before writing the magnetic domains for lid is restored, and the magnetic domains for one layer corresponding to the write data for one layer is written back to the block BLK. The magnetic memory 3 can therefore restart the middle layer program for the block BLK, based on the content of the XDL and the content of the restored MDL.

Figure 39:
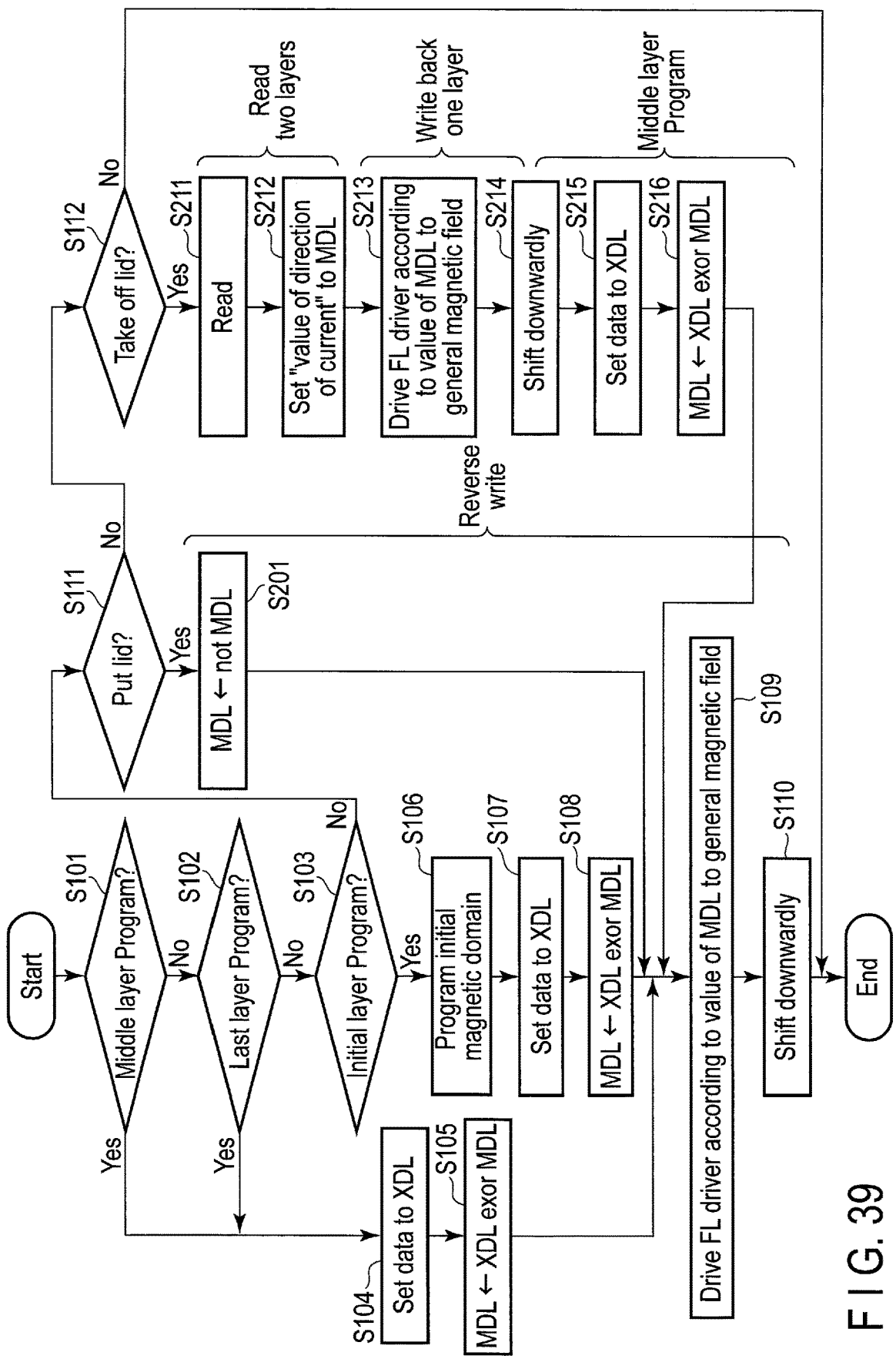
FIG. 39 is a flowchart illustrating a procedure of operations of adding magnetic domains for lid for one layer, reading the magnetic domains for lid for one layer and magnetic domains for write data for one layer, and writing back the magnetic domains for write data for one layer.

A flowchart of FIG. 39 illustrates a procedure of operations of adding magnetic domains for lid for one layer, reading the magnetic domains for lid for one layer and magnetic domains for write data for one layer, and writing back the magnetic domains for write data for one layer.

The procedure of the initial layer program operation, the middle layer program operation, and the last layer program operation is the same as the procedure explained with reference to the flowchart of FIG. 36. The procedure in FIG. 39 is different from the procedure explained with reference to the flowchart of FIG. 36 with respect to the operation executed by the magnetic memory 3 when receiving the command to add the magnetic domains for lid from the memory controller (YES in step S111), and the operation executed by the magnetic memory 3 when receiving the command to remove the magnetic domain for lid and to program from the memory controller 2 (YES in step S112). These operations will be explained below.

If the type of the program operation which should be executed is the operation of adding the magnetic domains for lid (putting a lid), i.e., when a command to add the magnetic domains for lid issued by the memory controller 2 is received (YES in step S111), the magnetic memory 3 first executes the processing of steps S201, S109, and S110 in order to program the magnetic domains for lid for one layer to the block BLK.

In step S201, the magnetic memory 3 executes a logical operation [not MDL] to reverse each bit of the MDL, and stores the result of the logical operation [not MDL] in the MDL to update the content of the MDL.

In step S109, the magnetic memory 3 drives the FL driver 213 to generate a magnetic field in the field line FL corresponding to each magnetic memory line MML in the block BLK, based on the value of MDL.

In step S110, the magnetic memory 3 executes the shift operation, thereby puts the magnetic domains for lid for one layer into the uppermost layer of the magnetic memory lines MMLs, and downwardly shifts (moves) the magnetic domains of each layer of the magnetic memory lines MMLs by one layer.

If the type of the program operation which should be executed is the operation of removing the magnetic domains for lid (taking off a lid), i.e., when the command to remove the magnetic domains for lid and to program is received (YES in step S112), the magnetic memory 3 first upwardly moves the magnetic domains of each layer of the magnetic memory lines MMLs by two layers, and reads the magnetic domains for lid for one layer and the magnetic domains for one layer corresponding to the write data for one layer from the magnetic memory lines MMLs (step S211). Based on the read magnetic domains for lid for one layer and the read magnetic domains for one layer corresponding to the write data for one layer, the magnetic memory 3 restores "value of the direction of the current", i.e., the mdata indicative of the direction of the current flowing to the field line FL at the write of the magnetic domains for one layer corresponding to the write data for one layer, and sets the restored "value of the direction of the current" in the MDL (step S212).

After the content of the MDL is restored, the magnetic memory 3 writes back the magnetic domains for one layer corresponding to the write data for one layer to the uppermost layer of the magnetic memory lines MMLs (steps S213 and S214).

In step S213, the magnetic memory 3 drives the FL driver 213 to generate a magnetic field in the field line FL corresponding to each magnetic memory line MML in the block BLK, based on the value of MDL.

In step S214, the magnetic memory 3 executes the shift operation, thereby puts the magnetic domains for one layer corresponding to the write data for one layer into the uppermost layer of the magnetic memory lines MMLs, and downwardly shifts (moves) the magnetic domains of each layer of the magnetic memory lines MMLs by one layer.

After the content of the MDL is restored and the magnetic domains for one layer are written back, the magnetic memory 3 programs new write data for one layer associated with the command to remove the magnetic domains for lid and to program, in the block BLK (steps S215, S216, S109, and S110).

In step S215, the magnetic memory 3 sets the write data for one layer transferred from the memory controller 2, in the XDL.

In step S216, the magnetic memory 3 executes a logical operation [XDL exor MDL] to obtain exclusive OR of the XDL and the restored MDL, stores the result of the logical operation [XDL exor MDL] in the MDL, and thereby updates the content of the MDL.

In step S109, the magnetic memory 3 drives the FL driver 213 based on the value of MDL to generate a magnetic field in the field line FL corresponding to each magnetic memory line MML in the block BLK.

In step S110, the magnetic memory 3 executes the shift operation, thereby puts the magnetic domains for one layer corresponding to the write data for one layer into the uppermost layer of the magnetic memory lines MMLs, and downwardly shifts (moves) the magnetic domains of each layer of the magnetic memory lines MMLs by one layer.

Figure 40:
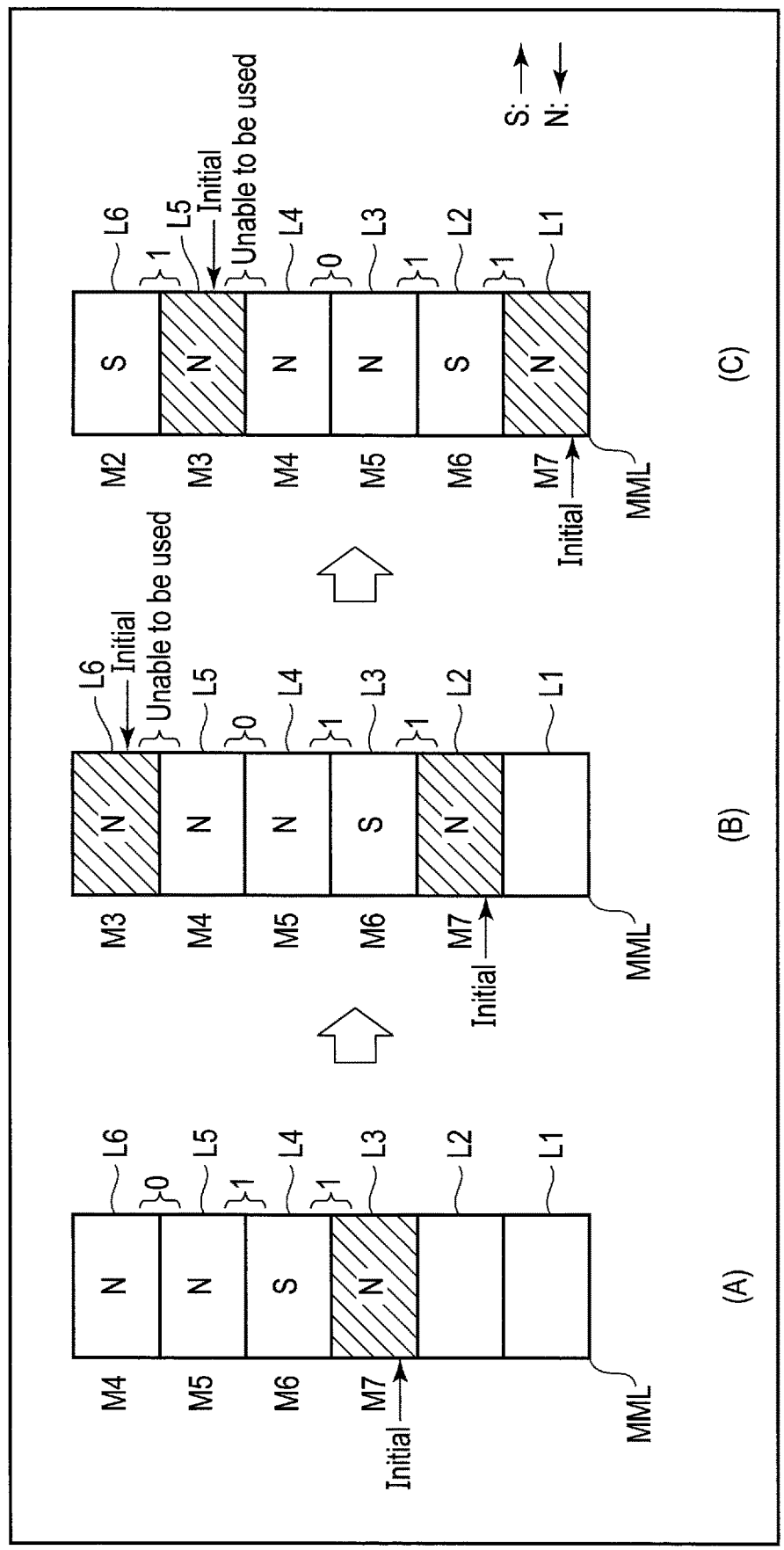
FIG. 40 is a diagram illustrating an operation of adding the magnetic domains having a fixed magnetization direction as the magnetic domains for lid by using the initial layer program command.

FIG. 40 illustrates an operation of adding the magnetic domains having a predetermined fixed magnetization direction as the magnetic domains for lid. The predetermined fixed magnetization direction is used as the referential magnetization direction necessary to determine the magnetization direction of the next written magnetic domain, similarly to the above-explained initial magnetic domain.

(A) of FIG. 40 illustrates a state in which the initial magnetic domain M7 (N) is stored in the layer L3 of the magnetic memory line MML, the magnetic domain M6 (S) is stored in the layer L4, the magnetic domain M5 (N) is stored in the layer L5, and the magnetic domain M4 (N) is stored in the uppermost layer L6.

When receiving the command to add the magnetic domains for lid, in this state, the magnetic memory 3 puts the initial magnetic domain M3 (N in this example) having a predetermined fixed magnetization direction into the uppermost layer L6 and downwardly moves the magnetic domain of each layer of the magnetic memory line MML by one layer as illustrated in (B) of FIG. 40.

When receiving the program command, the magnetic memory 3 puts the magnetic domain M2 having the magnetization direction which is the same as or opposite to the magnetization direction of the initial magnetic domain M3 into the uppermost layer L6, based on the value of the write data associated with the program command and the magnetization direction of the initial magnetic domain M3, and downwardly moves the magnetic domain of each layer of the magnetic memory line MML by one layer as illustrated in (C) of FIG. 40. For example, when the value of the write data is "1", the magnetic memory 3 puts the magnetic domain M2 (S) having the magnetization direction which is opposite to the magnetization direction of the initial magnetic domain M3 (N), into the uppermost layer L6, and downwardly moves the magnetic domains of the respective layers of the magnetic memory line MML by one layer. In contrast, when the value of the write data is "0", the magnetic memory 3 puts the magnetic domain M2 (N) having the magnetization direction which is the same as the magnetization direction of the initial magnetic domain M3 (N), into the uppermost layer L6, and downwardly moves the magnetic domains of the respective layers of the magnetic memory line MML by one layer.

In the configuration of adding the initial magnetic domain having the predetermined fixed magnetization direction as the magnetic domain for lid, the memory controller 2 may issue to the magnetic memory 3 the command to add the magnetic domains for lid when starting the interleave operation of executing the processing for a block other than the block BLK in which the write is being executed, and may issue the program command to the magnetic memory 3 when restarting the write operation for the block BLK of the interleave source after executing the interleave operation.

Alternatively, when restarting the write operation to the block BLK of the interleave source, the memory controller 2 may issue to the magnetic memory 3 the command to add the magnetic domain for lid and the program command.

Thus, in the configuration of adding the initial magnetic domain having the predetermined fixed magnetization direction as the magnetic domains for lid, the bit information indicated by a combination of the initial magnetic domain having the fixed magnetization direction and the magnetic domain of the lower layer thereof is invalidated but the initial magnetic domain having the fixed magnetization direction does not need to be read. The information indicating in which layer the initial magnetic domain having the fixed magnetization direction is put is held by the memory controller 2.

In addition, in the configuration of adding the initial magnetic domain having the predetermined fixed magnetization direction as the magnetic domains for lid, the command to add the magnetic domains for lid and the program command can be implemented as one initial layer program command explained above.

In this case, when restarting the write operation for the block BLK after executing the interleave operation, the memory controller 2 may issue the initial layer program command to the magnetic memory 3.

Figure 41:
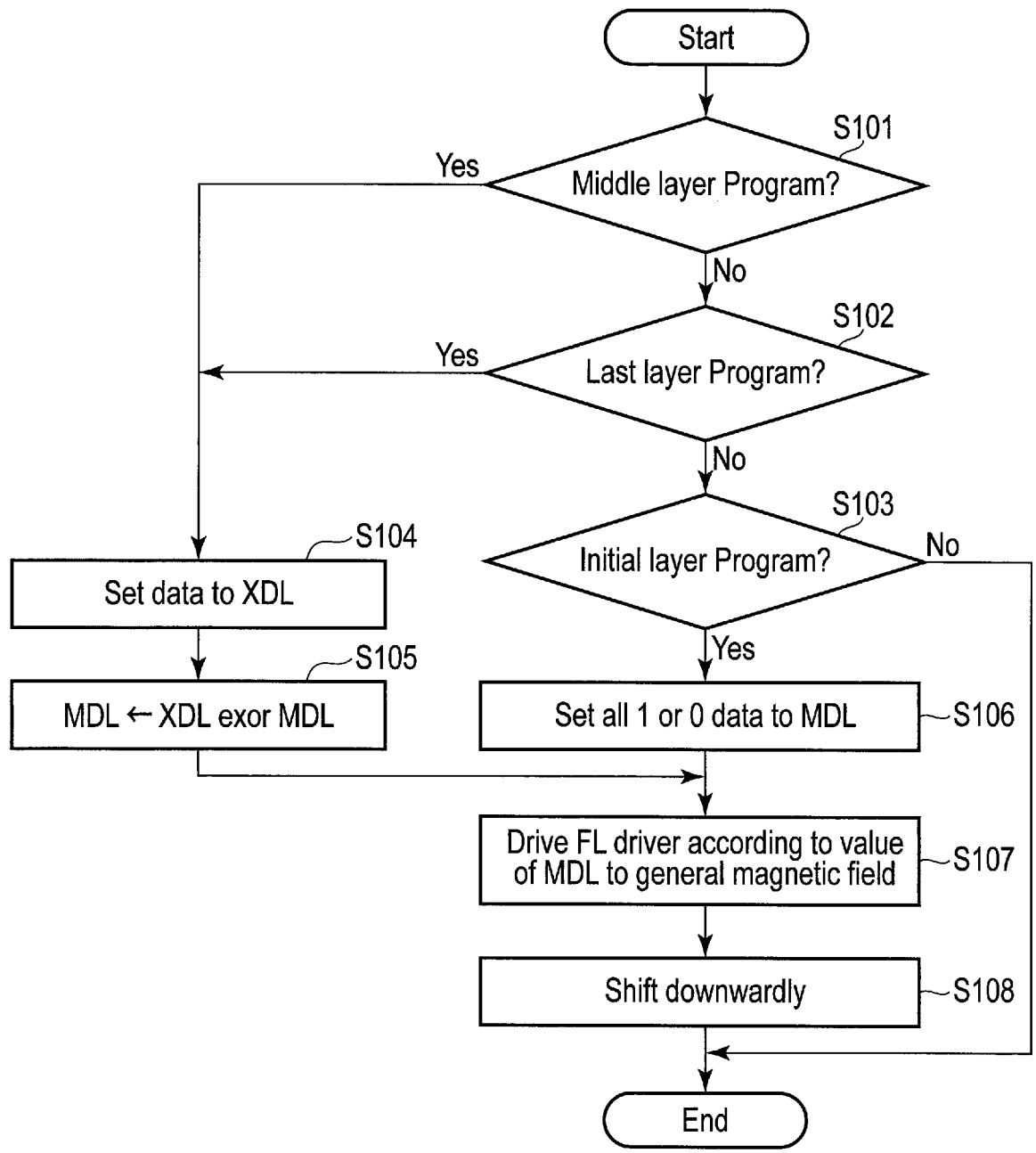
FIG. 41 is a flowchart illustrating a procedure of an operation of adding the magnetic domains having a fixed magnetization direction as the magnetic domains for lid.

A flowchart of FIG. 41 illustrates a procedure of an operation of adding the magnetic domains having a fixed magnetization direction as the magnetic domains for lid.

Basically, when receiving a command to add the magnetic domains for lid from the memory controller 2, the magnetic memory 3 puts the magnetic domain having a fixed magnetization direction into the uppermost layer of the magnetic memory line MML and downwardly moves the magnetic domains of the respective layers of the magnetic memory line MML, by one layer. When receiving the command to remove the magnetic domains for lid and to program from the memory controller 2, the memory controller 2 puts the magnetic domain having the magnetization direction which is the same as or opposite to the fixed magnetization direction into the uppermost layer of the magnetic memory line MML and downwardly moves the magnetic domains of the respective layers of the magnetic memory line MML by one layer.

In a case where the command to add the magnetic domains for lid and the program command are implemented as one initial layer program command, the same processing as that in steps S101 to S108 explained with reference to the flowchart of FIG. 36 may be executed as illustrated in the flowchart of FIG. 41.

Next, a function of maintaining the content of MDL will be explained.

Figure 42:
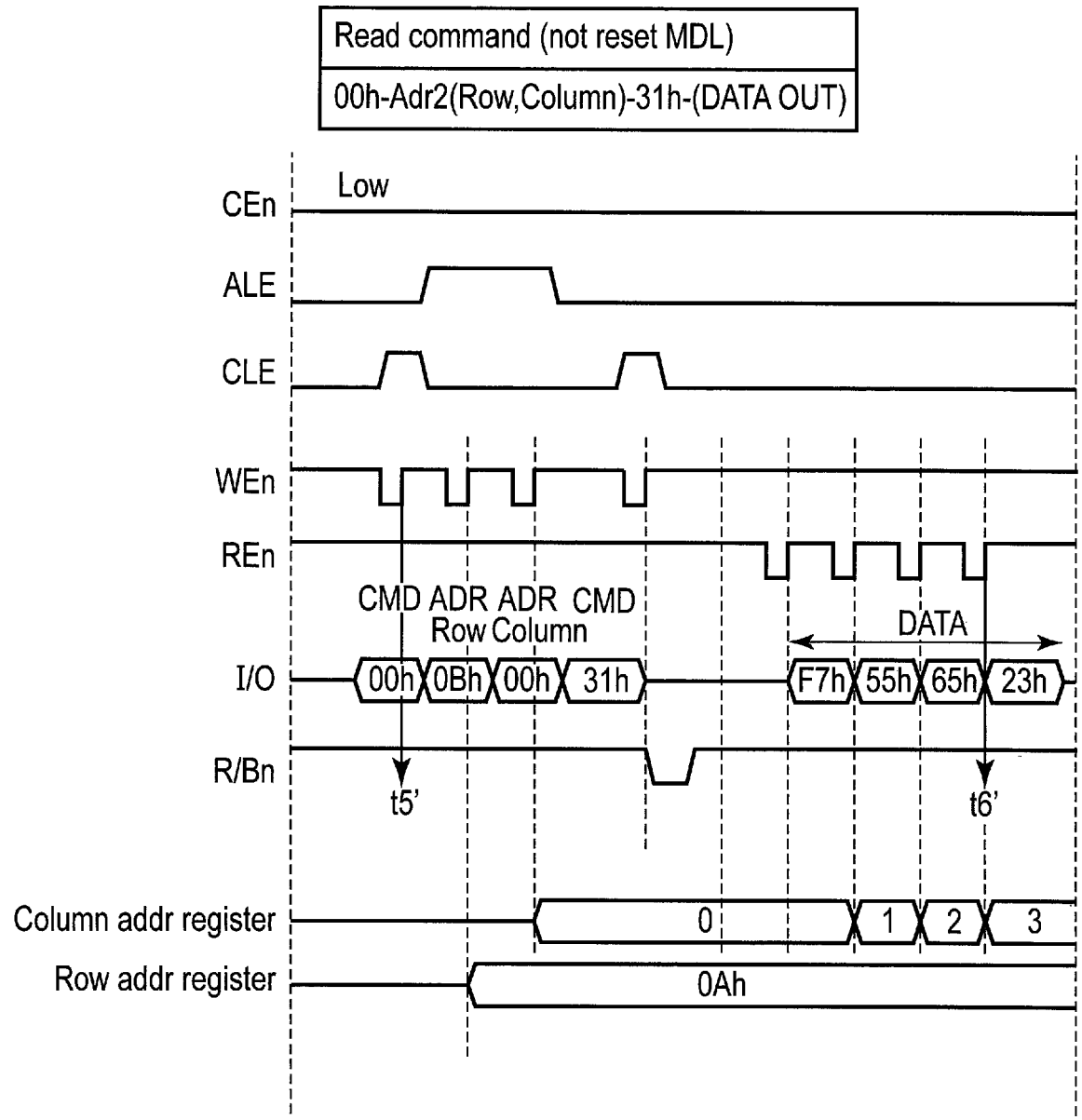
FIG. 42 is a timing chart illustrating a read operation which does not reset a data latch circuit (MDL) storing the magnetic data indicative of the magnetization direction of the last programmed layer.

A timing chart of FIG. 42 illustrates a read operation which does not reset MDL holding mdata indicative of the magnetization direction of the last programmed layer.

A read command which does not reset the MDL is used in this example. The command sequence of this read command includes, for example, read command "00h", row address, column address, and read command 31h as illustrated in FIG. 42. The last read command included in the command sequence of the general read command that permits resetting of the MDL is "30h", but the last read command included in the command sequence of the read command which does not reset the MDL is changed to "31h".

When the read operation of the other block is to be started during write to a certain block BLK, the memory controller transmits a command sequence (read command "00h", row address, column address, and read command "31h") to read the data for one layer from the other block in the magnetic memory 3, to the magnetic memory 3.

That is, the memory controller 2 issues the read command "00h" and asserts the command latch enable signal CLE. Subsequently, the memory controller 2 issues addresses (row address and column address) in, for example, two cycles and asserts the address latch enable signal ALE. The row address designates one source line SL corresponding to the block of the interleave destination from which the data is to be read. The column address designates, for example, one of a plurality of columns. After that, the memory controller 2 issues the read command "31h" and asserts the command latch enable signal CLE.

When receiving the read command "31h", the magnetic memory 3 starts the operation of reading the data from the block corresponding to the source line SL designated by the row address, without resetting MDL, and becomes a busy state. In the magnetic memory 3, the shift operation of upwardly moving the magnetic domains of the respective layers of this block is executed at two times, and the magnetic domains for two layers, i.e., the magnetic domains of the uppermost layer Ln and the magnetic domains of the layer Ln-1 adjacent to the uppermost layer are read from this block. Then, the data for one layer obtained by comparing the magnetic domains of the uppermost layer Ln and the magnetic domains of the layer Ln-1 are held in the latch circuit XDL in the magnetic memory 3. In FIG. 42, the data size corresponding to one layer is set to 4 bytes to simplify the illustration.

After that, when the magnetic memory 3 becomes a ready state, the memory controller 2 repeats asserting the read enable signal REn. Every time the read enable signal REn is asserted, the data in the data latch circuit XDL are transmitted in a 1-byte unit to the controller 2.

Figure 43:
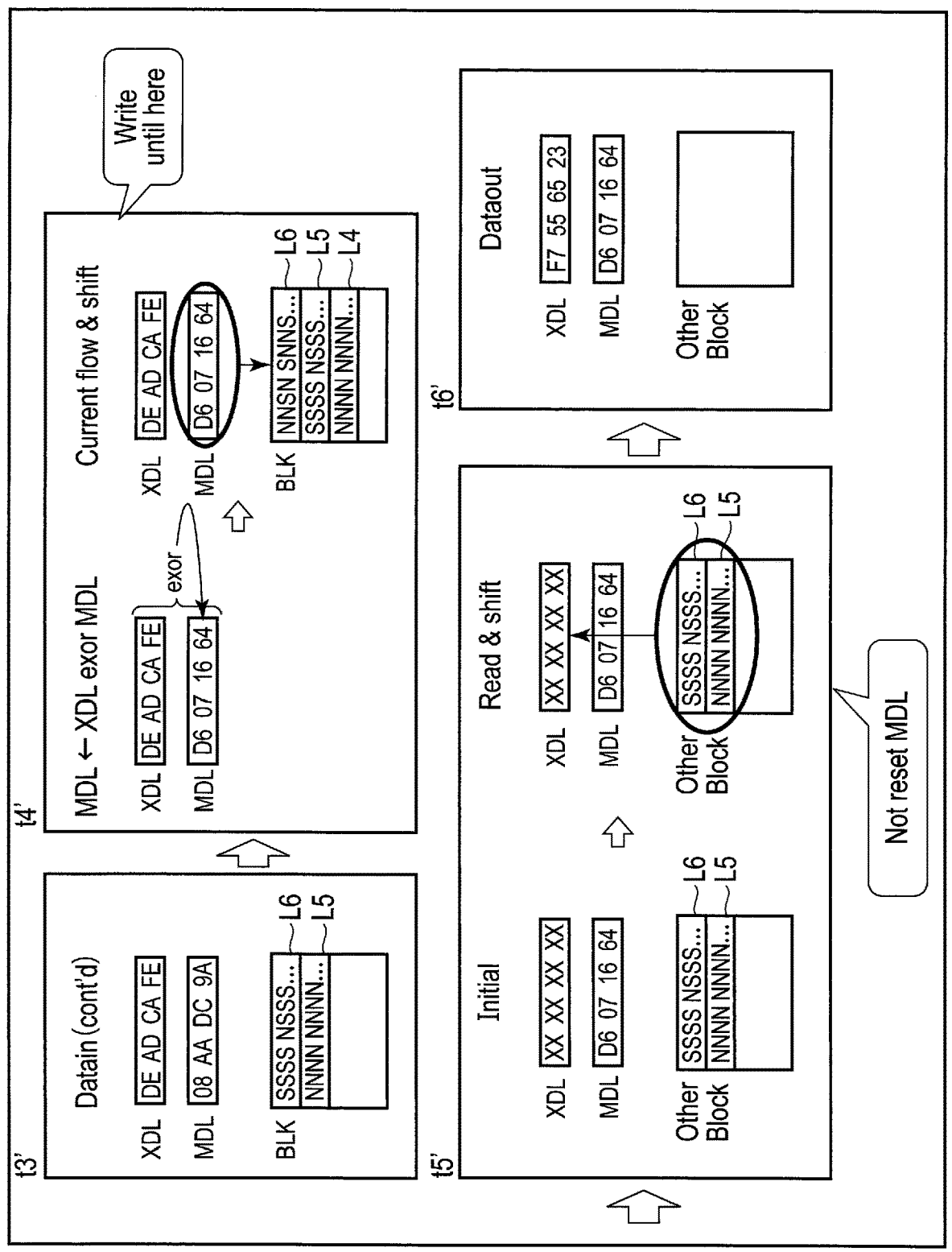
FIG. 43 is a diagram illustrating variation of data in the magnetic memory in the read operation illustrated in the timing chart of FIG. 42.

FIG. 43 illustrates variation of data in the magnetic memory 3 in the read operation illustrated in the timing chart of FIG. 42.

In FIG. 43, t3' and t4' are indicative of the middle layer program operations explained with reference to the timing chart of FIG. 30.

At timing t3', all the write data for one layer (DEh ADh CAh FEh) are arranged together in the XDL.

When the program command "01h" is received at timing t4', the magnetic memory 3 updates the mdata of MDL in accordance with the write data for one layer stored in the XDL. In this case, a logical operation [XDL exor MDL] to obtain exclusive OR of XDL and MDL is executed, the result of the logical operation [XDL exor MDL] is stored in the MDL, and the content of the MDL is thereby updated.

For example, when upper 1 byte of the write data for one layer is focused, upper 1 byte of the write data is DEh (=1101 1110) and upper 1 byte of the mdata of the MDL is 08h (=0000 1000). Therefore, upper 1 byte of the mdata is updated from 08h (=0000 1000) to D6h (=1101 0110).

The magnetic memory 3 makes the current flow to each of the field lines FLs, based on the updated MDL, and writes magnetic domains for one layer "NNSN SNNS . . . " to the write positions of all the magnetic memory lines MMLs constituting the block BLK. Then, the magnetic memory 3 executes the shift operation and pushes the magnetic domains for one layer "NNSN SNNS . . . " into the block BLK. The magnetic domains for one layer "NNSN SNNS . . . " are put into the layer L6 of all the magnetic memory lines MMLs constituting the block BLK, the magnetic domains for one layer "SSSS NSSS . . . " which have been in the layer L6 are moved to the layer L5 of the magnetic memory lines MMLs, and the initial magnetic domains for one layer "NNNN NNNN . . . " which have been in the layer L5 are moved to the layer L4 of the magnetic memory lines MMLs.

In FIG. 43, t5' and t6' are indicative of the data read operations explained with reference to the timing chart of FIG. 42.

When receiving the command sequence including the read command "00h", row address, the column address, and the read command "31h", the magnetic memory 3 starts the read operation for the other block designated by the row address, without resetting MDL.

The magnetic memory 3 executes the shift operation of upwardly moving each magnetic domain of each of the magnetic memory lines MMLs constituting the other block BLK by one layer, at two times. In each of the magnetic memory lines MMLs, each magnetic domain is moved upwardly by two layers, and the magnetic domains for two layers "SSSS NSSS . . . " and "NNNN NNNN . . . " are read from the other block BLK. The magnetic memory 3 generates the output data for one layer (4-byte data in this example) by comparing two voltages VSMP1 and VSMP2 corresponding to each bit line BL, and stores the output data in XDL. For example, when upper 1 byte of the output data is focused, upper 1 byte of the output data is "1111 01111" (=F7h) since the magnetic domains for upper 1 byte of the layer L6 is "SSSS NSSS" and the magnetic domain for high-order 1 byte of the layer L5 is "NNNN NNNN".

For example, in a case of executing the data read operation for the block of interleave destination, and restarting the write operation of the block in which write is being executed (block BLK of interleave source) after executing the interleave operation, the memory controller 2 may not issue the command to add the magnetic domain for lid, but may issue the read command which does not reset the MDL to the block of the interleave destination.

In contrast, in a case of executing the data write operation for the block of interleave destination, or a case of executing the data read operation for the block of interleave destination and further executing the data write operation for a block other than the block of the interleave destination after executing the interleave operation, the memory controller 2 may issue the command to add the magnetic domains for lid for the block BLK of interleave source. Alternatively, when restarting the data write operation for the block BLK of interleave source, the memory controller 2 may issue the initial layer program command again for the block BLK, in order to restart the write operation from the write of the magnetic domains having the fixed magnetization direction.

Thus, the memory controller 2 can execute flexible operations for a plurality of blocks, by issuing various commands including (1) the command to add the magnetic domains for lid, (2) the command to remove the magnetic domains for lid and to program, (3) the command to restart the write operation from the write of the magnetic domains having the fixed magnetization direction (initial layer program command), (4) the read command which does not reset the MDL, and the like.

Next, the operation of maintaining the content of MDL used in the last program for the block BLK of the interleave source by using two or more MDLs will be explained.

The magnetic memory 3 includes two MDLs, i.e., MDL #1 and MDL #2. MDL #1 is a latch circuit that is the same as MDL explained above, and is shared by a plurality of blocks. MDL #2 is MDL for storing the copy of the content of MDL #1 corresponding to the block to which the data is being written.

FIG. 44 illustrates an example of the copy command (also referred to as third command) issued to the magnetic memory 3. This copy command instructs the content of MDL #1 to be copied to MDL #2.

The command sequence of this copy command includes, for example, command "81h", column address, and command "41h".

FIG. 45 illustrates two MDLs shared by a plurality of blocks in the magnetic memory 3. As illustrated in FIG. 45, the magnetic memory 3 includes XDL, MDL #1, and MDL #2 as latch circuits. XDL, MDL #1, and MDL #2 are shared by a plurality of blocks. When receiving the copy command of FIG. 44 from the memory controller 2, the magnetic memory 3 executes copy command processing (also referred to as an copy operation) of copying the current content of MDL #1 to MDL #2.

When starting the interleave operation of executing processing of the block other than the block BLK in which write is being executed, the memory controller 2 can issue the copy command to the magnetic memory 3 instead of the command to add the magnetic domains for lid.

One MDL #1 is not shared by all the blocks, but one MDL #1 may be shared by several specific blocks and other MDL #1 may be shared by other several specific blocks.

A timing chart of FIG. 46 illustrates the initial layer program operation and the copy command processing.

It is assumed that the magnetic memory 3 receives the copy command from the memory controller 2 after completing the initial layer program command.

When the initial layer program operation is completed, the memory controller 2 issues the command "81h" and asserts the command latch enable signal CLE. Subsequently, the memory controller 2 issues the column address ("00h") and asserts the address latch enable signal ALE. After that, the memory controller 2 issues command "41h" and asserts the command latch enable signal CLE.

The magnetic memory 3 starts the copy command processing of copying the content of MDL #1 to MDL #2 and becomes a busy state. The row address designated by the initial layer program command is held in the row address register of the magnetic memory 3. Therefore, in a case where a certain MDL #1 is shared by several specific blocks, the magnetic memory 3 may specify the MDL #1 corresponding to the block corresponding to the source line SL designated by the row address and start the copy command processing of copying the content of the specified MDL #1 to the MDL #2.

A timing chart of FIG. 47 illustrates the middle layer program operation and the copy command processing.

It is assumed that the magnetic memory 3 receives the copy command from the memory controller 2 after completing the middle layer program command.

When the middle layer program operation is completed, the memory controller 2 issues the command "81h" and asserts the command latch enable signal CLE. Subsequently, the memory controller 2 issues the column address and asserts the address latch enable signal ALE. After that, the memory controller 2 issues the command "41h" and asserts the command latch enable signal CLE.

The magnetic memory 3 starts the copy command processing of copying the content of MDL #1 to MDL #2 and becomes a busy state. The row address designated by the initial layer program command is held in the row address register of the magnetic memory 3. Therefore, in a case where a certain MDL #1 is shared by several specific blocks, the magnetic memory 3 may specify the MDL #1 corresponding to the block corresponding to the source line SL designated by the row address and start the copy command processing of copying the content of the specified MDL #1 to the MDL #2.

Figure 48:
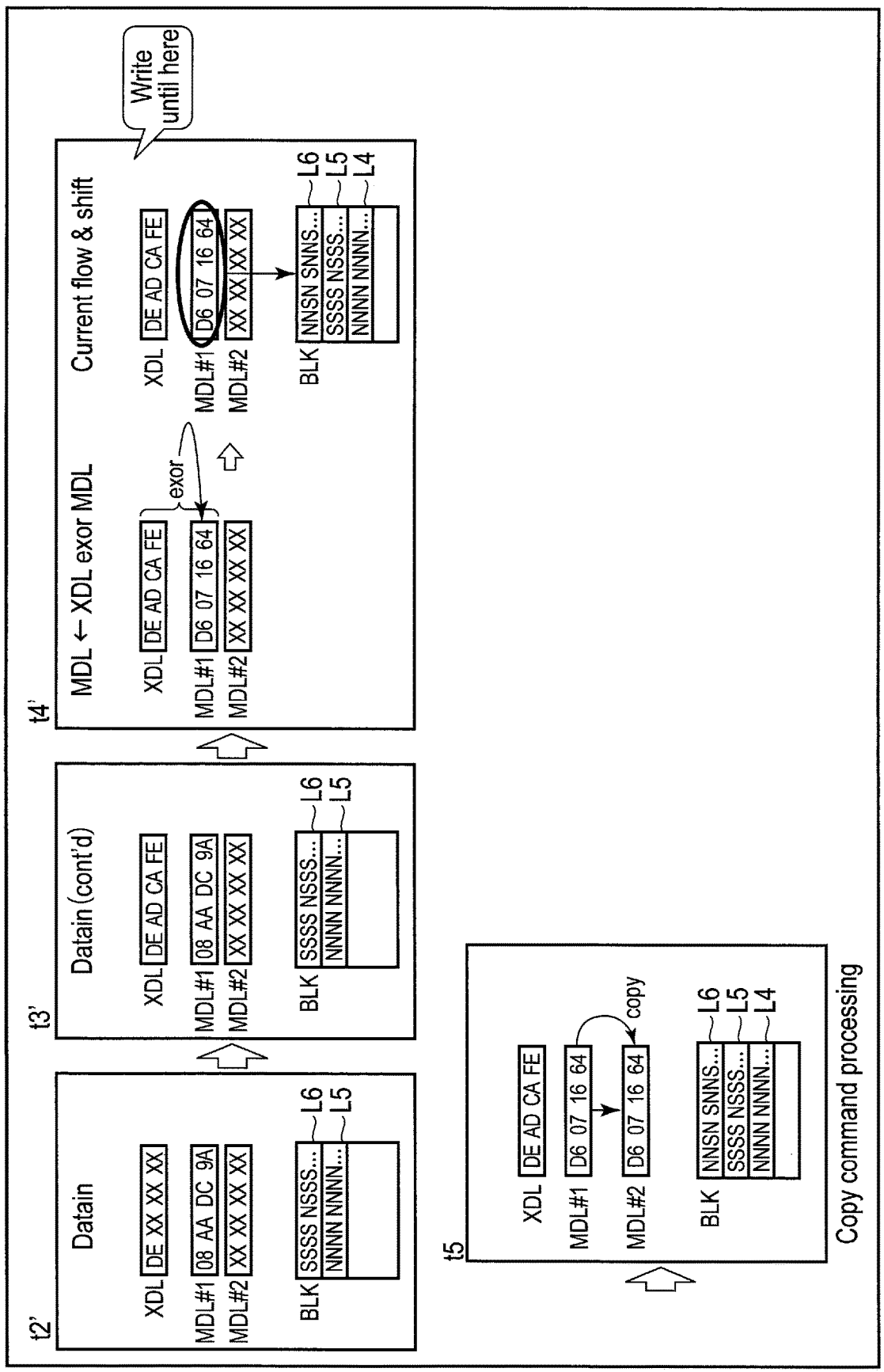
FIG. 48 is a diagram illustrating variation of data in the magnetic memory in the middle layer program operation and copy command processing.

FIG. 48 illustrates variation of data in the magnetic memory 3 in the copy command processing. In FIG. 48, each magnetic memory line MML is assumed to be composed of total six layers L1 to L6.

The variation of the data in the magnetic memory 3 at timing t2' to t4' (middle layer program operation) of the timing chart of FIG. 47, and the variation of the data in the magnetic memory 3 at timing t5 (i.e., copy command processing) of the timing chart of FIG. 47, will be explained below.

The operations of timing t2' to t4' are the same as the operations explained with reference to FIG. 34. The initial magnetic domains for one layer "NNNN NNNN . . . " are stored in layer L4 of the block BLK, the magnetic domains for one layer "SSSS NSSS . . . " corresponding to the write data for one layer are stored in layer L5, and the magnetic domains for one layer "NNSN SNNS . . . " corresponding to the write data for one layer are stored in the uppermost layer L6. In addition, mdata (D6h 07h 16h 64h) indicative of the magnetization directions of the magnetic domains for one layer "NNSN SNNS . . . " stored in the uppermost layer L6 are stored in MDL #1.

When starting the interleave operation of executing processing of the block other than the block BLK in which write is being executed, the memory controller 2 issues the copy command to the magnetic memory 3.

When receiving the copy command from the memory controller 2 (timing t5), the magnetic memory 3 copies the mdata (D6h 07h 16h 64h) stored in the MDL #1 to the MDL #2.

When restarting the write operation to the block BLK after executing the interleave operation, the memory controller 2 issues the program command (for example, middle layer program command or the last layer program command) to the magnetic memory 3.

In MDL #2, mdata indicative of the magnetization directions of the magnetic domains for one layer "NNSN SNNS . . . " stored in the uppermost layer L6 are stored. Therefore, the magnetic memory 3 can execute normally restarting the write operation to the block BLK by using the MDL #2. In this case, the magnetic memory 3 first copies the content of MDL #2 to MDL #1. When the write data associated with the program command received from the memory controller 2 is transferred to the XDL, the magnetic memory 3 executes a logical operation [XDL exor MDL #1] to obtain exclusive OR of the XDL and the MDL #1, and stores the result of the logical operation [XDL exor MDL #1] in the MDL #1 to update the content of the MDL #1. The magnetic domains for one layer having the magnetization directions which are the same as or opposite to the magnetization directions of the magnetic domains for one layer last written to the block BLK can be thereby correctly written to the block BLK in accordance with "0" or "1" of the write data.

When one magnetic memory line MML is focused, the magnetic memory 3 first determines the magnetization direction of the magnetic domain stored in the uppermost layer Ln of this magnetic memory line MML, based on the content of the MDL #2. Then, based on the value of the write data associated with the received program command and the determined magnetization direction of the magnetic domain of the uppermost layer Ln, the magnetic memory 3 puts the magnetic domain having the magnetization direction which is the same as or opposite to the determined magnetization direction of the magnetic domain of the uppermost layer Ln, such that the magnetic domains of the respective layers of the magnetic memory line MML are moved downwardly.

The content of the MDL (MDL #1) is copied to the other MDL (MDL #2) in the magnetic memory 3, but the content of the MDL may be copied in the buffer of the memory controller 2. In this case, the memory controller 2 may issue the command (MDL read command) to read the content of the MDL to the magnetic memory 3, and the magnetic memory 3 may transfer the content of the MDL to the memory controller 2 in response to the MDL read command. The memory controller 2 may store the contents of plural MDLs corresponding to plural blocks, in the buffer. In this case, the memory controller 2 may manage identifiers of the plural blocks corresponding to contents of the plural MDLs stored in the buffer.

According to the embodiment, as explained above, the magnetic domain for lid can be put into the uppermost layer of the magnetic memory line MML at completion of the program operation for an arbitrary layer of the magnetic memory line MML, by transmitting the command to add the magnetic domain for lid from the memory controller 2 to the magnetic memory 3 as needed. In addition, the magnetization direction of the magnetic domain which has been in the uppermost layer of the magnetic memory line MML before adding of the magnetic domain for lid (i.e., the last written magnetic domain) can be correctly restored, by transmitting the command to remove the magnetic domain for lid and to program from the memory controller 2 to the magnetic memory 3 as needed.

Therefore, in the configuration of representing the first value (for example, "1") or the second value (for example, "0") of the data in accordance with the magnetization directions of two adjacent layers of the magnetic memory line MML which are the same as each other or opposite to each other, the flexible write operation of starting the processing (write operation and read operation) for the other block during the write to the block BLK including a certain magnetic memory line MML and then restarting the write operation for the block BLK can also be implemented.

In the embodiment, each block includes the magnetic memory lines MMLs but, in principle, the number of the magnetic memory lines MMLs included in each block may be one or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a magnetic memory including a first magnetic memory line including a plurality of layers, each of the layers being capable of storing a magnetic domain; and
a controller which controls the magnetic memory, wherein
the magnetic memory is configured to:
put a first magnetic domain having a magnetization direction which is the same as or opposite to a magnetization direction of a magnetic domain stored in a first layer located on one end side of the first magnetic memory line, into the first layer, on the basis of a value of first data received from the controller and the magnetization direction of the magnetic domain stored in the first layer, such that a magnetic domain stored in each layer of the first magnetic memory line is moved by one layer in a first direction from the one end side to another end side of the first magnetic memory line;
when receiving a first command from the controller, put a first additional magnetic domain having a magnetization direction determined based on the magnetization direction of the first magnetic domain and a second additional magnetic domain having a magnetization direction opposite to the magnetization direction of the first additional magnetic domain, into the first magnetic memory line, such that the magnetic domain stored in each layer of the first magnetic memory line is moved by two layers in the first direction; and
when receiving a second command from the controller, read the second additional magnetic domain and the first additional magnetic domain by moving the magnetic domain stored in each layer of the first magnetic memory line by two layers in a second direction from the other end side to the one end side of the first magnetic memory line, and determine the magnetization direction of the first magnetic domain, on the basis of the read second additional magnetic domain and the read first magnetic domain.

2. The memory system of claim 1, wherein
the magnetic memory is configured to put a second magnetic domain having a magnetization direction which is the same as or opposite to the determined magnetization direction of the first magnetic domain, into the first layer, on the basis of a value of second data received from the controller and the determined magnetization direction of the first magnetic domain, such that the magnetic domain stored in each layer of the first magnetic memory line is moved by one layer in the first direction.

3. The memory system of claim 1, wherein
in a case where the first data is a first value, the first magnetic domain has a magnetization direction opposite to the magnetization direction of the magnetic domain stored in the first layer, and
in a case where the first data is a second value, the first magnetic domain has the same magnetization direction as the magnetization direction of the magnetic domain stored in the first layer.

4. The memory system of claim 1, wherein
the magnetic memory includes a plurality of blocks, each of the blocks including one or more magnetic memory lines, and
the controller is configured to issue the first command to the magnetic memory when starting processing for a block other than a first block including the first magnetic memory line during write to the first block, and issue the second command to the magnetic memory when restarting a write operation to the first block.

5. The memory system of claim 1, wherein
the magnetic memory is configured to determine the magnetization direction of the first magnetic domain, on the basis of a magnitude relationship between a first sampling value corresponding to a resistant state of a magnetoresistive element resulting from the magnetization direction of the read second additional magnetic domain and a second sampling value corresponding to a resistant state of the magnetoresistive element resulting from the magnetization direction of the read first additional magnetic domain.

6. The memory system of claim 1, wherein
the magnetic memory includes a field line which generates an induced magnetic field, a write control circuit which controls a direction of a current flowing to the field line and causes the field line to generate an induced magnetic field forming a magnetic domain to be put into the first magnetic memory line, and a latch circuit which stores magnetic data indicative of the direction of the current flowing to the field line, and
the magnetic memory is configured to:
specify a direction of a current used to cause the field line to generate a induced magnetic field for forming the first magnetic domain, on the basis of a magnitude relationship between a first sampling value corresponding to a resistant state of a magnetoresistive element resulting from the magnetization direction of the read second additional magnetic domain and a second sampling value corresponding to a resistant state of the magnetoresistive element resulting from the magnetization direction of the read first additional magnetic domain; and
restore a content of the latch circuit such that the magnetic data is indicative of the specified direction of the current.

7. The memory system of claim 1, wherein
the magnetic memory is configured to:
when receiving, from the controller, a first program command to write data for first one layer from the controller, put an initial magnetic domain having a predetermined fixed magnetization direction into the first layer of the first magnetic memory line; and
put a magnetic domain having a magnetization direction which is the same as or opposite to the magnetization direction of the initial magnetic domain, as the first magnetic domain, into the first layer, on the basis of a value of data associated with the first program command and the magnetization direction of the initial magnetic domain, such that the magnetic domain stored in each layer of the first magnetic memory line is moved by one layer in the first direction.

8. The memory system of claim 1, wherein
the magnetic memory is configured to:
when receiving, from the controller, a second program command to write data for one layer to any one of middle layers of the first magnetic memory line, put a magnetic domain having a magnetization direction which is the same as or opposite to the magnetization direction of a magnetic domain last put into the first layer, as the first magnetic domain, into the first layer, on the basis of a value of data associated with the second program command and the magnetization direction of the magnetic domain last put into the first layer of the first magnetic memory line, such that the magnetic domains stored in each layer of the first magnetic memory line is moved by one layer in the first direction.

9. A memory system comprising:
a magnetic memory including a first magnetic memory line including a plurality of layers, each of the layers being capable of storing a magnetic domain; and
a controller which controls the magnetic memory, wherein
the magnetic memory is configured to:
put a first magnetic domain having a magnetization direction which is the same as or opposite to a magnetization direction of a magnetic domain stored a first layer located on one end side of the first magnetic memory line, into the first layer, on the basis of a value of first data received from the controller and the magnetization direction of the magnetic domain stored in the first layer, such that a magnetic domains stored in each layer of the first magnetic memory line is moved by one layer in a first direction from the one end side to another end side of the first magnetic memory line;
when receiving a first command from the controller, put an additional magnetic domain having a magnetization direction which is opposite to the magnetization direction of the first magnetic domain, into the first layer, such that the magnetic domain stored in each layer of the first magnetic memory line is moved by one layer in the first direction;
when receiving a second command from the controller, read the additional magnetic domain and the first magnetic domain by moving the magnetic domain stored in each layer of the first magnetic memory line by two layers in a second direction from the other end side to the one end side of the first magnetic memory line;
determine the magnetization direction of the first magnetic domain, on the basis of the read additional magnetic domain and the read first magnetic domain; and
write back the first magnetic domain having the determined magnetization direction to the first layer such that the magnetic domains stored in each layer of the first magnetic memory line is moved by one layer in the first direction.

10. The memory system of claim 9, wherein
the magnetic memory is configured to put a second magnetic domain having a magnetization direction which is the same as or opposite to the determined magnetization direction of the first magnetic domain, into the first layer, on the basis of a value of second data received from the controller and the determined magnetization direction of the first magnetic domain, such that the magnetic domains stored in each layer of the first magnetic memory line is moved by one layer in the first direction.

11. The memory system of claim 9, wherein
the magnetic memory includes a plurality of blocks, each of the blocks including one or more magnetic memory lines, and
the controller is configured to issue the first command to the magnetic memory when starting processing for a block other than a first block including the first magnetic memory line during write to the first block, and issue the second command to the magnetic memory when restarting a write operation to the first block.

12. A memory system comprising:
a magnetic memory including a first magnetic memory line including a plurality of layers, each of the layers being capable of storing a magnetic domain; and
a controller which controls the magnetic memory, wherein the magnetic memory is configured to:

put a first magnetic domain having a magnetization direction which is the same as or opposite to a magnetization direction of a magnetic domain stored in a first layer located on one end side of the first magnetic memory line, into the first layer, on the basis of a value of first data received from the controller and the magnetization direction of the magnetic domain stored in the first layer, such that a magnetic domain stored in each layer of the first magnetic memory line is moved by one layer in a first direction from the one end side to another end side of the first magnetic memory line;

when receiving a first command from the controller, put an initial magnetic domain having a predetermined fixed magnetization direction into the first layer of the first magnetic memory line, such that the magnetic domain stored in each layer of the first magnetic memory line is moved by one layer in the first direction; and put a second magnetic domain having a magnetization direction which is the same as or opposite to the fixed magnetization direction, into the first layer, on the basis of a value of second data received from the controller and a magnetization direction which is same as the fixed magnetization direction, such that the magnetic domain stored in each layer of the first magnetic memory line is moved by one layer in the first direction.

13. The memory system of claim 12, wherein the magnetic memory includes a plurality of blocks, each of the blocks including one or more magnetic memory lines, and the controller is configured to issue the first command to the magnetic memory when starting processing for a block other than a first block including the first magnetic memory line during write to the first block, and to issue a second program command to write data for one layer to any one of middle layers of the first magnetic memory line when restarting a write operation to the first block.

14. The memory system of claim 12, wherein the magnetic memory includes a plurality of blocks, each of the blocks including one or more magnetic memory lines, and the magnetic memory is configured to:

when receiving, from the controller, a first program command to write data for first one layer, put an initial magnetic domain having a predetermined fixed magnetization direction into the first layer of the first magnetic memory line, and put a magnetic domain having a magnetization direction which is the same as or opposite to the magnetization direction of the initial magnetic domain, as the first magnetic domain, into the first layer, on the basis of a value of data associated with the first program command and the magnetization direction of the initial magnetic domain, such that the magnetic domain stored in each layer of the first magnetic memory line is moved by one layer in the first direction; and when receiving, from the controller, a second program command to write data for one layer to any one of middle layers of the first magnetic memory line, put a magnetic domain having a magnetization direction which is the same as or opposite to a magnetization direction of a magnetic domain last put into the first layer, as the first magnetic domain, into the first layer, on the basis of a value of data associated with the second program command and the magnetization direction of the magnetic domain last put into the first layer, such that the magnetic domain stored in each layer of the first magnetic memory line is moved by one layer in the first direction, and the controller is configured to issue, to the magnetic memory, the first program command as the first command, when restarting a write operation to a first block including the first magnetic memory line after executing processing to a block other than the first block during write to the first block.

15. A memory system comprising:

a magnetic memory including a first magnetic memory line including a plurality layers, each of layers being capable of storing a magnetic domain; and a controller which controls the magnetic memory, wherein the magnetic memory is configured to:

put a first magnetic domain having a magnetization direction which is the same as or opposite to a magnetization direction of a magnetic domain stored in a first layer located on one end side of the first magnetic memory line, into the first layer, on the basis of a value of first data received from the controller and the magnetization direction of the magnetic domain of the first layer, such that a magnetic domain stored in each layer of the first magnetic memory line is moved by one layer in a first direction from the one end side to another end side of the first magnetic memory line;

when receiving a third command from the controller, copy a content of a first latch circuit storing magnetic data indicative of the magnetization direction of the first magnetic domain to a second latch circuit; and when receiving a program command from the controller, determine the magnetization direction of the first magnetic domain put into the first layer, on the basis of a content of the second latch circuit, and put a second magnetic domain having a magnetization direction which is the same as or opposite to the determined magnetization direction of the first magnetic domain, into the first layer, on the basis of a value of second data received from the controller and the determined magnetization direction of the first magnetic domain, such that the magnetic domain stored in each layer of the first magnetic memory line is moved by one layer in the first direction.

16. The memory system of claim 15, wherein the magnetic memory includes a plurality of blocks, each of the blocks including one or more magnetic memory lines, and the controller is configured to issue the third command to the magnetic memory when starting processing for a block other than a first block including the first magnetic memory line during write to the first block, and issue the program command to the magnetic memory when restarting a write operation to the first block.

* * * * *